United States Patent [19]
Boutaud et al.

[11] Patent Number: 5,907,714
[45] Date of Patent: May 25, 1999

[54] METHOD FOR PIPELINED DATA PROCESSING WITH CONDITIONING INSTRUCTIONS FOR CONTROLLING EXECUTION OF INSTRUCTIONS WITHOUT PIPELINE FLUSHING

[75] Inventors: Frederic Boutaud, Roquefort les Pius, France; Peter N. Ehlig, Houston, Tex.

[73] Assignee: Texas Instruments Incorporated, Dallas, Tex.

[21] Appl. No.: 08/293,259

[22] Filed: Aug. 19, 1994

Related U.S. Application Data

[63] Continuation of application No. 07/967,942, Oct. 28, 1992, abandoned, and a continuation of application No. 07/347,967, May 4, 1989, abandoned.

[51] Int. Cl.⁶ .................................................. G06F 15/00
[52] U.S. Cl. ......................... 395/800; 395/800; 395/375; 395/775
[58] Field of Search ................................ 395/800, 375, 395/775

[56] References Cited

U.S. PATENT DOCUMENTS

| | | | |
|---|---|---|---|
| 3,757,306 | 9/1973 | Boone | 340/172.5 |
| 4,074,351 | 2/1978 | Boone et al. | 364/200 |
| 4,179,746 | 12/1979 | Tubbs | 364/900 |
| 4,290,106 | 9/1981 | Catiller et al. | 395/275 |
| 4,291,372 | 9/1981 | Forbes et al. | 395/275 |
| 4,422,143 | 12/1983 | Guttag | 364/200 |
| 4,450,525 | 5/1984 | Demuth et al. | 395/375 |
| 4,507,732 | 3/1985 | Catiller et al. | 395/275 |
| 4,577,282 | 3/1986 | Caudel et al. | 364/200 |
| 4,713,748 | 12/1987 | Magar et al. | 364/200 |
| 4,713,749 | 12/1987 | Magar et al. | 395/375 |
| 4,715,013 | 12/1987 | MacGregor et al. | 395/275 |
| 4,833,599 | 5/1989 | Colwell et al. | 395/650 |
| 4,858,105 | 8/1989 | Kuriyama et al. | 395/375 |
| 4,870,567 | 9/1989 | Kitamura et al. | 395/375 |
| 4,933,897 | 6/1990 | Shankar et al. | 395/550 |
| 4,942,525 | 7/1990 | Shintani et al. | 395/375 |
| 4,972,342 | 11/1990 | Davis et al. | 395/375 |
| 4,991,080 | 2/1991 | Emma et al. | 395/375 |
| 5,081,574 | 1/1992 | Larsen et al. | 395/375 |
| 5,125,092 | 6/1992 | Prener | 395/725 |
| 5,440,704 | 8/1995 | Itomitsu et al. | 395/375 |

OTHER PUBLICATIONS

First–Generation TMS320 User's Guide, Texas Instruments, pp. 3–9, A–1–20, 4–9,10, 4–20–29, 4–67–68, Apr. 1988.
Second–Generation TMS320 User's Guide, Texas Instruments, pp. to 3–10, 6–45–48, A–1–16, 3–28–40, 4–13–16, 4–21, 4–35–49 4–56–61, Dec. 1987.
"DSP56000 Digital Signal Processor User's Manual", Motorola, 1986 3–2, 4–2, 4–5–15, A–73–87, 143–145, 159–161.
"DSP96001", Motorola, 1988, pp. 1–22.

*Primary Examiner*—Mehmet B. Geckil
*Attorney, Agent, or Firm*—Gerald E. Laws; C. Alan McClure; Richard L. Donaldson

[57] ABSTRACT

A data processing device includes a circuit having status conditions wherein a particular set of the status conditions can occur in operation of the circuit. An instruction register operates to hold a branch instruction conditional on a particular set of the status conditions. A decoder is connected to the instruction register and the circuit. A program counter is coupled to the decoder wherein the decoder is operable to enter a branch address into the program counter in response to the branch instruction when the particular set of the status conditions of the circuit are present.

10 Claims, 32 Drawing Sheets

JOIN FIG.1b

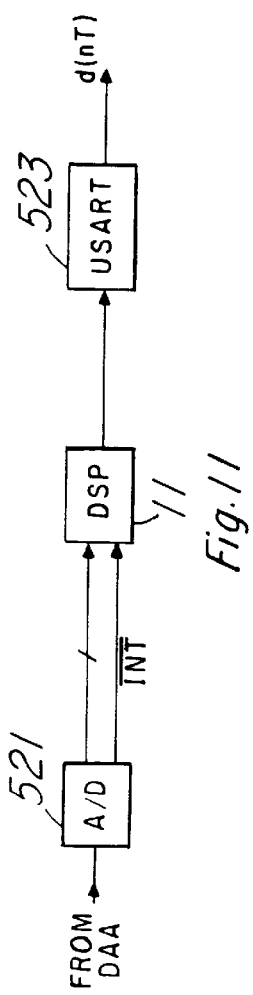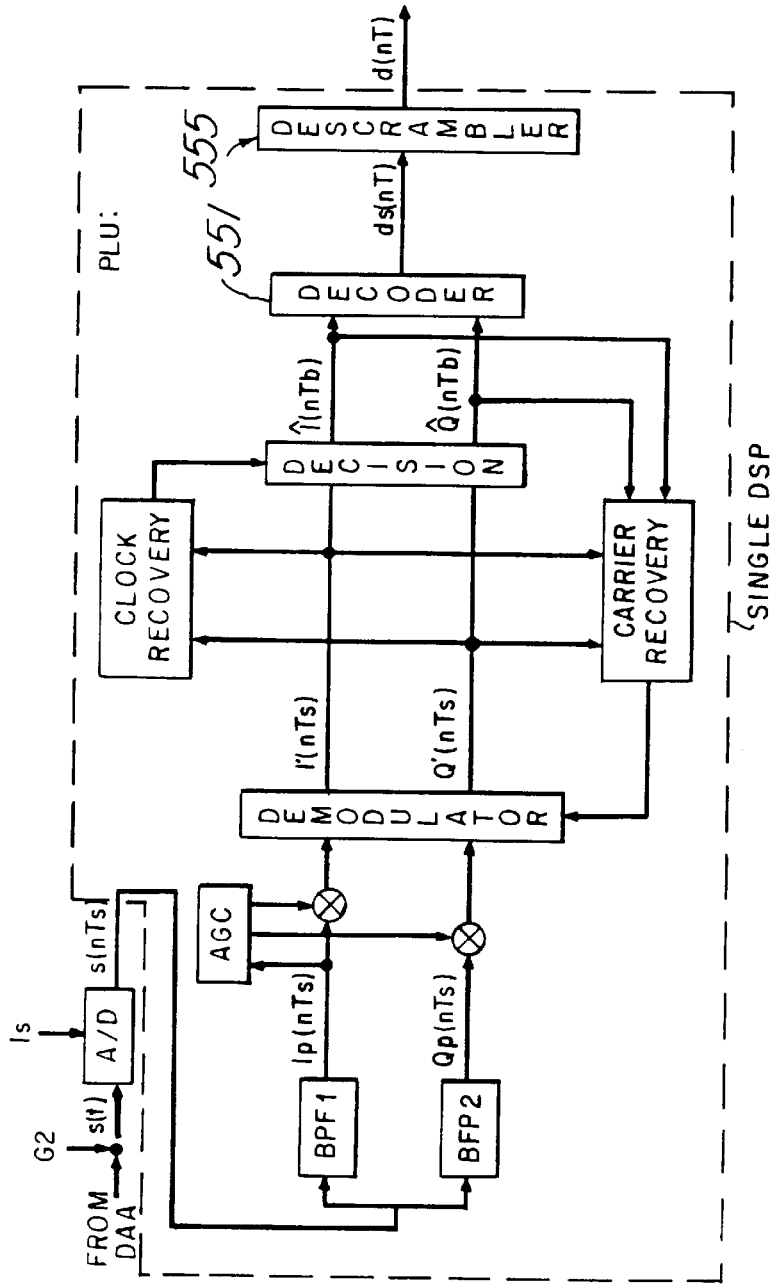

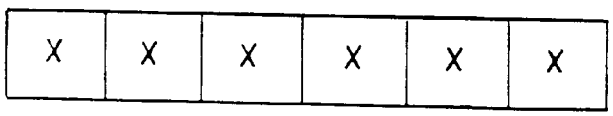
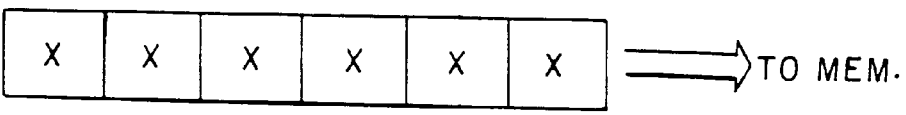
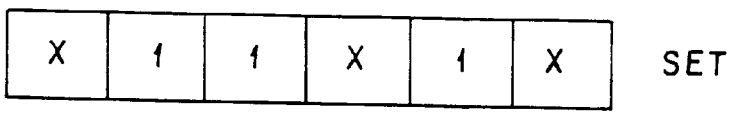
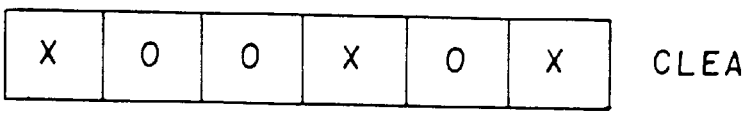
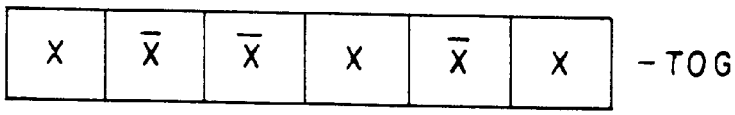
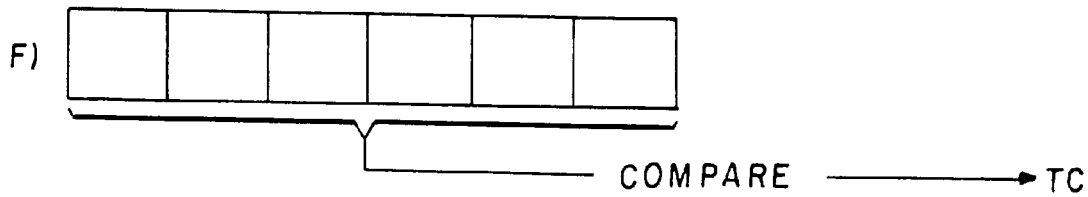
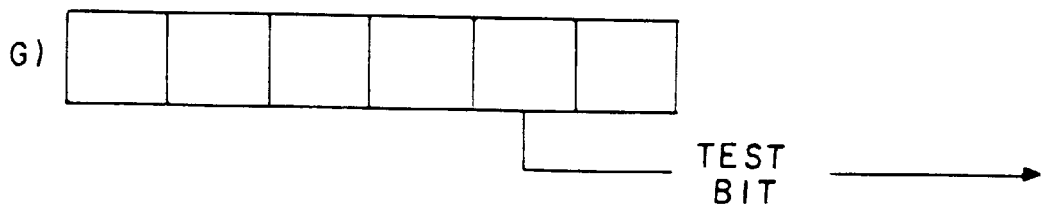
Fig. 19

METHOD FOR PIPELINED DATA PROCESSING WITH CONDITIONING INSTRUCTIONS FOR CONTROLLING EXECUTION OF INSTRUCTIONS WITHOUT PIPELINE FLUSHING

This application is a Continuation of application Ser. No. 07/967,942, filed Oct. 28, 1992, now abandoned, and a Continuation of application Ser. No. 07/347,967, filed May 4, 1989, now abandoned.

(C) Copyright 1989 Texas Instruments Incorporated. A portion of the disclosure of this patent document contains material which is subject to copyright protection. The copyright owner has no objection to the facsimile reproduction by anyone of the patent disclosure, as it appears in the Patent and Trademark Office patent file or records, but otherwise reserves all copyright rights whatsoever.

CROSS REFERENCE TO RELATED APPLICATIONS

This application is related to coassigned pending patent application Ser. No. 08/233,477 filed Apr. 26, 1994 (TI-14079A), which is a Continuation 1.62 of application Ser. No. 07/347,605 (TI-14079), now abandoned; application U.S. Pat. No. 5,072,418 (TI-14080); U.S. Pat. No. 5,142,677 (TI-14081); U.S. Pat. No. 5,155,812 (TI-14082); pending patent application Ser. No. 08/001,915 filed Jan. 8, 1993 (TI-14083A), which is a Continuation 1.62 of Ser. No. 07/347,968 (TI-14083), now abandoned; and pending patent application Ser. No. 07/918,902 filed Jul. 22, 1992 (TI-14147A), which is a Continuation 1.62 of Ser. No. 07/347,969, now abandoned (TI-14147), all filed. contemporaneously herewith and incorporated herein by reference.

This invention relates to data processing devices, electronic processing and control systems and methods of their manufacture and operation.

BACKGROUND OF THE INVENTION

A microprocessor device is a central processing unit or CPU for a digital processor which is usually contained in a single semiconductor integrated circuit or "chip" fabricated by MOS/LSI technology, as shown in U.S. Pat. No. 3,757,306, issued to Gary W. Boone and assigned to Texas Instruments Incorporated. The Boone patent shows a single-chip 8-bit CPU including a parallel ALU, registers for data and addresses, an instruction register and a control decoder, all interconnected using the von Neumann architecture and employing a bidirectional parallel bus for data, address and instructions. U.S. Pat. No. 4,074,351, issued to Gary W. Boone and Michael J. Cochran, assigned to Texas Instruments Incorporated, shows a single-chip "microcomputer" type device which contains a 4-bit parallel ALU and its control circuitry, with on-chip ROM for program storage and on-chip RAM for data storage, constructed in the Harvard architecture. The term microprocessor usually refers to a device employing external memory for program and data storage, while the term microcomputer refers to a device with on-chip ROM and RAM for program and data storage. In describing the instant invention, the term "microcomputer" will be used to include both types of devices, and the term "microprocessor" will be primarily used to refer to microcomputers without on-chip ROM. Since the terms are often used interchangeably in the art, however, it should be understood that the use of one of the other of these terms in this description should not be considered as restrictive as to the features of this invention.

Modern microcomputers can be grouped into two general classes, namely general-purpose microprocessors and special-purpose microcomputers/microprocessors. General purpose microprocessors, such as the M68020 manufactured by Motorola, Inc. are designed to be programmable by the user to perform any of a wide range of tasks, and are therefore often used as the central processing unit in equipment such as personal computers. Such general-purpose microprocessors, while having good performance for a wide range of arithmetic and logical functions, are of course not specifically designed for or adapted to any particular one of such functions. In contrast, special-purpose microcomputers are designed to provide performance improvement for specific predetermined arithmetic and logical functions for which the user intends to use the microcomputer. By knowing the primary function of the microcomputer, the designer can structure the microcomputer in such a manner that the performance of the specific function by the special-purpose microcomputer greatly exceeds the performance of the same function by the general-purpose microprocessor regardless of the program created by the user.

One such function which can be performed by a special-purpose microcomputer at a greatly improved rate is digital signal processing, specifically the computations required for the implementation of digital filters and for performing Fast Fourier Transforms. Because such computations consist to a large degree of repetitive operations such as integer multiply, multiple-bit shift, and multiply-and-add, a special-purpose microcomputer can be constructed specifically adapted to these repetitive functions. Such a special-purpose microcomputer is described in U.S. Pat. No. 4,577,282, assigned to Texas Instruments Incorporated and incorporated herein by reference. The specific design of a microcomputer for these computations has resulted in sufficient performance improvement over general purpose microprocessors to allow the use of such special-purpose microcomputers in real-time applications, such as speech and image processing.

Digital signal processing applications, because of their computation intensive nature, also are rather intensive in memory access operations. Accordingly, the overall performance of the microcomputer in performing a digital signal processing function is not only determined by the number of specific computations performed per unit time, but also by the speed at which the microcomputer can retrieve data from, and store data to, system memory. Prior special-purpose microcomputers, such as the one described in said U.S. Pat. No. 4,577,282, have utilized modified versions of a Harvard architecture, so that the access to data memory may be made independent from, and simultaneous with, the access of program memory. Such architecture has, of course provided for additional performance improvement.

The increasing demands of technology and the marketplace make desirable even further structural and process improvements in processing devices, systems and methods of operation and manufacture.

Among the objects of the present invention are to provide improved data processing devices, systems and methods that avoid time-consuming processor operation disruptions due to unnecessary branching; to provide improved data processing devices, systems and methods that enhance operational flexibility, computational resolution, and increase system and processor throughput; to provide improved data processing devices, systems and methods for simplifying hardware at device and system levels; and to provide improved data processing devices, systems and methods for real-time operation.

SUMMARY OF THE INVENTION

In general, one form of the invention is a data processing device including a circuit having status conditions wherein a particular set of the status conditions can occur in operation of the circuit. An instruction register holds a branch instruction conditional on a particular set of the status conditions. A decoder is connected to the instruction register and the circuit. Further, a program counter is coupled to the decoder wherein the decoder is operable to enter a branch address into the program counter in response to the branch instruction when the particular set of the status conditions of the circuit are present.

Generally, another form of the invention is a data processing system including an analog-to-digital converter and an electronic processor connected to the analog-to-digital converter and having an electronic computation unit for executing operations and an accumulator having status conditions including A) carry, B) overflow and C) contents relative to a predetermined number wherein a particular one or more of the status conditions can occur in operation. An instruction register is operative to hold a conditional instruction directing the electronic processor to execute a further operation provided the particular status condition is present. A control circuit is connected to the instruction register and the accumulator to cause the processor to execute the further operation when the conditional instruction and the particular status condition are present and otherwise to cause the electronic processor to omit the further operation when the conditional instruction is present and the particular status condition is absent.

Other device, system and method forms of the invention are also disclosed and claimed herein. Other objects of the invention will be apparent from the disclosure herein.

BRIEF DESCRIPTION OF THE DRAWINGS

The novel features believed characteristic of the invention are set forth in the appended claims. The preferred embodiments of the invention as well as other features and advantages thereof will be best understood by reference to the detailed description which follows, read in conjunction with the accompanying drawings, wherein:

FIG. 11 is an electrical block diagram equally representative of hardware blocks or process blocks for the improved modem transmitter of FIG. 10;

FIG. 12 is an electrical block diagram equally representative of hardware blocks or process blocks for an improved modem receiver;

FIG. 19 is a series of seven representations of an electronic register holding bits of information and illustrating bit manipulation operations of a parallel logic unit improvement of FIG. 1B;

Corresponding numerals and other symbols refer to corresponding parts in the various figures of drawing except where the context indicates otherwise.

DETAILED DESCRIPTION OF PREFERRED EMBODIMENTS

An architectural overview first describes a preferred embodiment digital signal processing device 11.

Figure 1A:
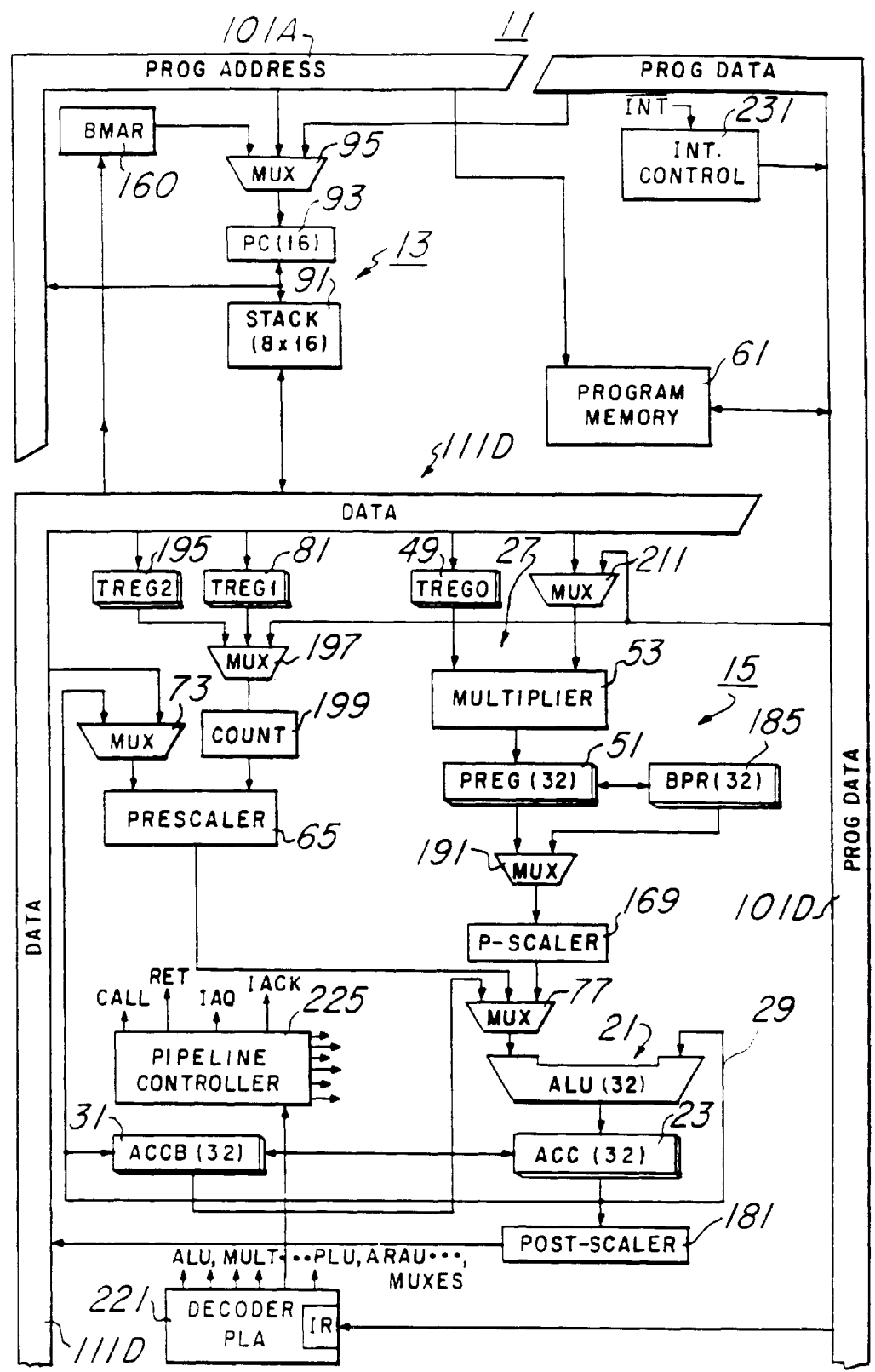
FIGS. 1A and 1B are two halves of an electrical diagram in block form of an improved microcomputer device including a CPU or central processor unit formed on a single semiconductor chip.
Figure 1B:
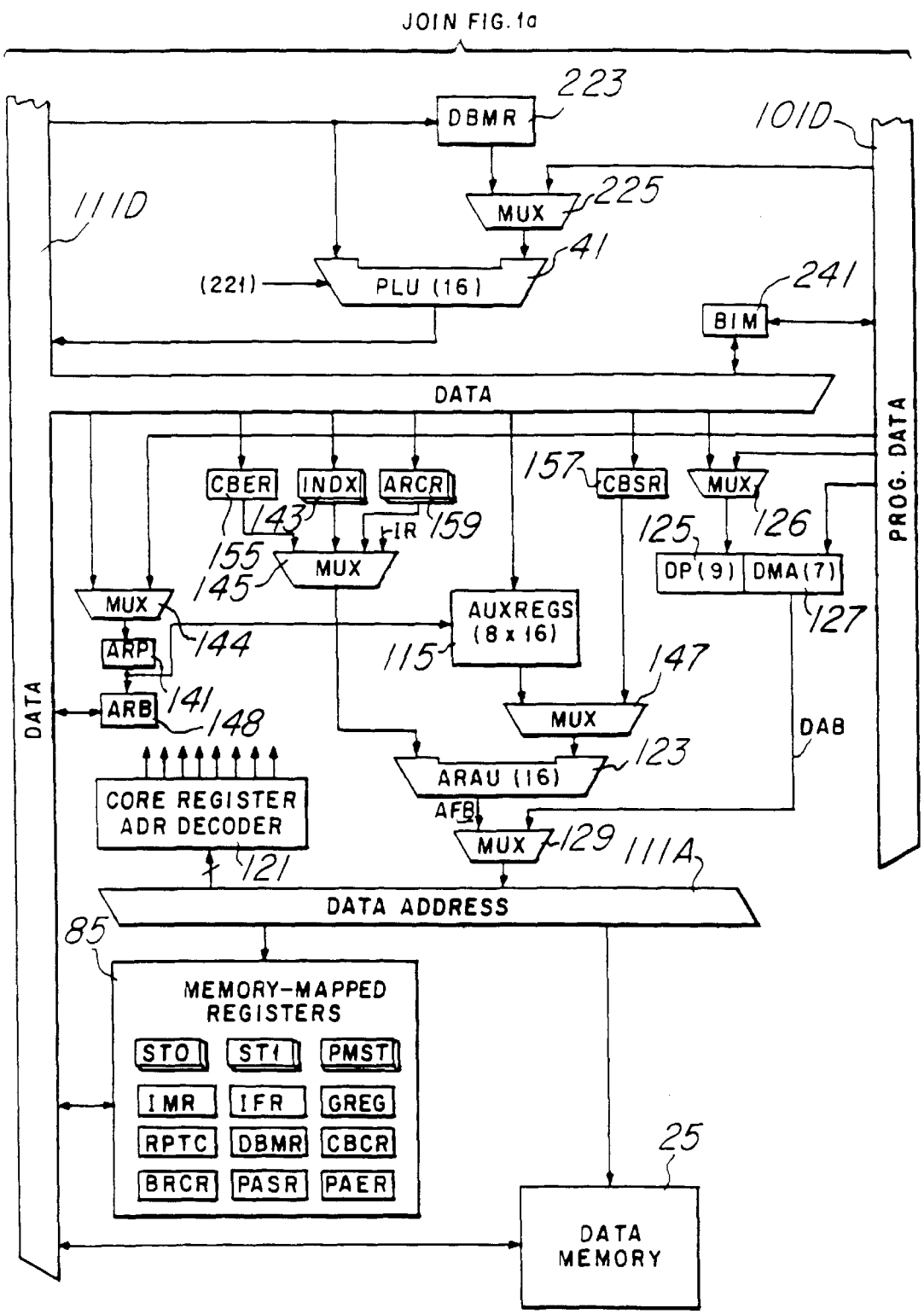

The preferred embodiment digital signal processing device 11 of FIGS. 1A and 1B implements a Harvard-type architecture that maximizes processing power by maintaining two separate memory bus structures, program and data, for full-speed execution. Instructions are included to provide data transfers between the two spaces.

The device 11 has a program addressing circuit 13 and an electronic computation circuit 15 comprising a processor. Computation circuit 15 performs two's-complement arithmetic using a 32 bit ALU 21 and accumulator 23. The ALU 21 is a general-purpose arithmetic logic unit that operates using 16-bit words taken from a data memory 25 of FIG. 1B or derived from immediate instructions or using the 32-bit result of a multiplier 27. In addition to executing arithmetic instructions, the ALU 21 can perform Boolean operations. The accumulator 23 stores the output from the ALU 21 and provides a second input to the ALU 21 via a path 29. The accumulator 23 is illustratively 32 bits in length and is divided into a high-order word (bits 31 through 16) and a low-order word (bits 15 through 0). Instructions are provided for storing the high and low order accumulator words in data memory 25. For fast, temporary storage of the accumulator 23 there is a 32-bit accumulator buffer ACCB 31.

In addition to the main ALU 21 there is a Peripheral Logic Unit (PLU) 41 in FIG. 1B that provides logic operations on memory locations without affecting the contents of the accumulator 23. The PLU 41 provides extensive bit manipulation ability for high-speed control purposes and simplifies bit setting, clearing, and testing associated with control and status register operations.

The multiplier 27 of FIG. 1A performs a 16×16 bit two's complement multiplication with a 32-bit result in a single instruction cycle. The multiplier consists of three elements: a temporary TREG0 register 49, product register PREG 51 and multiplier array 53. The 16-bit TREG0 register 49 temporarily stores the multiplicand; the PREG register 51 stores the 32-bit product. Multiplier values either come from data memory 25, from a program memory 61 when using the MAC/MACD instructions, or are derived immediately from the MPYK (multiply immediate) instruction word.

Program memory 61 is connected at addressing inputs to a program-address bus 101A. Memory 61 is connected at its read/write input/output to a program data bus 101D. The fast on-chip multiplier 27 allows the device 11 to efficiently perform fundamental DSP operations such as convolution, correlation, and filtering.

A processor scaling shifter 65 has a 16-bit input connected to a data bus 111D via a multiplexer (MUX) 73, and a 32-bit output connected to the ALU 21 via a multiplexer 77. The scaling shifter 65 produces a left-shift of 0 to 16 bits on the input data, as programmed by instruction or defined in a shift count register (TREG1) 81. The LSBs (least significant bits) of the output are filled with zeros, and the MSBs (most significant bits) may be either filled with zeros or sign-extended, depending upon the state of the sign-extension mode bit SXM of the status register ST1 in a set of registers 85 of FIG. 1B. Additional shift capabilities enable the processor 11 to perform numerical scaling, bit extraction, extended arithmetic, and overflow prevention.

Up to eight levels of a hardware stack 91 are provided for saving the contents of a program counter 93 during interrupts and subroutine calls. Program counter 93 is selectively loaded upon a context change via a MUX 95 from program address bus 101A or program data bus 101D. The PC 93 is written to address bus 101A or pushed onto stack 91. On interrupts, certain strategic registers (accumulator 23, product register 51, TREG1 49, TREG1, TREG2, and in register 113: ST0, ST1, PMST, ARCR, INDX and CMPR) are pushed onto a one deep stack and popped upon interrupt return; thus providing a zero-overhead, interrupt context switch. The interrupts operative to save the contents of these registers are maskable.

The functional block diagram shown in FIGS. 1A and 1B outlines the principal blocks and data paths within the processor. Further details of the functional blocks are provided hereinbelow. Refer to Table A-1, the internal hardware summary, for definitions of the symbols used in FIGS. 1A and 1B.

The processor architecture is built around two major buses (couples): the program bus 101A and 101D and the data bus 111A and 111D. The program bus carries the instruction code and immediate operands from program memory on program data bus 101D. Addresses to program memory 61 are supplied on program address bus 101A. The data bus includes data address bus 111A and data bus 111D. The latter bus 111D interconnects various elements, such as the Central Arithmetic Logic Unit (CALU) 15 and an auxiliary register file 115 and registers 85, to the data memory 25. Together, the program and data buses 101 and 111 can carry data from on-chip data memory 25 and internal or external program memory 61 to the multiplier 27 in a single cycle for multiply/accumulate operations. Data memory 25 and registers 85 are addressed via data address bus 111A. A core register address decoder 121 is connected to data address bus 111A for addressing registers 85 and all other addressable CPU core registers.

The processor 13, 15 has a high degree of parallelism; e.g., while the data is being operated upon by the CALU 15, arithmetic operations are advantageously implemented in an Auxiliary Register Arithmetic Unit (ARAU) 123. Such parallelism results in a powerful set of arithmetic logic, and bit manipulation operations that may all be performed in a single machine cycle.

The processor internal hardware contains hardware for single-cycle 16×16-bit multiplication, data shifting and address manipulation.

Table A-1 presents a summary of the internal hardware. This summary table, which includes the internal processing elements, registers, and buses, is alphabetized within each functional grouping.

TABLE A-1

Internal Hardware

| UNIT | SYMBOL | FUNCTION |
|---|---|---|
| Accumulator | ACC(32) ACCH(16) ACCL(16) | A 32-bit accumulator accessible in two halves: ACCH (accumulator high) and ACCL (accumulator low). Used to store the output of the ALU. |
| Accumulator Buffer | ACCB(32) | A register used to temporarily store the 32-bit contents of the accumulator. This register has a direct path back to the ALU and therefore can be arithmetically or logically operated with the ACC. |
| Arithmetic Logic Unit | ALU | A 32-bit two's complement arithmetic logic unit having two 32-bit input ports and one 32-bit output port feeding the accumulator. |
| Auxiliary Arithmetic Unit | ARAU | A 16-bit unsigned arithmetic unit used to calculate indirect addresses using the auxiliary, index, and compare registers as inputs. |
| Auxiliary Register Compare | ARCR | A 16-bit register used in use as a limit to compare indirect address against. |
| Auxiliary Register File | AUXREGS | A register file containing eight 16-bit auxiliary registers (AR0–AR7), used for indirect data address pointers, temporary storage, or integer arithmetic processing through the ARAU. |
| Auxiliary Register Pointer | ARP | A 3-bit register used as a pointer to the currently selected auxiliary register. |
| Block Repeat Counter Register | BRCR | A 16-bit memory-mappped counter register used as a limit to the number of times the block is to be repeated. |
| Block Repeat Counter Register | PAER | A 16-bit memory-mapped register containing the end address of the segment of code being repeated. |
| Block Repeat Address Start Register | PASR | A 16-bit memory-mapped register containing the start address of the segment of code being repeated. |
| Bus Interface Module | BIM | A buffered interface used to pass data between the data and program buses. |
| Central Arithmetic Logic Unit | CALU | The grouping of the ALU, multiplier, accumulator, and scaling shifters. |
| Circular Buffer Control Register | CBCR | An 8-bit register used to enable/disable the circular buffers and define which auxiliary registers are mapped to the circular buffers. |
| Circular Buffer End Address | CBER1 | Two 16-bit registers indicating circular buffer end addresses. CBER1 and CBER2 are associated with circular buffers one and two respectively. |
| Circular Buffer Start Address | CBSR1 CBSR2 | Two 16-bit registers indicating circular buffer start addresses. CBSR1/CBSR2 are associated with circular buffers one and two respectively. |
| Data Bus | DATA | A 16-bit bus used to route data. |
| Data Memory | DATA MEMORY | This block refers to data memory used with the core and defined in specific device descriptions. It refers to both on and off-chip memory blocks accessed in data memory space. |
| Data Memory Address Immediate Register | DMA | A 7-bit register containing the immediate relative address within a data page. |
| Data Memory Page Pointer | DP(9) | A 9-bit register containing the address of the current page. Data pages are 128 words each, resulting in 512 pages of addressable data memory space (some locations are reserved). |
| Direct Data Memory Address Bus | DATA ADDRESS | A 16-bit bus that carries the direct address for the data memory, which is the concatenation of the DP register and the seven LSBs of the instruction (DMA). |
| Dynamic Bit Manipulation Register | DBMR | A 16-bit memory-mapped register used as an input to PLU. |
| Dynamic Bit Pointer | TREG2 | A 4-bit register that holds a dynamic bit pointer for the BITT instruction. |
| Dynamic Shift Count | TREG1 | A 5-bit register that holds a dynamic prescaling shift count for data inputs to the ALU. |
| Global Memory Allocation Register | GREG(8) | An 8-bit memory-mapped register for allocating the size of the global memory space. |
| Interrupt Flag Register | IFR(16) | A 16-bit flag register used to latch the active-low interrupts. The IFR is a memory mapped register. |
| Interrupt Mask Register | IMR(16) | A 16-bit memory mapped register used to mask interrupts. |
| Multiplexer | MUX | A bus multiplexer used to select the source of operands for a bus or execution unit. The MUXs are connected via instructions. |
| Multiplier | MULTI-PLIER | A 16 × 16 bit parallel multiplier. |
| Peripheral Logic Unit | PLU | A 16-bit logic unit that executes logic operations from either long immediate operands or the contents of the DBMR |

TABLE A-1-continued

Internal Hardware

| UNIT | SYMBOL | FUNCTION |
|------|--------|----------|
| | | directly upon data locations without interfering with the contents of the CALU registers. |
| Prescaler Count Register | COUNT | A 4-bit register that contains the count value for the prescaling operation. This register is loaded from either the instruction or the dynamic shift count when used in prescaling data. In conjunction with the BIT and BITT instructions, it is loaded from the dynamic bit pointer of the instruction. |
| Product Register | PREG(32) | A 32-bit product register used to hold the multiplier product. The high and low words of the PREG can also be accessed individually using the SPH/SPL (store P register high/low) instructions. |
| Product Register Buffer | BPR(32) | A 32-bit register used for temporary storage of the product register. This register can also be a direct input to the ALU. |
| Program Bus | PROG DATA | A 16-bit bus used to route instructions (and data for the MAC and MACD instructions). |
| Program Counter | PC(16) | A 16-bit program counter used to address program memory sequentially. The PC always contains the address of the next instruction to be executed. The PC contents are updated following each instruction decode operation. |
| Program Memory | PROGRAM MEMORY | This block refers to program memory used with the core and defined in specific device descriptions. It refers to both on and off-chip memory blocks accessed in program memory space. |
| Program Memory Address Bus | PROG AD-DRESS | A 16-bit bus that carries the program memory address. |
| Prescaling Shifter | PRESCALER | A 0 to 16-bit left barrel shifter used to prescale data coming into the ALU. Also used to align data for multi-precision operations. This shifter is also used as a 0–16 bit right barrel shifter of the ACC. |
| Postscaling Shifter | POST-SCALER | A 0–7 bit left barrel shifter used to post scale data coming out of the CALU. |
| Product Shifter | P-SCALER | A 0, 1, 4-bit left shifter used to remove extra sign bits (gained in the multiply operation) when using fixed point arithmetic. A 6-bit right shifter used to scale the products down to avoid overflow in the accumulation process. |
| Repeat Counter | RPTC(16) | An 8-bit counter to control the repeated execution of a single instruction. |
| Stack | STACK | A 8 × 16 hardware stack used to store the PC during interrupts and calls. The ACCL and data memory values may also be pushed onto the popped from the stack. |
| Status Registers | ST0, ST1, PMST, CBCR | Three 16-bit status registers that contain status and control bits. |
| Temporary Multiplicand | TREG0 | A 16-bit register that temporarily holds an operand for the multiplier. |
| Block Move Address Register | BMAR | A 16-bit register that holds an address value for use with block moves or multiply accumulates. |

There are 28 core processor registers mapped into the data memory space by decoder 121. These are listed in Table A-2. There are an additional 64 data memory space registers reserved in page zero of data space. These data memory locations are reserved for peripheral control registers.

TABLE A-2

Memory Mapped Registers

| NAME | ADDRESS DEC | ADDRESS HEX | DESCRIPTION |
|------|-----|-----|-------------|
| | 0–3 | 0–3 | RESERVED |
| IMR | 4 | 4 | INTERRUPT MASK REGISTER |
| GREG | 5 | 5 | GLOBAL MEMORY ALLOCATION REGISTER |
| IFR | 6 | 6 | INTERRUPT FLAG REGISTER |
| PMST | 7 | 7 | PROCESSOR MODE STATUS REGISTER |
| RPTC | 8 | 8 | REPEAT COUNTER REGISTER |
| BRCR | 9 | 9 | BLOCK REPEAT COUNTER REGISTER |
| PASR | 10 | A | BLOCK REPEAT PROGRAM ADDRESS START REGISTER |
| PAER | 11 | B | BLOCK REPEAT PROGRAM ADDRESS END REGISTER |
| TREG0 | 12 | C | TEMPORARY REGISTER USED FOR MULTIPLICAND |
| TREG1 | 13 | D | TEMPORARY REGISTER USED FOR DYNAMIC SHIFT COUNT |
| TREG2 | 14 | E | TEMPORARY REGISTER USED AS BIT POINTER IN DYNAMIC BIT TEST |
| DBMR | 15 | F | DYNAMIC BIT MANIPULATION REGISTER |
| AR0 | 16 | 10 | AUXILIARY REGISTER ZERO |
| AR1 | 17 | 11 | AUXILIARY REGISTER ONE |
| AR2 | 18 | 12 | AUXILIARY REGISTER TWO |
| AR3 | 19 | 13 | AUXILIARY REGISTER THREE |
| AR4 | 20 | 14 | AUXILIARY REGISTER FOUR |
| AR5 | 21 | 15 | AUXILIARY REGISTER FIVE |
| AR6 | 22 | 16 | AUXILIARY REGISTER SIX |
| AR7 | 23 | 17 | AUXILIARY REGISTER SEVEN |
| INDX | 24 | 18 | INDEX REGISTER |
| ARCR | 25 | 19 | AUXILIARY REGISTER COMPARE REGISTER |
| CBSR1 | 26 | 1A | CIRCULAR BUFFER 1 START ADDRESS REGISTER |
| CBER1 | 27 | 1B | CIRCULAR BUFFER 1 END ADDRESS REGISTER |
| CBSR2 | 28 | 1C | CIRCULAR BUFFER 2 START ADDRESS REGISTER |
| CBER2 | 29 | 1D | CIRCULAR BUFFER 2 END ADDRESS REGISTER |
| CBCR | 30 | 1E | CIRCULAR BUFFER CONTROL REGISTER |
| BMAR | 31 | 1F | BLOCK MOVE ADDRESS REGISTER |

The processor 13, 15 addresses a total of 64K words of data memory 25. The data memory 25 is mapped into the 96K data memory space and the on-chip program memory is mapped into a 64K program memory space.

The 16-bit data address bus 111A addresses data memory 25 in one of the following two ways:

1) By a direct address bus (DAB) using the direct addressing mode (e.g. ADD 010h), or
2) By an auxiliary register file bus (AFB) using the indirect addressing mode (e.g. ADD*)
3) Operands are also addressed by the contents of the program counter in an immediate addressing mode.

In the direct addressing mode, a 9-bit data memory page pointer (DP) 125 points to one of 512 (128-word) pages. A MUX 126 selects on command either bus 101D or 111D for DP pointer register portion 125. The data memory address (dma) specified from program data bus 101D by seven LSBs 127 of the instruction, points to the desired word within the page. The address on the DAB is formed by concatenating the 9-bit DP with the 7-bit dma. A MUX 129 selectively supplies on command either the ARAU 123 output or the concatenated (DP, dma) output to data address bus 111A.

In the indirect addressing mode, the currently selected 16-bit auxiliary register AR(ARP) in registers 115 addresses the data memory through the AFB. While the selected auxiliary register provides the data memory address and the data is being manipulated by the CALU 15, the contents of the auxiliary register may be manipulated through the ARAU 123.

The data memory address map can be extended beyond the 64K-word address reach of the 16-bit address bus by paging in an additional 32K words via the global memory interface. By loading the GREG register with the appropriate value, additional memory can be overlaid over the local data memory starting at the highest address and moving down. This additional memory is differentiated from the local memory by the BR-pin being active low.

When an immediate operand is used, it is either contained within the instruction word itself or, in the case of 16-bit immediate operands, the word following the instruction word.

Eight auxiliary registers (AR0–AR7) in the auxiliary registers 115 are used for indirect addressing of the data memory 25 or for temporary data storage. Indirect auxiliary register addressing allows placement of the data memory address of an instruction operand into one of the auxiliary registers. These registers are pointed to by a three-bit auxiliary register pointer (ARP) 141 that is loaded with a value from 0 through 7, designating AR0 through AR7, respectively. A MUX 144 has inputs connected to data bus 111D and program data bus 101D. MUX 144 is operated by instruction to obtain a value for ARP 141 from one of the two buses 111D and 101D. The auxiliary registers 115 and the ARP 141 may be loaded either from data memory 25, the accumulator 23, the product register 51, or by an immediate operand defined in the instruction. The contents of these registers may also be stored in data memory 25 or used as inputs to the main CPU.

The auxiliary register file (AR0–AR7) 115 is connected to the Auxiliary Register Arithmetic Unit (ARAU) 123 shown in FIG. 1B. The ARAU 123 may autoindex the current auxiliary register in registers 115 while the data memory location is being addressed. Indexing by either ±1 or by the contents of an index register 143 or AR0 may be performed. As a result, accessing tables of information by rows or columns does not require the Central Arithmetic Logic Unit (CALU) 15 for address manipulation, thus freeing it for other operations.

The index register 143 or the eight LSBs of an instruction register IR are selectively connected to one of the inputs of the ARAU 123 via a MUX 145. The other input of ARAU 123 is fed by a MUX 147 from the current auxiliary register AR (being pointed to by ARP). AR(ARP) refers to the contents of the current AR 115 pointed to by ARP. The ARAU 123 performs the following functions.

| ("--" means "loaded into") | |
|---|---|
| AR(ARP) + INDX -- AR(ARP) | Index the current AR by adding a 16-bit integer contained in INDX. |
| AR(ARP) – INDX -- AR (ARP) | Index the current AR by subtracting a 16-bit integer contained in INDX. |
| AR(ARP) + 1-- AR(ARP) | Increment the current AR by one. |
| AR(ARP) – 1 -- AR(ARP) | Decrement the current AR by one. |
| AR(ARP) -- AR(ARP) | Do not modify the current AR. |
| AR(ARP) + IR(7-0) -- AR(ARP) | ADD an 8-bit immediate value to current AR. |
| AR(ARP) – IR(7-0) -- AR(ARP) | Subtract an 8-bit immediate value from current AR. |
| AR(ARP) + rc(INDX) -- AR(ARP) | Bit-reversed indexing, add INDX with reverse carry (rc) propagation. |
| AR(ARP) – rc(INDX) -- AR(ARP) | Bit-reversed indexing, subtract INDX with reverse-carry (rc) propagation. |
| if (AR(ARP) = ARCR) then TC = 1 | Compare current AR with |
| if (AR(ARP)gt ARCR) then TC = 1 | ARCR and if comparison |
| if (AR(ARP)lt ARCR) then TC = 1 | is true then set TC bit of |
| if (AR(ARP)neq ARCR) then TC = 1 | the status register (ST1) to one. If false then clear TC. |
| if(AR(ARP) = CBER)then AR(ARP) = CBSR | If at end of circular buffer reload start address |

The index register (INDX) can be added to or subtracted from AR(ARP) on any AR update cycle. This 16-bit register is one of the memory-mapped registers. This 16-bit register is used to step the address in steps larger than one and is used in operatios such as addressing down a column of a matrix. The auxiliary register compare register (ARCR) is used as a limit to blocks of data and in conjunction with the CMPR instruction supports logical comparisons between AR(ARP) and ARCR.

Because the auxiliary registers 115 are memory-mapped, they can be acted upon directly by the CALU 15 to provide for more advanced indirect addressing techniques. For example, the multiplier 27 can be used to calculate the addresses of three dimensional matrices. There is a two machine cycle delay after a CALU load of the auxiliary register until auxiliary registers can be used for address generation.

Although the ARAU 123 is useful for address manipulation in parallel with other operations, it suitably also serves as an additional general-purpose arithmetic unit since the auxiliary register file can directly communicate with data memory. The ARAU implements 16-bit unsigned arithmetic, whereas the CALU implements 32-bit two's complement arithmetic. BANZ and BANZD instructions permit the auxiliary registers to also be used as loop counters.

A 3-bit auxiliary register pointer buffer (ARB) 148 provides storage for the ARP on subroutine calls.

The processor supports two circular buffers operating at a given time. These two circular buffers are controlled via the Circular Buffer Control Register (CBCR) in registers 85. The CBCR is defined as follows:

| BIT | NAME | FUNCTION |
| --- | --- | --- |
| 0–2 | CAR1 | Identifies which auxiliary register is mapped to circular buffer 1. |
| 3 | CENB1 | Circular buffer 1 enable = 1/disable = 0. Set 0 upon reset. |
| 4–6 | CAR2 | Identifies which auxiliary register is mapped to circular buffer 2. |
| 7 | CENB2 | Circular buffer 2 enable = 1/disable = 0. Set 0 upon reset. |

Upon reset (RS-rising edge) both circular buffers are disabled. To define each circular buffer first load the CBSR1 and CBSR2 with the respective start addresses of the buffers and CBER1 and CBER2 with the end addresses. Then load respective auxiliary registers AR(i1) and AR(i2) in registers 115 to be used with each circular buffer with an address between the start and end. Finally load CBCR with the appropriate auxiliary register number i1 or i2 for ARP and set the enable bit. As the address is stepping through the circular buffer, the update is compared by ARAU 123 against the value contained in CBER 155. When equal, the value contained in CBSR 157 is automatically loaded into the AR auxiliary register AR(i1) or AR(i2) for the respective circular buffer.

Circular buffers can be used with either incremented or decremented type updates. If using increment, then the value in CBER is greater than the value in CBSR. When using decrement, the greater value is in the CBSR. The other indirect addressing modes also can be used wherein the ARAU 123 tests for equality of the AR and CBER values. The ARAU does not detect an AR update that steps over the value contained in CBER 155.

As shown in FIG. 1B, the data bus 111D is connected to supply data to MUXes 144 and 126, auxiliary registers 115 and registers CBER 155, INDX 143, CBSR 157 and an address register compare register ARCR 159. MUX 145 has inputs connected to registers CBER, INDX and ARCR and instruction register IR for supplying ARAU 123.

The preferred embodiment provides instructions for data and program block moves and for data move functions that efficiently utilize the memory spaces of the device. A BLDD instruction moves a block within data memory, and a BLPD instruction moves a block from program memory to data memory. One of the addresses of these instructions comes from a data address generator, and the other comes from either a long immediate constant or a Block Move Address Register (BMAR) 160. When used with the repeat instructions (RPT/RPTK/RPTR/RPTZ), the BLDD/BLPD instructions efficiently perform block moves from on-chip or off-chip memory.

A data move instruction DMOV allows a word to be copied from the currently addressed data memory location in on-chip RAM to the next higher location while the data from the addressed location is being operated upon in the same cycle (e.g. by the CALU). An ARAU operation may also be performed in the same cycle when using the indirect addressing mode. The DMOV function is useful for implementing algorithms that use the $Z^{-1}$ delay operation, such as convolutions and digital filtering where data is being passed through a time window. The data move function can be used anywhere within predetermined blocks. The MACD (multiply and accumulate with data move) and the LTD (load TREG0 with data move and accumulate product) instructions use the data move function.

TBLR/TBLW (table read/write) instructions allow words to be transferred between program and data spaces. TBLR is used to read words from program memory into data memory. TBLW is used to write words from data memory to program memory.

As described above, the Central Arithmetic Logic Unit (CALU) 15 contains a 16-bit prescaler scaling shifter 65, a 16×16-bit parallel multiplier 27, a 32-bit Arithmetic Logic Unit (ALU) 21, a 32-bit accumulator (ACC) 23, and additional shifters 169 and 181 at the outputs of both the accumulator 23 and the multiplier 27. This section describes the CALU components and their functions.

The following steps occur in the implementation of a typical ALU instruction:

1) Data is fetched from the RAM 25 on the data bus.
2) Data is passed through the scaling shifter 65 and the ALU 21 where the arithmetic is performed, and
3) The result is moved into the accumulator 23.

One input to the ALU 21 is provided from the accumulator 23, and the other input is selected from the Product Register (PREG) 51 of the multiplier 27, a Product Register Buffer (BPR) 185, the Accumulator Buffer (ACCB) 31 or from the scaling shifters 65 and 181 that are loaded from data memory 25 or the accumulator 23.

Scaling shifter 65 advantageously has a 16-bit input connected to the data bus 111D via MUX 73 and a 32-bit output connected to the ALU 21 via MUX 77. The scaling shifter prescaler 65 produces a left shift of 0 to 16 bits on the input data, as programmed by loading a COUNT register 199. The shift count is specified by a constant embedded in the instruction word, or by a value in register TREG1. The LSBs of the output of prescaler 65 are filled with zeros, and the MSBs may be either filled with zeros or sign-extended, depending upon the status programmed into the SXM (sign-extension mode) bit of status register ST1.

The same shifter 65 has another input path from the accumulator 23 via MUX 73. When using this path the shifter 65 acts as a 0 to 16 bit right shifter. This allows the contents of the ACC to be shifted 0 to 16 bits right in a single cycle. The bits shifted out are lost and the bits shifted in are either zeros or copies of the original sign bit depending on the value of the SXM status bit.

The various shifters 65, 169 and 181 allow numerical scaling, bit extraction, extended-precision arithmetic, and overflow prevention.

The 32-bit ALU 21 and accumulator 23 implement a wide range of arithmetic and logical functions, the majority of which execute in a single clock cycle in the preferred embodiment. Once an operation is performed in the ALU 21, the result is transferred to the accumulator 23 where additional operations such as shifting may occur. Data that is input to the ALU may be scaled by the scaling shifter 181.

The ALU 21 is a general-purpose arithmetic unit that operates on 16-bit words taken from data RAM or derived from immediate instructions. In addition to the usual arithmetic instructions, the ALU can even perform Boolean operations. As mentioned hereinabove, one input to the ALU is provided from the accumulator 23, and the other input is selectively fed by MUX 77. MUX 77 selects the Accumulator Buffer (ACCB) 31 or secondly the output of the scaling shifter 65 (that has been read from data RAM or from the ACC), or thirdly, the output of product scaler 169. Product scaler 169 is fed by a MUX 191. MUX 191 selects either the Product Register PREG 51 or the Product Register Buffer 185 for scaler 169.

The 32-bit accumulator 23 is split into two 16-bit segments for storage via data bus 111D to data memory 25. Shifter 181 at the output of the accumulator provides a left shift of 0 to 7 places. This shift is performed while the data is being transferred to the data bus 111D for storage. The contents of the accumulator 23 remain unchanged. When the post-scaling shifter 181 is used on the high word of the accumulator 23 (bits 16–31), the MSBs are lost and the LSBs are filled with bits shifted in from the low word (bits 0–15). When the post-scaling shifter 181 is used on the low word, the LSB's are zero filled.

Floating-point operations are provided for applications requiring a large dynamic range. The NORM (normalization) instruction is used to normalize fixed point numbers contained in the accumulator 21 by performing left shifts. The four bits of temporary register TREG1 81 define a variable shift through the scaling shifter 65 for the LACT/ADDT/SUBT (load/add-to/subtract from accumulator with shift specified by TREG1) instructions. These instructions are useful in floating-point arithmetic where a number needs to be denormalized, i.e., floating-point to fixed-point conversion. They are also useful in applications such as execution of an Automatic Gain Control (AGC) going into a filter. The BITT (bit test) instruction provides testing of a single bit of a word in data memory based on the value contained in the four LSBs of a temporary register TREG2 195.

Registers TREG1 and TREG2 are fed by data bus 111D. A MUX 197 selects values from TREG1, TREG2 or from program data bus 101D and feeds one of them to a COUNT register 199. COUNT register 199 is connected to scaling shifter 65 to determine the amount of shift.

The single-cycle 0-to-16-bit right shift of the accumulator 23 allows efficient alignment of the accumulator for multi-precision arithmetic. This coupled with the 32-bit temporary buffers ACCB on the accumulator and BPR on the product register enhance the effectiveness of the CALU in multi-precision arithmetic. The accumulator buffer register (ACCB) provides a temporary storage place for a fast save of the accumulator. ACCB can be also used as an input to the ALU. ACC and ACCB can be stored into each other. The contents of the ACCB can be compared by the ALU against the ACC with the larger/smaller value stored in the ACCB (or in both ACC and ACCB)for use in pattern recognition algorithms. For instance, the maximum or minimum value in a string of numbers is advantageously found by comparing the contents of the ACCB and ACC, and if the condition is met then putting the minimum or maximum into one or both registers. The product register buffer (BPR) provides a temporary storage place for a fast save of the product register. The value stored in the BPR can also be added to/subtracted from the accumulator with the shift specified for the provided shifter 169.

An accumulator overflow saturation mode may be programmed through the SOVM and ROVM (set/reset overflow mode) instructions. When the accumulator 73 is in the overflow saturation mode and an overflow occurs, the overflow flag (OVM bit of register ST0) is set and the accumulator is loaded with either the most positive or the most negative number depending upon the direction of the overflow. The value of the accumulator upon saturation is 07FFFFFFFh (positive) or 0800000000h (negative). If the OVM (overflow mode) status register bit is reset and an overflow occurs, the overflowed results are loaded into the accumulator with modification. (Note that logical operations do not result in overflow.)

A variety of branch instructions depend on the status conditions of the ALU and accumulator. These status conditions include the V (branch on overflow) and Z (branch on accumulator equal to zero), L (branch on less than zero) and C (branch on carry). In addition, the BACC (branch to address in accumulator) instruction provides the ability to branch to an address specified by the accumulator (computed goto). Bit test instructions (BIT and BITT), which do not affect the accumulator, allow the testing of a specified bit of a word in data memory.

The accumulator has an associated carry bit C in register ST1 that is set or reset depending on various operations within the device. The carry bit allows more efficient computation of extended-precision products and additions or subtractions. It is also useful in overflow management. The carry bit is affected by most arithmetic instructions as well as the single bit shift and rotate instructions. It is not affected by loading the accumulator, logical operations, or other such nonarithmetic or control instructions. Examples of carry bit operation are shown in Table A-3.

TABLE A-3

Examples of Carry Bit Operation

| C | MSB | LSB | | C | MSB | LSB | |
|---|------|------|-----------|---|------|------|-----------|
| X | FFFF | FFFF | ACC | X | 0000 | 0000 | ACC |
| + |      | 1    |           | − |      | 1    |           |
| 1 | 0000 | 0000 |           | 0 | FFFF | FFFF |           |
| X | 7FFF | FFFF | ACC       | X | 8000 | 0001 | ACC       |
| + |      | 1    | (OVM = 0) | − |      | 2    | (OVM = 0) |
| 0 | 8000 | 0000 |           | 1 | 7FFFF| FFFF |           |
| 1 | 0000 | 0000 | ACC       | X | FFFF | FFFF | ACC       |
| + |      | 0    | (ADDC)    | − |      | 1    | (SUBB)    |
| 0 | 0000 | 0001 |           | 1 | FFFF | FFFE |           |

The value added to or subtracted from the accumulator, shown in the example of Table A-3 may come from either the input scaling shifter, ACCR, PREG or BPR. The carry bit is set if the result of an addition or accumulation process generates a carry, or reset to zero if the result of a subtraction generates a borrow. Otherwise, it is reset after an addition or set after a subtraction.

The ADDC (add to accumulator with carry) and SUBB (subtract from accumulator with borrow) instructions provided use the previous value of carry in their addition/subtraction operation. The ADCR (add ACCB to accumulator with carry) and the SBBR (subtract ACCR from accumulator with borrow) also use the previous value of carry C.

An exception to operation of the carry bit is the use of ADD with a shift count of 16 (add to high accumulator) and SUB with a shift count of 16 (subtract from high accumulator) instructions. The case of the ADD instruction sets the carry bit if a carry is generated, and this case of the SUB instruction resets the carry bit if a borrow is generated. Otherwise, neither instruction affects it.

Two branch instructions, BC and BNC, are provided for branching on the status of the carry bit. The SETC, CLRC and LST1 instructions can also be used to load the carry bit. The carry bit is set to one on a hardware reset.

The SFL and SFR (in-place one-bit shift to the left/right) instructions and the ROL and ROR (rotate to the left/right) instructions implement shifting or rotating of the contents of the accumulator through the carry bit. The SXM bit affects the definition of the SFR (shift accumulator right) instruction. When SXM=1, SFR performs an arithmetic right shift, maintaining the sign of the accumulator data. When SXM=0, SFR performs a logical shift, shifting out the LSBs and shifting in a zero for the MSB. The SFL (shift accumulator left instruction is not affected by the SXM bit and behaves the same in both cases, shifting out the MSB and shifting in a zero. Repeat (RPT, RPTK, RPTR or RPTZ) instructions may be used with the shift and rotate instructions for multiple-bit shifts.

The 65-bit combination of the accumulator, ACCB, and carry bit can be shifted or rotated as described above using the SFLR, SFRR, RORR and ROLR instructions.

The accumulator can also be right-shifted 0–31 bits in two instruction cycles or 0–16 bits in one cycle. The BSAR instruction shifts the accumulator 1–16 bits based upon the four bit value in the instruction word. The SATL instruction shifts the accumulator to the right based upon the 4-LSBs of TREG1. The SATH instruction shifts the accumulator 16-bits if bit 5 of TREG1 is a one.

The 16×16-bit hardware multiplier 27 computes a signed or unsigned 32-bit product in a single machine cycle. All multiply instructions, except MPYU (multiply unsigned) instruction perform a signed multiply operation in the multiplier. That is, two numbers being multiplied are treated as two's-complement numbers, and the result is a 32-bit two's-complement number. The following three registers are associated with the multiplier.

The 16-bit temporary register (TREG0) 49 connected to the data bus that holds one of the operands for the multiplier.

The 32-bit product register (PREG) 51 that holds the product, and The 32-bit product buffer (BPR) 185 that is used to temporarily store the PREG 51.

The output of the product register 51 and product buffer 185 can be left-shifted according to four product shift modes (PM), which are useful for implementing multiply/accumulate operations, fractional arithmetic or justifying fractional products. The PM field of status register ST1 specifies the PM shift mode. The product is shifted one bit to compensate for the extra sign bit gained in multiplying two 16-bit two's-complement numbers (MPY). A four bit shift is used in conjunction with an MPYK instruction to eliminate the four extra sign bits gained in multiplying a 16-bit number times a 13-bit number. The output of PREG and BPR can instead be right-shifted 6 bits to enable the execution of up to 128 consecutive multiply/accumulates without the possibility of overflow. When right shift is specified, the product is sign-extended, regardless of the value of SXM.

An LT (load TREG0) instruction normally loads the TREG0 49 to provide one operand (from the data bus), and the MPY (multiply) instruction provides the second operand (also from the data bus). A multiplication can also be performed with an immediate operand using the MPYK instruction. In either case, a product can be obtained every two cycles.

Four multiply/accumulate instructions (MAC and MACD, MADS and MADD) fully utilize the computational bandwidth of the multiplier 27, allowing both operands to be processed simultaneously. A MUX 211 selects either data bus 111D or program data bus 101D to feed a second input of multiplier array 53. The data for these operations can be thus transferred to the multiplier each cycle via the program and data buses. This provides for single-cycle multiply/accumulates when used with repeat (RPT, RPTK, RTPR, RPTZ) instructions. The SQRA (square/add) and SQRS (square/subtract) instructions pass the same value to both inputs of the multiplier for squaring a data memory value.

The MPYU instruction performs an unsigned multiplication, which greatly facilitates extended precision arithmetic operations. The unsigned contents of TREG0 are multiplied by the unsigned contents of the addressed data memory location, with the result placed in PREG. This allows operands of greater than 16 bits to be broken down into 16-bit words and processed separately to generate products of greater than 32-bits.

After the multiplication of two 16-bit numbers, the 32-bit product is loaded into the 32-bit Product Register (PREG) 51. The product from the PREG may be transferred to the ALU, to the Product Buffer (BPR) or to data memory 25 via the SPH (Store Product High) and SPL (Store Product Low). Temporarily storing the product in BPR for example is vital to efficient execution of algorithms such as the transposed form of the IIR (infinite impulse response) digital filter. Use of BPR avoids unnecessary subsequent recomputation of the product of the same two operands.

As discussed above, four product shift modes (PM) are available at the PREG and BPR outputs, which are useful when performing multiply/accumulate operations, fractional arithmetic, or justifying fractional products. The PM field of status register ST1 specifies the PM shift mode, as shown below:

| PM | RESULTING SHIFT |
| --- | --- |
| 00 | NO SHIFT |
| 01 | LEFT SHIFT OF 1 BIT |
| 10 | LEFT SHIFT OF 4 BITS |
| 11 | RIGHT SHIFT OF 6 BITS |

Left shifts specified by the PM value are useful for implementing fractional arithmetic or justifying fractional products. for example, the product of either two normalized, 16-bit, two's-complement numbers or two Q15 numbers contains two sign bits, one of which is redundant. Q15 format, one of the various types of Q format, is a number representation commonly used when performing operations on non-integer numbers. The single-bit-left-shift eliminates this extra sign bit from the product when it is transferred to the accumulator. This results in the accumulator contents being formatted in the same manner as the multiplicands. Similarly, the product of either a normalized, 16- bit, two's-complement or Q15 number and a 13-bit, two's-complement constant (MPYK) contains five sign bits, four of which are redundant. Here the four-bit shift property aligns the result as it is transferred to the accumulator.

Use of the right-shift PM value allows the execution of up to 128 consecutive multiply/accumulate operations without the threat of an arithmetic overflow, thereby avoiding the overhead of overflow management. The shifter can be disabled to cause no shift in the product when working with integer or 32-bit precision operations. Note that the PM right shift is always sign-extended regardless of the state of SXM.

System control is provided by the program counter 93, hardware stack 91, PC-related hardware, the external reset signal RS-, interrupts to an interrupt control 231, the status registers, and the repeat counters. The following sections describe the function of each of these components in system control and pipeline operation.

The processor has 16-bit Program Counter (PC) 93, and an eight deep hardware stack 91 provides PC storage. The program counter 93 addresses internal and external program memory 61 in fetching instructions. The stack 91 is used during interrupts and subroutines.

The program counter 93 addresses program memory 61, either on-chip or off-chip, via the Program Address Bus (PAB) 101A. Through the PAB, an instruction is addressed in program memory 61 and loaded via program data bus 101D into the Instruction Register (IR) for a decoder PLA 221. When the IR is loaded, the PC 93 is ready to start the next instruction fetch cycle. Decoder PLA (programmable logic array) 221 has numerous outputs for controlling the MUXes and all processor elements in order to execute the instructions in the processor instruction set. For example, decoder PLA 221 feeds command signals to a pipeline controller 225 which also has various outputs for implementing the pipelined processing operations so that the processor elements are coordinated in time. The outputs of pipeline controller 225 also include CALL, RET (RETURN), IAQ (interrupt acquisition) and IACK (interrupt acknowledge).

Data memory 25 is addressed by the program counter 93 during a BLKD instruction, which moves data blocks from one section of data memory to another. The contents of the accumulator 23 may be loaded into the PC 93 in order to implement "computed GOTO" operations. This can be accomplished using the BACC (branch to address in accumulator) or CALA (call subroutine indirect) instructions.

To start a new fetch cycle, the PC 93 is loaded either with PC+1 or with a branch address (for instructions such as branches, calls, or interrupts). In the case of special conditional branches where the branch is not taken, the PC is incremented once more beyond the location of the branch immediate. In addition to the conditional branches, the processor has a full complement of conditional calls and returns.

The processor 13, 15 operates with a four deep pipeline. This means any discontinuity in the PC 93 (i.e., branch call or interrupt) forces the device to flush two instructions from the pipeline. To avoid these extra cycles, the processor has a full set of delayed branches, calls and returns. In the delayed operation of the branches, calls or returns, the two instructions following the delayed instruction are executed while the instructions at the branch address are being fetched, therefore, not flushing the pipeline and giving an effective two cycle branch. If the instruction following the delayed branch is a two word instruction, then only it will be executed.

A further feature allows the execution of the next single instruction N+1 times. N is defined by loading a 16-bit RPTC (repeat counter) in registers 85. When this repeat feature is used, the instruction is executed, and the RPTC is decremented until the RPTC goes to zero. This feature is useful with many instructions, such as NORM (normalize contents of accumulator), MACD (multiply and accumulate with data move), and SUBC (conditional subtract). When repeating instructions, the program address and data buses are freed to fetch a second operand in parallel with the data address and data buses. This allows instructions such as MACD and BLKP to effectively execute in a single cycle when repeated.

The PC stack 91 is 16-bits wide and eight levels deep. The PC stack 91 is accessible through the use of the push and pop instructions. Whenever the contents of the PC 93 are pushed onto the top of the stack 91, the previous contents of each level are pushed down, and the bottom (eighth) location of the stack is lost. Therefore, data is lost if more than eight successive pushes occur before a pop. The reverse happens on pop operations. Any pop after seven sequential pops yields the value of the bottom stack level. All of the stack levels then contain the same value. The two instructions, PSHD and POPD, push a data memory value onto the stack or pop a value from the stack to or from data memory via data bus 111D. These instructions allow a stack to be built in data memory for the nesting of subroutines/interrupts beyond eight levels.

Instruction pipelining involves the sequence of bus operations that occurs during instruction execution. The instruction—fetch, decode, operand—fetch, execute pipeline is essentially invisible to the user, except in some cases where the pipeline must be broken (such as for branch instructions). In the operation of the pipeline the instruction fetch, decode, operand fetch, and execute operations are independent which allow instruction executions to overlap. Thus, during any given cycle, one to four different instructions can be active, each at a different stage of completion, resulting in a four deep pipeline.

Reset (RS-) is a non-maskable external interrupt that can be used at any time to put the processor 13, 15 into a known state. Reset is typically applied after powerup when the machine is in an unknown state.

Driving the RS-signal low causes the processor to terminate execution and forces the program counter 93 to zero. RS- affects various registers and status bits. At powerup, the state of the processor 13, 15 is undefined. For correct system operation after powerup, a reset signal is asserted low for five clock cycles to reset the device 11. Processor execution begins at location 0, which normally contains a B (BRANCH) statement to direct program execution to the system initialization routine.

Upon receiving an RS-signal, the following actions take place:

1) A logic 0 is loaded into the CNF (configuration control bit in status register ST1, mapping all on-chip data RAM into data address space.
2) The Program Counter (PC) is set to 0, and the address bus A15-A0 is driven with all zeros while RS- is low.
3) All interrupts are disabled by setting the INTM (interrupt mode) bit to 1. (Note that RS- is non-maskable). The interrupt flag register (IFR) is cleared.
4) Status bits: ("--" means "loaded into")
   0--OV,1--XF,1--SXM,0--PM,1--HM,0--BRAF,0--TRM,0--NDX,
   0--CENB1,0--CENB2, Inverse of TxM--MP/MC- and RAM,
   0--OVLY, 0--IPTR, and 1--C.
(The remaining status bits remain undefined and should be initialized appropriately).
5) The global memory allocation register (GREG) is cleared to make all memory local.
6) The RPTC (repeat counter) is cleared.
7) The IACK- (interrupt acknowledge) signal is generated in the same manner as a maskable interrupt.
8) A synchronized reset signal SRESET- is sent to the peripheral circuits to initialize them.

Execution starts from location 0 of program memory when the RS- signal is taken high. Note that if RS- is asserted while in the hold mode, normal reset operation occurs internally, but all buses and control lines remain in the high-impedance state. Upon release of HOLD- and RS-, execution starts from location zero.

There are four key status and control registers for the processor core. ST0 and ST1 contain the status of various conditions while PMST and CBCR contain extra status and control information for control of the enhanced features of the processor core. These registers can be stored into data memory and loaded from data memory, thus allowing the status of the machine to be saved and restored for subroutines. Each of these registers has an associated one-deep stack for automatic context saves when an interrupt trap is taken. The stack is automatically popped upon a return from interrupt.

The PMST and CBCR registers reside in the memory-mapped register 85 space in page zero of data memory space. Therefore they can be acted upon directly by the CALU and the PLU. They can be saved the same as any other data memory location.

ST0 and ST1 are written to using the LST and LST1 instructions respectively and read from using the SST and SST1 instructions (with the exception of the INTM bit that is not affected by the LST instruction).

Unlike the PMST and CBCR registers, the ST0 and ST1 registers do not reside in the memory map and therefore are not handled using the PLU instructions. The individual bits of these registers can be set or cleared using the SETC and CLRC instructions. For example, the sign-extension mode is set with SETC SXM or cleared with CLRC SXM.

Table A-4 defines all the status/control bits.

TABLE A-4

| FIELD | FUNCTION |
|---|---|
| ARB | Auxiliary Register Pointer Buffer. ST1 bits 15–13. Whenever the ARP is loaded, the old ARP value is copied to the ARB except during an LST instruction. When the ARB is loaded via a LST1 instruction, the same value is also copied to the ARP. |
| ARP | Auxiliary Register Pointer. ST0 bits 15–13. This three-bit field selects the AR to be used in indirect addressing. When ARP is loaded, the old ARP value is copied to the ARB register. ARP may be modified by memory-reference instructions when using indirect addressing, and by the LARP, MAR, and LST instructions. ARP is also loaded with the same value as ARB when an LST1 instruction is executed. |
| BRAF | Block Repeat Active Flag. PMST bit 0. This bit indicates whether (BRAF = 1) or not (BRAF = 0) block repeat is currently active. Writing a zero to this bit deactivates block repeat. BRAF is set to zero upon reset. |
| C | Carry Bit. ST1 bit 9. This bit is set to 1 if the result of an addition generates a carry, or reset to 0 if the result of a subtraction generates a borrow. Otherwise, it is reset after an addition or set after a subtraction, except if the instruction is ADD or SUB. ADD can only set and SUBH only reset the carry bit, but does not affect it otherwise. The single bit shift and rotate instructions also affect this bit, as well as the SETC, CLRC, LST1 instructions. Branch instructions are provided to branch on the status of C. C is set to 1 on a reset. |
| CAR1 | Circular Buffer 1 Auxiliary Register. CBCR bits 2–0. These three bits identify which auxiliary register is assigned to circular buffer 1. |
| CAR2 | Circular Buffer 2 Auxiliary Register. CBCR bits 6–4. These three bits identify which auxiliary register is assigned to circular buffer 2. |
| CENB1 | Circular Buffer 1 Enable. CBCR bit 3. This bit, when set to 1, enables circular buffer 1. When set to zero, disables circular buffer 1. Set to zero upon reset. |
| CENB2 | Circular Buffer 2 Enable. CBCR bit 7. This bit, when set to 1, enables circular buffer 2. When set to zero circular buffer 2 is disabled. CBEN2 is set to zero upon reset. |
| CNF | On-chip RAM Configuration Control bit. ST1 bit 12. If set to 0, the reconfigurable data RAM blocks are mapped to data space; otherwise, they are mapped to program space. The CNF may be modified by the CNFD, CNFP, and LST1 instructions. RE- resets the CNF to 0. |
| DP | Data Memory Page Pointer. ST0 bits 8–0. The 9-bit DP register is concatenated with the 7 LSBs of an instruction word to form a direct memory address of 16 bits. DP may be modified by the LST, LDP, and LDPK instructions. |

TABLE A-4-continued

| FIELD | FUNCTION |
|---|---|
| FO | Format bit. ST1 bit 3. This bit is used to configure the serial port format. |
| FSM | Frame Synchronous Mode bit. ST1 bit 5. This bit is used in configuration of the framing mode of the serial port. |
| HM | Hold Mode bit. ST1 bit 6. When HM = 1, the processor halts internal execution when acknowledging an active HOLD-. When HM = 0, the processor may continue execution out of internal program memory but puts its external interface in a high-impedance state. This bit is set to 1 by reset. |
| INTM | Interrupt Mode bit. ST0 bit 9. When set to 0, all unmasked interrupts are enabled. When set to 1, all maskable interrupts are disabled. INTM is set and reset by the DINT and EINT instructions. RS- and 1ACK- also set INTM. INTM has no effect on the unmaskable RS- and NM1- interrupts. INTM is unaffected by the LST instruction. |
| IPTR | Interrupt vector pointer PMST bits 15–11. These five bits point to the 2K page where the interrupt vectors reside. This allows the user to remap interrupt vectors to RAM for boot loaded operations. At reset these bits are all set to zero. Therefore the reset vector always resides at zero in the program memory space. |
| MP/MC- | MicroProcessor/MicroComputer bit, PMST bit 3. When set to zero the on-chip ROM is enabled. When set to one the on-chip ROM is not addressable. This bit is set to the inverse of TXM at reset. |
| NDX | Enable Extra Index Register. PMST bit 2. When set to 0, the ARAU uses ARO for indexing and address compare. When set to 1, the ARAU uses INDX for indexing and ARCR for address compare. Upon reset, this bit is set to zero. |
| OV | Overflow Flag bit. ST0 bit 12. As a latched overflow signal, OV is set to 1 when overflow occurs in the ALU. Once an overflow occurs, the OV remains set until a reset, BV, BNV, or LST instructions clears OV. |
| OVLY | OVerLAY the on-chip program memory in data memory space. PMST bit 5. If set to zero the memory is addressable in program space only. If set to one it is addressable in both program and data space. Set to zero at reset. |
| OVM | Overflow Mode bit. ST0 bit 11. When set to 0, overflowed results overflow normally in the accumulator. When set to 1, the accumulator is set to either its most positive or negative value upon encountering an overflow. The SOVM and ROVM instructions set and reset this bit, respectively. LST may also be used to modify the OVM. |
| PM | Product Shift Mode. ST1 bits 1–0. If these two bits are 00, the multiplier's 32-bit product or buffer is loaded into the ALU with no shift. If PM = 01, the PREG or BPR output is left-shifted one place and loaded into the ALU, with the LSB zero-filled. If PM = 10, the PREG or BPR output is left-shifted by four bits and loaded into the ALU, with the LSBs zero-filled. PM = 11 produces a right shift of six bits, sign-extended. Note that the PREG or BPR contents remain unchanged. The shift takes place when transferring the contents of the PREG or BPR to the ALU. PM is loaded by the SPM and LST1 instructions. The PM bits are cleared by RS-. |
| RAM | Enable/Disable on-chip RAM. PMST bit 4. Set to inverse of TXM at reset. If set to zero the on-chip program RAM is disabled. If set to one the on-chip program RAM is enabled. |
| SXM | Sign-Extension Mode bit. ST1 bit 10. SXM = 1 produces sign extension on data as it is passed into the accumulator through the scaling |

TABLE A-4-continued

| FIELD | FUNCTION |
|---|---|
|  | shifter. SXM = 0 suppresses sign extension. SXM does not affect the definition of certain instructions; e.g., the ADDS instruction suppresses sign extension regardless of SXM. This bit is set and reset by the SSXM and RSXM instructions, and may also be loaded by LST1. SXM is set to 1 by reset. |
| TC | Test/Control Flag bit. ST1 bit 11. The TC bit is affected by the BIT, BITT, CMPR, LST1, NORM, CPLK, XPLK, OPLK, APLK, XPL, OPL, and APL instructions. The TC bit is set to a 1 if a bit tested by BIT or BITT is a 1, if a compare condition tested by CMPR exists between ARCR and another AR pointed to by ARP, if the exclusive-OR function of the two MSBs of the accumulator is true when tested by a NORM instruction, if the long immediate value is equal to the data value on the CPLK instruction, or if the result of the logical function (XPLK, OPLK, APLK, XPL, OPL or APL) is zero. Fourteen conditional branch, call and return instructions provide operations based upon the value of TC: BBZ, BBZD, BBNZ, BBNZD, CBZ, CBZD, CBNZ, CBNZD, RBZ, RJBZD, RBNZ, RBNZD, CEBZ, and CEBNZ. |
| TRM | Enable Multiple TREG's. PMST bit 1. When TRM is set to zero, any write to any of TREG0, TREG1 or TREG2 writes to all three. When TRM is set to one, TREG0, TREG1, and TREG2 are individually selectable. TRM is set to zero at reset. |
| TXM | Transmit Mode Bit. ST1 bit 2. This bit is used in configuration of the transmit clock pin of the serial port. |
| XF | XF pin status bit. ST1 bit 4. This bit indicates the current level of the external flag. |

The repeat counter (RPTC) in registers 85 is a 16-bit counter, which when loaded with a number N, causes the next single instruction to be executed N+1 times. The RPTC can be loaded with a number from 0 to 255 using the RPTK instruction or a number from 0 to 65535 using the RPT, RPTR, or RPTZ instructions. This results in a maximum of 65536 executions of a given instruction. RPTC is cleared by reset. Both the RPTR and the RPTZ instructions load a long immediate value into RPTC and the RPTZ also clears the PREG and ACC.

The repeat feature can be used with instructions such as multiply/accumulates (MAC/MACD), block moves (BLKD/BLKP), I/O transfers (IN/OUT), and table read/writes (TBLR/TBLW). These instructions, although normally multi-cycle, are pipelined when using the repeat feature, and effectively become single-cycle instructions. For example, the table read instruction may take three or more cycles to execute, but when repeated, a table location can be read every cycle.

A block repeat feature provides zero overhead looping for implementation of FOR or DO loops. The function is controlled by three registers (PASR, PAER and BRCR) in registers 85 and the BRAF bit in the PMST. The Block Repeat Counter Register (BRCR) is loaded with a loop count of 0 to 65535. Then the RPTB (repeat block) instruction is executed, thus loading the Program Address Start Register (PASR) with the address of the instruction following the RPTB instruction and loading the Program Address End Register (PAER) with its long immediate operand. The long immediate operand is the address of the last instruction in the loop. The BRAF bit is automatically set active by the execution of the RPTB instruction so the loop starts. With each PC update, the PAER is compared to the PC. If they are equal the BRCR is decremented. If the BRCR is greater than or equal to zero, the PASR is loaded into the PC thus starting the loop over.

The equivalent to a WHILE loop can be implemented by setting the BRAF bit to zero if the exit condition is met. If this is done, the program completes the current pass through the loop but not go back to the top. The bit must be set at least three instructions before the end of the loop to exit the current loop. Block repeat loops can be exited and returned to without stopping and restarting the loop. Subroutine calls and branches and interrupts do not necessarily affect the loop. When program control is returned to the loop, the loop execution is resumed.

Loops can be nested by saving the three registers PASR, PAER and BRCR prior to entry of an internal loop and restoring them upon completion of the internal loop and resetting of the BRAF bit. Since it takes a total of 12 cycles to save (6 cycles) and restore (6 cycles) the block repeat registers, smaller internal loops can be processed with the BANZD looping method that take two extra cycles per loop (i.e., if the loop count is less than 6 it may be more efficient to use the BANZD technique).

When operating in the powerdown mode, the processor core enters a dormant state and dissipates considerably less power than the power normally dissipated by the device. Powerdown mode is invoked either by executing an IDLE instruction or by driving the HOLD- input low while the HM status bit is set to one.

While in powerdown mode, all of the internal contents of processor 13, 15 are maintained to allow operation to continue unaltered when powerdown mode is terminated. Powerdown mode, when initiated by an IDLE instruction, is terminated upon receipt of an interrupt. When powerdown mode is initiated via the HOLD- signal it is terminated when the HOLD- goes inactive.

The power requirements can be further lowered to the sub-milliamp range by slowing down or even stopping the input clock. RS- is suitably activated before stopping the clock and held active until the clock is stabilized when restarting the system. This brings the device back to a known state. The contents of most registers and all on-chip RAM remain unchanged. The exceptions include the registers modified by a device reset.

The Peripheral Logic Unit (PLU) 41 of FIG. 1B is used to directly set, clear, toggle or test multiple bits in a control/status register or any data memory location. The PLU provides a direct logic operation path to data memory values without affecting the contents of the accumulator or product register. It is used to set or clear multiple control bits in a register or to test multiple bits in a flag register.

The PLU 41 operates by fetching one operand via data bus 111D from data memory space, fetching the second from either long immediate on the program bus 101D or a DBMR (Dynamic Bit Manipulation Register) 223 via a MUX 225. The DBMR is previously loaded from data bus 111D. Then the PLU executes its logic operation, defined by the instruction on the two operands. Finally, the result is written via data bus 111D to the same data location that the first operand was fetched from.

The PLU allows the direct manipulation of bits in any location in data memory space. This direct bit-manipulation is done with by ANDing, ORing, XORing or loading a 16-bit long immediate value to a data location. For example, to initialize the CBCR (Circular Buffer Control Register) to use AR1 for circular buffer 1 and AR2 for circular buffer 2 but not enable the circular buffers, execute:

SPLK 021h, CBCR Store Peripheral Long Immediate To later enable circular buffers 1 and 2 execute:
OPLK 088h, CBCR Set bit 7 and bit 3 in CBCR Testing for individual bits in a specific register or data word is still done via the BIT instruction, however, a data word can be tested against a particular pattern with the CPLK (Compare Peripheral Long Immediate) instruction. If the data value is equal to the long immediate value, then the TC bit is set to one. If the result of any PLU instruction is zero then the TC bit is set.

The bit set, clear, and toggle functions can also be executed with a 16-bit dynamic register DBMR value instead of the long immediate value. This is done with the following three instructions: XPL (XOR DBMR register to data); OPL (OR DBMR register to data); and APL (AND DBMR Register to data).

The processor has sixteen external maskable user interrupts (INT16-INT1) available for external devices that interrupt the processor. Internal interrupts are generated by the serial port (RINT and XINT), by the timer (TINT), by parity checkers (PNTL and PNTH), and by the software interrupt (TRAP) instruction. Interrupts are prioritized with reset (RS-) having the highest priority and INT15 having the lowest priority.

An interrupt control block 231 feeds program data bus 101D. Vector locations and priorities for all internal and external interrupts are shown in Table A-5. The TRAP instruction, used for software interrupts, is not prioritized but is included here since it has its own vector location. Each interrupt address has been spaced apart by two locations so that branch instructions can be accommodated in those locations.

TABLE A-5

Interrupt Locations and Priorities

| NAME | LOCATION DEC | HEX | PRIORITY | FUNCTION |
|---|---|---|---|---|
| RS- | 0 | 0 | 1 (highest) | EXTERNAL RESET SIGNAL |
| INT1- | 2 | 2 | 3 | EXTERNAL USER INTERRUPT #1 |
| INT2- | 4 | 4 | 4 | EXTERNAL USER INTERRUPT #2 |
| INT3- | 6 | 6 | 5 | EXTERNAL USER INTERRUPT #3 |
| INT4- | 8 | 8 | 6 | EXTERNAL USER INTERRUPT #4 |
| INT5- | 10 | A | 7 | EXTERNAL USER INTERRUPT #5 |
| INT6- | 12 | C | 8 | EXTERNAL USER INTERRUPT #6 |
| INT7- | 14 | E | 9 | EXTERNAL USER INTERRUPT #7 |
| INT8- | 16 | 10 | 10 | EXTERNAL USER INTERRUPT #8 |
| INT9- | 18 | 12 | 11 | EXTERNAL USER INTERRUPT #9 |
| INT10- | 20 | 14 | 12 | EXTERNAL USER INTERRUPT #10 |
| INT11- | 22 | 16 | 13 | EXTERNAL USER INTERRUPT #11 |
| INT12- | 24 | 18 | 14 | EXTERNAL USER INTERRUPT #12 |
| INT13- | 26 | 1A | 15 | EXTERNAL USER INTERRUPT #13 |
| INT14- | 28 | 1C | 16 | EXTERNAL USER INTERRUPT #14 |
| INT15- | 30 | 1E | 17 | EXTERNAL USER INTERRUPT #13 |
| INT16- | 32 | 20 | 18 | EXTERNAL USER INTERRUPT #14 |
| TRAP | 34 | 22 | N/A | TRAP INSTRUCTION VECTOR |
| NMI | 36 | 24 | 2 | NON-MASKABLE INTERRUPT |

In FIG. 1B, a Bus Interface Module BIM 241 is connected between data bus 111D and program data bus 101D. BIM 241 on command permits data transfers between buses 101D and 111D and increases the architectural flexibility of the system compared to either the classic Harvard architecture or Von Neumann architecture.

Inventive systems including processing arrangements and component circuitry made possible by improvements to the processor 13, 15 are discussed next. For general purpose digital signal processing applications, these systems advantageously perform convolution, correlation, Hilbert transforms, Fast Fourier Transforms, adaptive filtering, windowing, and waveform generation. Further applications involving in some cases the general algorithms just listed are voice mail, speech vocoding, speech recognition, speaker verification, speech enhancement, speech synthesis and text-to-speech systems.

Instrumentation according to the invention provides improved spectrum analyzers, function generators, pattern matching systems, seismic processing systems, transient analysis systems, digital filters and phase lock loops for applications in which the invention is suitably utilized.

Automotive controls and systems according to the invention suitably provide engine control, vibration analysis, anti-skid braking control, adaptive ride control, voice commands, and automotive transmission control.

In the naval, aviation and military field, inventive systems are provided and improved according to the invention to provide global positioning systems, processor supported navigation systems, radar tracking systems, platform stabilizing systems, missile guidance systems, secure communications systems, radar processing and other processing systems.

Further systems according to the invention include computer disk drive motor controllers, printers, plotters, optical disk controllers, servomechanical control systems, robot control systems, laser printer controls and motor controls generally. Some of these control systems are applicable in the industrial environment as robotics controllers, auto assembly apparatus and inspection equipment, industrial drives, numeric controllers, computerized power tools, security access systems and power line monitors.

Telecommunications inventions contemplated according to the teachings and principles herein disclosed include echo cancellers, ADPCM transcoders, digital PBXs, line repeaters, channel multiplexers, modems, adaptive equalizers, DTMF encoders and DTMF decoders, data encryption apparatus, digital radio, cellular telephones, fax machines, loudspeaker telephones, digital speech interpolation (DSI) systems, packet switching systems, video conferencing systems and spread-spectrum communication systems.

In the graphic imaging area, further inventions based on the principles and devices and systems disclosed herein include optical character recognition apparatus, 3-D rotation apparatus, robot vision systems, image transmission and compression apparatus, pattern recognition systems, image enhancement equipment, homomorphic processing systems, workstations and animation systems and digital mapping systems.

Medical inventions further contemplated according to the present invention include hearing aids, patient monitoring apparatus, ultrasound equipment, diagnostic tools, automated prosthetics and fetal monitors, for example. Consumer products according to the invention include high definition television systems such as high definition television receivers and transmission equipment used at studios and television stations. Further consumer inventions include music synthesizers, solid state answering machines, radar detectors, power tools and toys and games.

It is emphasized that the system aspects of the invention contemplated herein provide advantages of improved system architecture, system performance, system reliability and economy.

Figure 2:
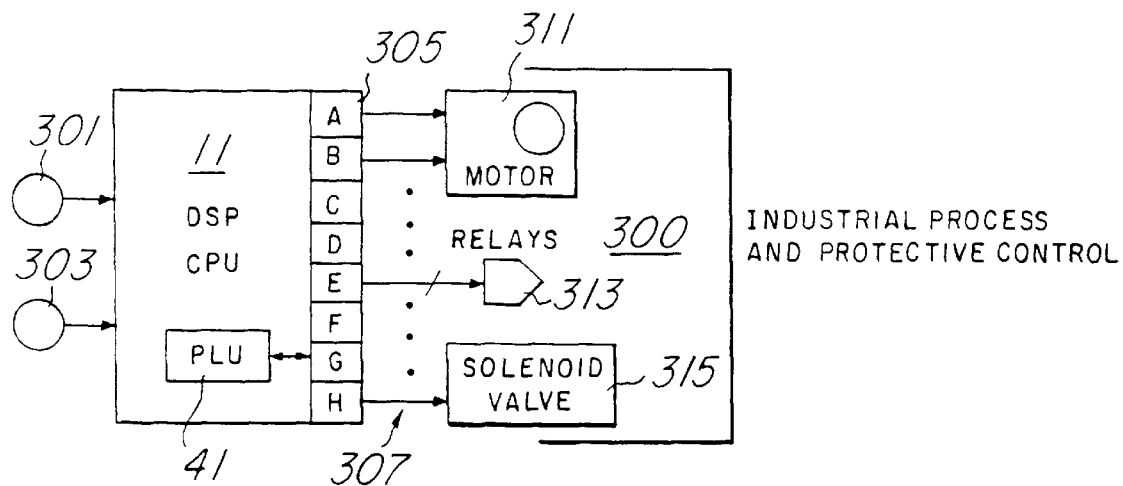
FIG. 2 is a block diagram of an improved industrial process and protective control system.

For example, in FIG. 2, an inventive industrial process and protective control system 300 according to the invention includes industrial sensors 301 and 303 for sensing physical variables pertinent to a particular industrial environment. Signals from the sensors 301 and 303 are provided to a signal processor device 11 of FIGS. 1A and 1B which include the PLU (parallel logic unit) improvement 41 of FIG. 1B. An interface 305 includes register locations A, B, C, D, E, F, G and H and drivers (not shown). The register locations are connected via the drivers and respective lines 307 to an industrial process device driven by a motor 311, relay operated apparatus controlled by relays 313 and various valves including a solenoid valve 315.

In the industrial process and protective control environment, various engineering and economic considerations operate at cross purposes. If the speed or throughput of the industrial process is to be high, heavy burdens are placed on the processing capacity of device 11 to interpret the significance of relatively rapid changes occurring in real time as sensed by sensors 301 and 303. On the other hand, the control functions required to respond to the real-world conditions sensed by sensors 301 and 303 must also be accomplished swiftly. Advantageously, the addition of PLU 41 resolves conflicting demands on device 11, with negligible additional costs when device 11 is fabricated to a single semiconductor chip. In this way, the industrial processing rate, the swiftness of protective control and the precision of control are considerably enhanced.

Figure 3:
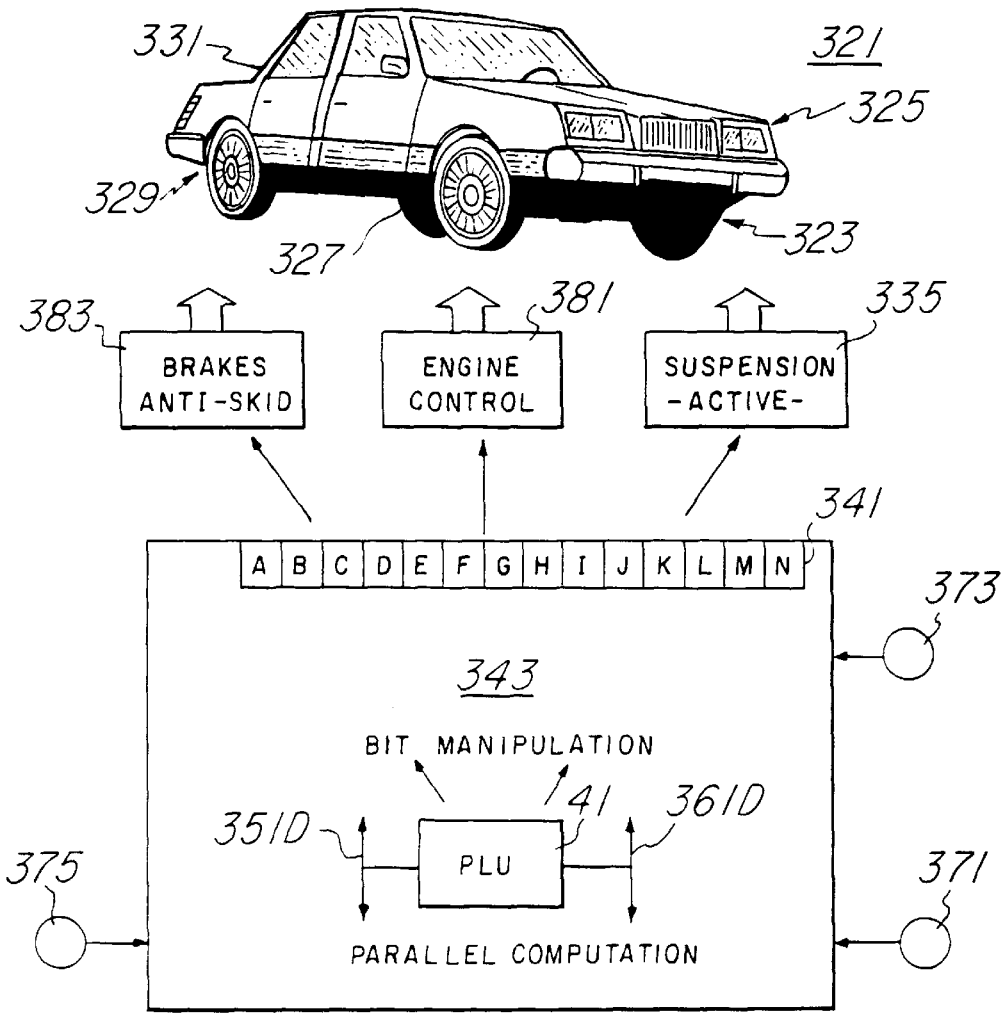
FIG. 3 is a partially pictorial, partially block electrical diagram of an improved automotive vehicle system.

In FIG. 3, an inventive automotive vehicle 321 includes a chassis 323 on which is mounted wheels and axles, an engine 325, suspension 327, and brakes 329. An automotive body 331 defines a passenger compartment which is advantageously provided with suspension relative to chassis 323.

An active suspension 335 augments spring and absorber suspension technique and is controlled via an interface 341 having locations for bits A, B, C, D, E, F, G, H, I, J, K, L, M and N. A parallel computation processor 343 utilizes computation units of the type disclosed in FIGS. 1A and 1B and includes at least one parallel logic unit 41 connected to data bus 351D and program data bus 361D. Numerous sensors include sensors 371, 373 and 375 which monitor the function of suspension 335, engine operation, and anti-skid braking respectively.

An engine control system 381 is connected to several of the locations of interface 341. Also an anti-skid braking control system 383 is connected to further bits of interface 341. Numerous considerations of automotive reliability, safety, passenger comfort, and economy place heavy demands on prior automotive vehicle systems.

In the invention of FIG. 3, automotive vehicle 321 is improved in any or all of these areas by virtue of the extremely flexible parallelism and control advantages of the invention.

The devices such as device 11 which are utilized in the systems of FIGS. 2 and 3 and further systems described herein not only address issues of increased device performance, but also solve industrial system problems which determine the user's overall system performance and cost.

A preferred embodiment device 11 executes an instruction in 50 nanoseconds and further improvements in semiconductor manufacture make possible even higher instruction rates. The on-chip program memory is RAM based and facilitates boot loading of a program from inexpensive external memory. Other versions are suitably ROM based for further cost reduction.

Figure 4:
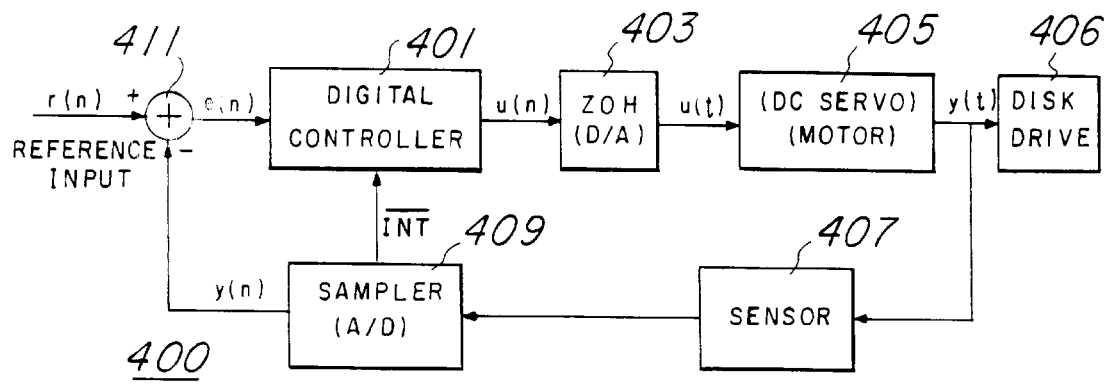
FIG. 4 is an electrical block diagram of an improved motor control system.

An inventive digitally controlled motor system 400 of FIG. 4 includes a digital controller 401 having a device 11 of FIGS. 1A and 1B. Digital controller 401 supplies an output u(n) to a zero order hold circuit ZOH 403. ZOH 403 supplies control output u(t) to a DC servomotor 405 in industrial machinery, home appliances, military equipment or other application systems environment. Connection of motor 405 to a disk drive 406 is shown in FIG. 4.

The operational response of servomotor 405 to the input u(t) is designated y(t). A sensor 407 is a transducer for the motor output y(t) and feeds a sampler 409 which in its turn supplies a sampled digitized output y(n) to a subtractor 411. Sampler 409 also signals digital controller 401 via an interrupt line INT-. A reference input r(n) from human or automated supervisory control is externally supplied as a further input to the subtracter 411. An error difference e(n) is then fed to the digital controller 401 to close the loop. Device 11 endows controller 401 with high loop bandwidth and multiple functionality for processing and control of other elements besides servomotors as in FIG. 2. Zero-overhead interrupt context switching in device 11 additionally enhances the bandwidth and provides an attractive alternative to polling architecture.

Figure 5:
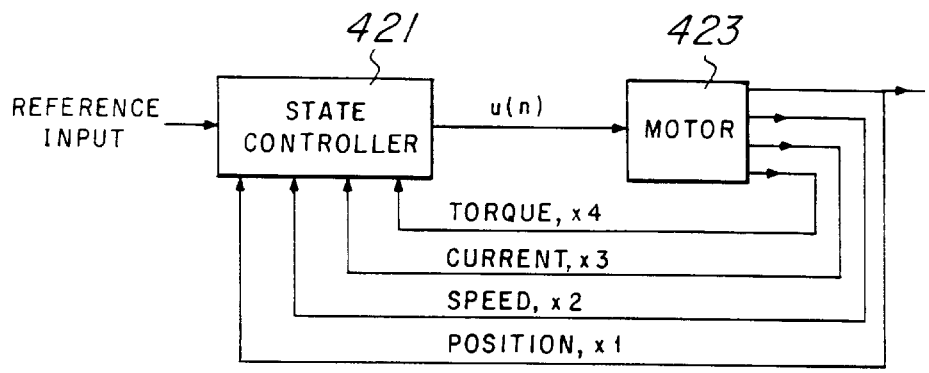
FIG. 5 is an electrical block diagram of another improved motor control system.

In FIG. 5, a multi-variable state controller 421 executes advanced algorithms utilizing the device 11 processor. State controller 421 receives a reference input r(n) and supplies an output u(n) to a motor 423. Multiple electrical variables (position x1, speed x2, current x3 and torque x4) are fed back to the state controller 421. Any one or more of the four variables x1–x4 (in linear combination for example) are suitably controlled for various operational purposes. The system can operate controlled velocity or controlled torque applications, and run stepper motors and reversible motors.

Figure 6:
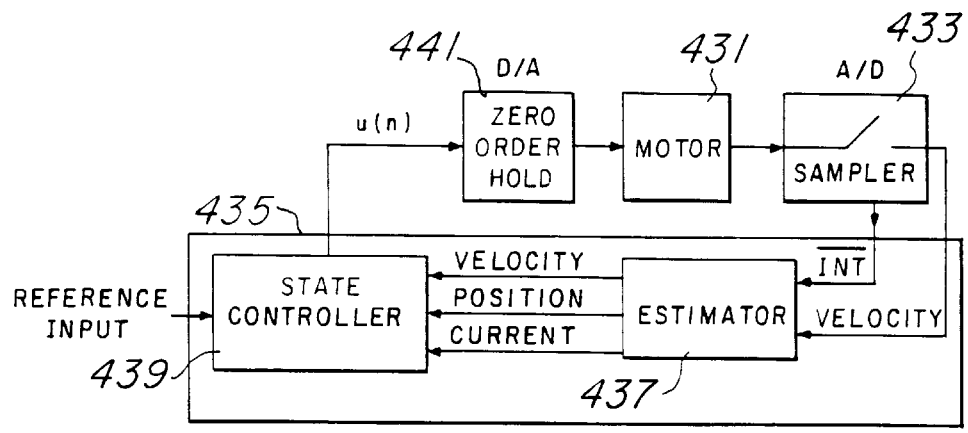
FIG. 6 is an electrical block diagram of yet another improved motor control system.

In FIG. 6, a motor 431 has its operation sensed and sampled by a sampler 433. A processor 435 including device 11 is interrupt driven by sampler 433. Velocity information determined by unit 433 is fed back to processor 435 improved as described in connection with FIGS. 1A and 1B. Software in program memory 61 of FIG. 1A is executed as estimation algorithm process 437. Process 437 provides velocity, position and current information to state controller process 439 of processor 435. A digital output u(n) is supplied as output from state controller 439 to a zero order hold circuit 441 that in turn drives motor 431.

The motor is suitably a brushless DC motor with solid state electronic switches associated with core, coils and rotor in block 431. The systems of FIGS. 4–6 accommodate shaft encoders, optical and Hall effect rotor position sensing and back emf (counter electromotive force) sensing of position from windings.

Figure 7:
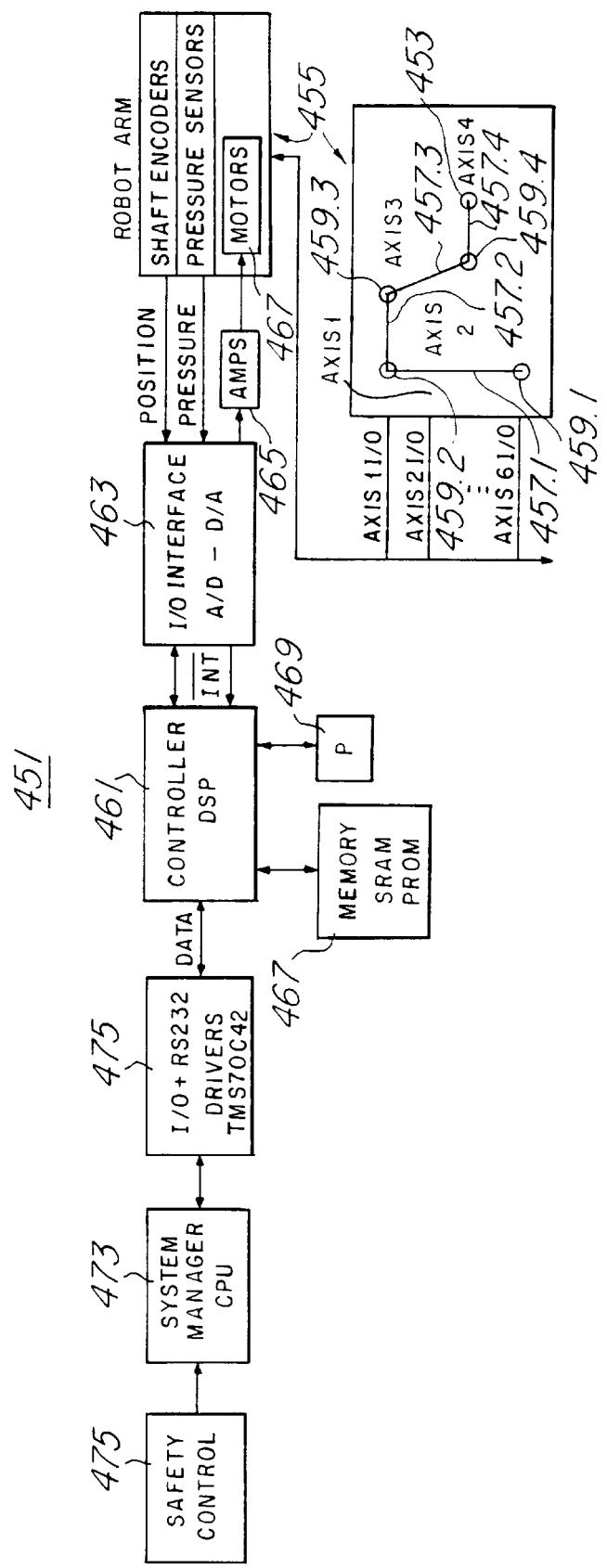
FIG. 7 is an electrical block diagram of an improved robotic control system.

In FIG. 7, robot control system 451 has a motor-driven grasping mechanism 453 at the end of a robot arm 455. Robot arm 455 has a structure with axes of rotation 457.1, 457.2, 457.3 and 457.4 Sensors and high response accurately controllable motors are located on arm 455 at articulation points 459.1, 459.2, 459.3 and 459.4.

Numerous such motors and sensors are desirably provided for accurate positioning and utilization of robot arm mechanism 455. However, the numerous sensors and motors place conflicting demands on the system as a whole and on a controller 461. Controller 461 resolves these system demands by inclusion of device 11 of FIGS. 1A and 1B and interrupt-driven architecture of system 451. Controller 461 intercommunicates with an I/O interface 463 which provides analog-to-digital and digital-to-analog conversion as well as bit manipulation by parallel logic unit 41 for the robot arm 455. The interface 463 receives position and pressure responses from the navigation motors 467 and sensors associated with robot arm 455 and grasping mechanism 453. Interfacer 463 also supplies control commands through servo amplifiers 465 to the respective motors 467 of robot arm 455.

Controller 461 has associated memory 467 with static RAM (SRAM) and programmable read only memory (PROM). Slower peripherals 469 are associated with controller 471 and they are efficiently accommodated by the page boundary sensitive wait state features of controller 461. The controller 461 is also responsive to higher level commands supplied to it by a system manager CPU 473 which is responsive to safety control apparatus 475. System manager 473 communicates with controller 461 via I/O and RS 232 drivers 475.

The digital control systems according to the invention make possible performance advantages of precision, speed and economy of control not previously available. For another example, disk drives include information storage disks spun at high speed by spindle motor units. Additional controls called actuators align read and write head elements relative to the information storage disks.

The preferred embodiment can even provide a single chip solution for both actuator control and spindle motor control as well as system processing and diagnostic operations. Sophisticated functions are accommodated without excessively burdening controller 461. A digital notch filter can be implemented in controller 461 to cancel mechanical resonances. A state estimator can estimate velocity and current. A Kalman filter reduces sensor noise. Adaptive control compensates for temperature variations and mechanical variations. Device 11 also provides on-chip PWM pulse width modulation outputs for spindle motor speed control. Analogous functions in tape drives, printers, plotters and optical disk systems are readily accommodated. The inventive digital controls provide higher speed, more precise speed control, and faster data access generally in I/O technology at comparable costs, thus advancing the state of the art.

In missile guidance systems, the enhanced operational capabilities of the invention provide more accurate guidance of missile systems, thereby reducing the number of expensive missiles required to achieve operational objectives. Furthermore, equivalent performance can be attained with fewer processor chips, thus reducing weight and allowing augmented features and payload enhancements.

Figure 8:
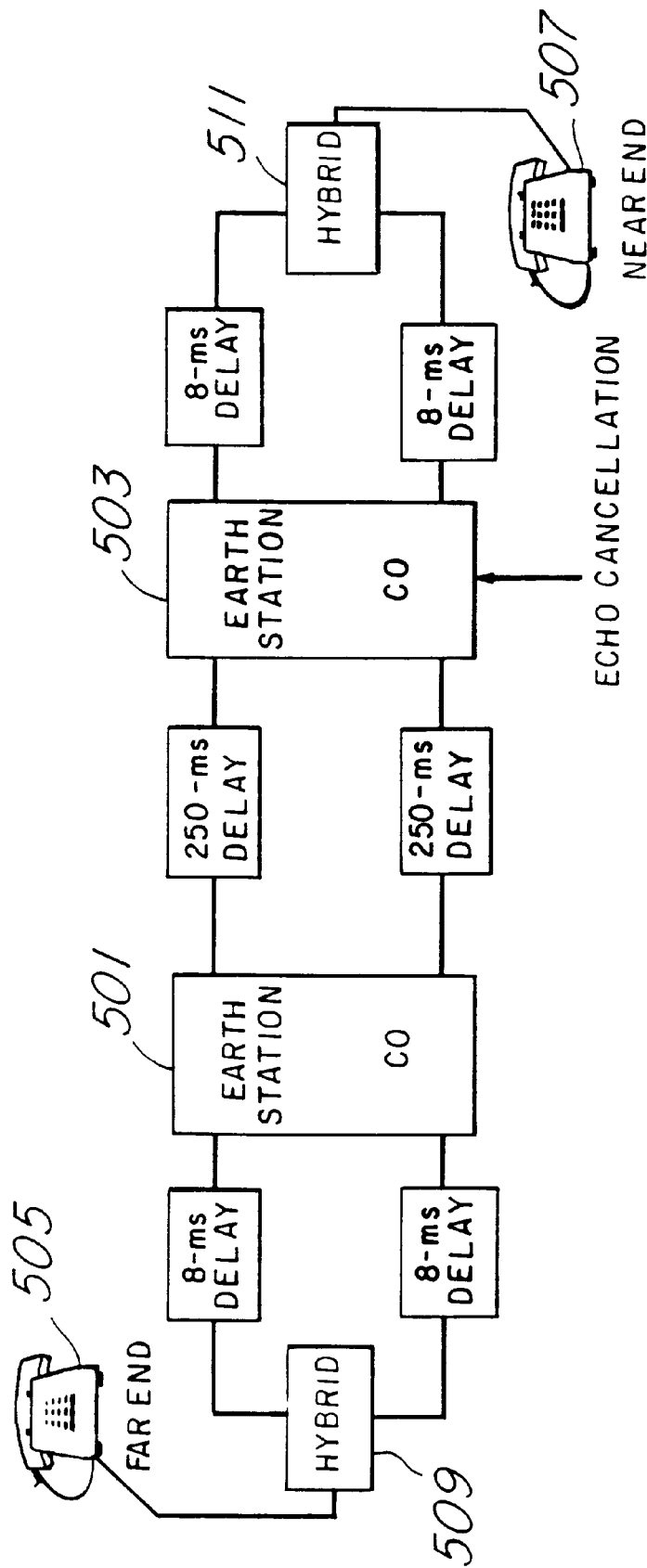
FIG. 8 is an electrical block diagram of an improved satellite telecommunications system.

In FIG. 8, a satellite telecommunication system according to the invention has first stations 501 and 503 communicating by a satellite transmission path having a delay of 250 milliseconds. A far end telephone 505 and a near end telephone 507 are respectively connected to earth stations 501 and 503 by hybrids 509 and 511. Hybrids 509 and 511 are delayed eight milliseconds relative to the respective earth stations 501 and 503. Accordingly, echo cancellation is necessary to provide satisfactory telecommunications between far end telephone 505 and near end telephone 507. Moreover, the capability to service numerous telephone conversation circuits at once is necessary. This places an extreme processing burden on telecommunications equipment.

Figure 9:
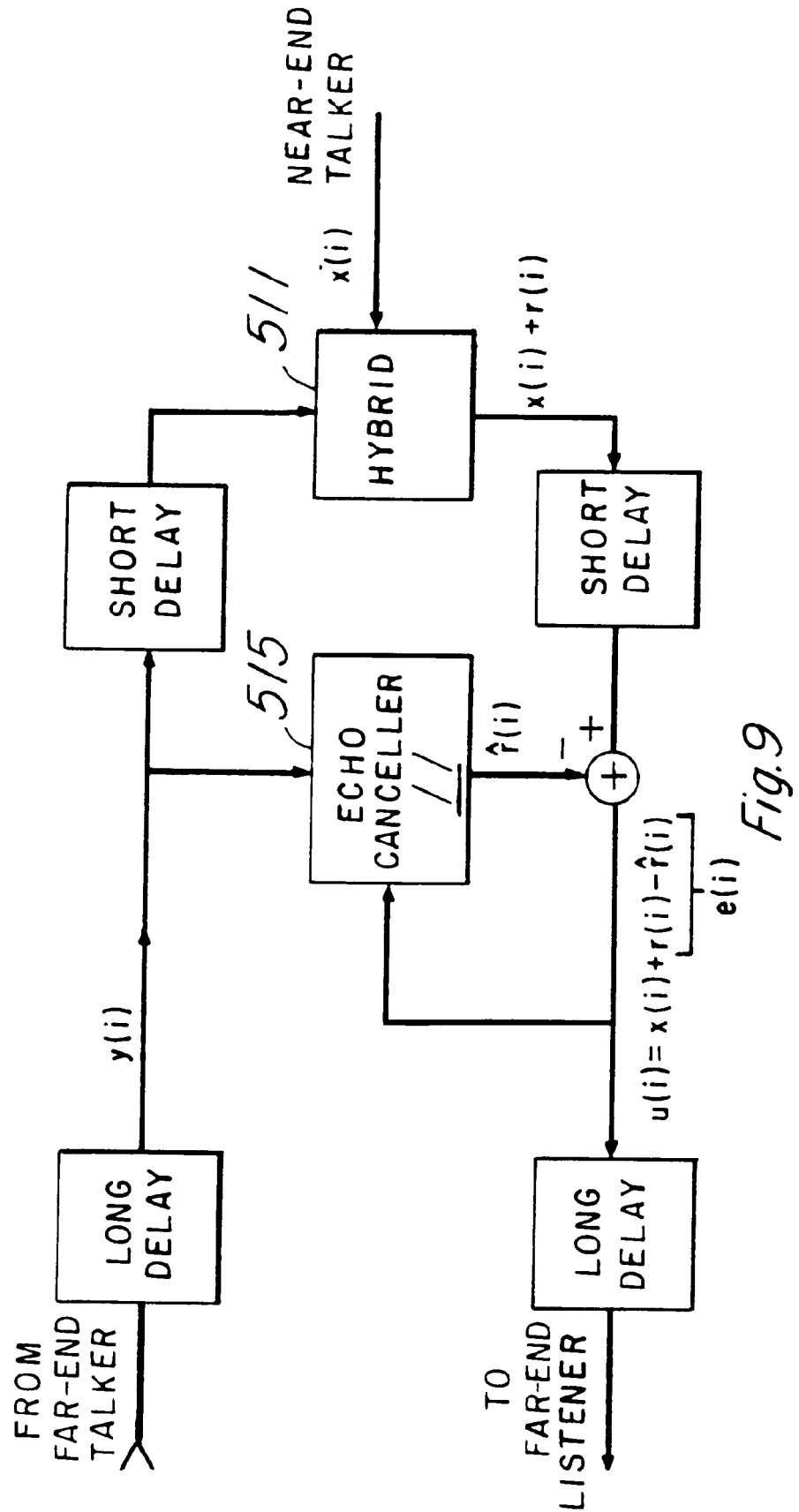
FIG. 9 is an electrical block diagram of an improved echo cancelling system for the system of FIG. 8.

In FIG. 9, a preferreed embodiment echo canceller 515 is associated with each hybrid such as 511 to improve the transmission of the communications circuit. Not only does device 11 execute echo cancelling algorithms at high speed, but it also economically services more satellite communications circuits per chip.

Figure 10:
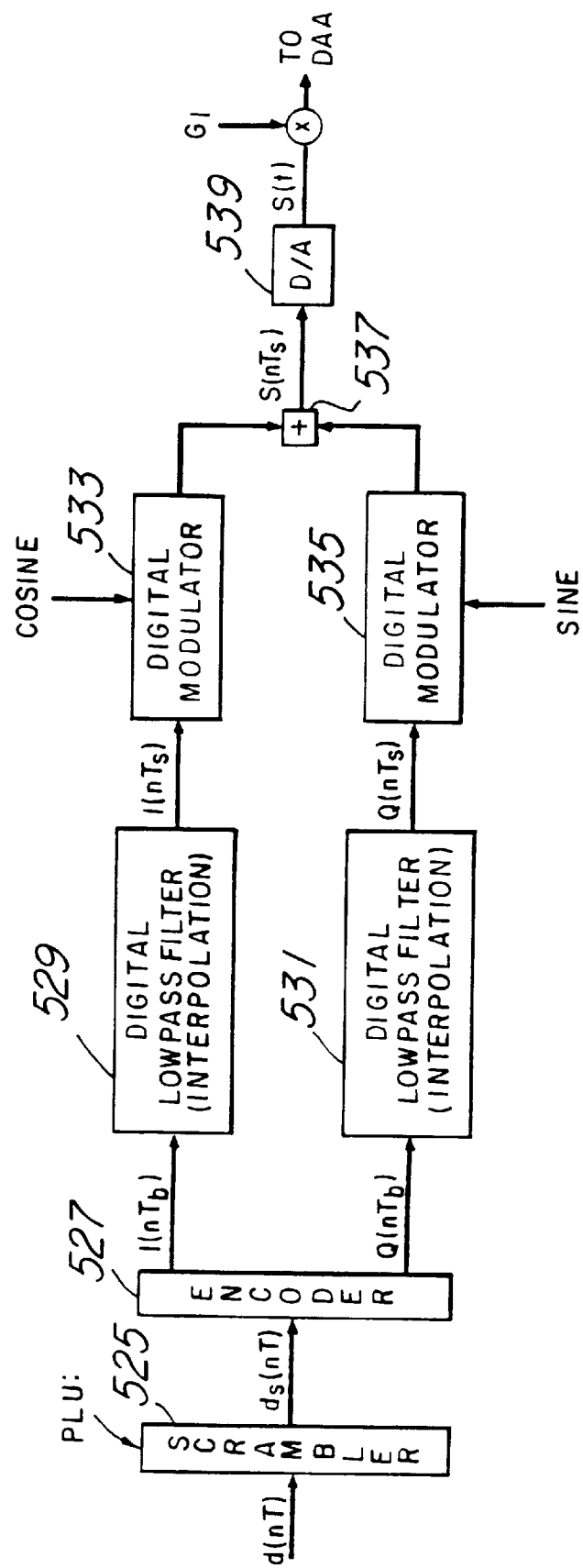
FIG. 10 is an electrical block diagram of an improved mode transmitter.

Another system embodiment is an improved modem. In FIG. 10, a process diagram of operations in device 11 programmed as a modem transmitter includes a scrambling step 525 followed by an encoding step 527 which provides quadrature digital signals I[$nT_b$] and Q[$nT_b$] to interpolation procedures 529 and 531 respectively. Digital modulator computations 533 and 535 multiply the interpolated quadrature signals with prestored constants from read only memory (ROM) that provide trigonometric cosine and sine values respectively. The modulated signals are then summed in a summing step 537. A D/A converter connected to device 11 converts the modulated signals from digital to analog form in a step 539. Gain control by a factor G1 is then performed in modem transmission and sent to a DAA.

In FIG. 11, a modem receiver using another device 11 receives analog communications signals from the DAA. An analog-to-digital converter A/D 521 digitizes the information for a digital signal processor employing device 11. High rates or digital conversion place heavy burdens on input processing of prior processors. Advantageously, DSP 11 provides zero-overhead interrupt context switching for extremely efficient servicing of interrupts from digitizing elements such as A/D 521 and at the same time has powerful digital signal processing coputational facility for executing modem algorithms. The output of device 11 is supplied to a universal synchronous asynchronous receiver transmitter (USART) 523 which supplies an output D[nT].

In FIG. 12, a process diagram of modem reception by the system of FIG. 11 involves automatic gain control by factor G2 upon reception from the DAA supplying a signal s(t) for analog-to-digital conversion at a sampling frequency fs. The digitized signal is s[nTs] and is supplied for digital processing involving first and second bandpass filters implemented by digital filtering steps BPF1 and BPF2 followed by individualized automatic gain control. A demodulation algorithm produces two demodulated signals I'[nTs] and Q'[nTs]. These two signals I' and Q' used for carrier recovery fed back to the demodulation algrithm. Also I' and Q' are supplied to a decision algorithm and operated in response to clock recovery. A decoding process 551 follows the decision algorithm. Decoding 551 is followed by a descrambling algorithm 555 that involves intensive bit manipulation by PLU 41 to recover the input signal d[nT].

As shown in FIG. 12, the numerous steps of the modem reception algorithm are advantageously accomplished by a single digital signal processor device 11 by virtue of the intensive numerical computation capabilities and the bit manipulation provided by PLU 41.

Figure 13:
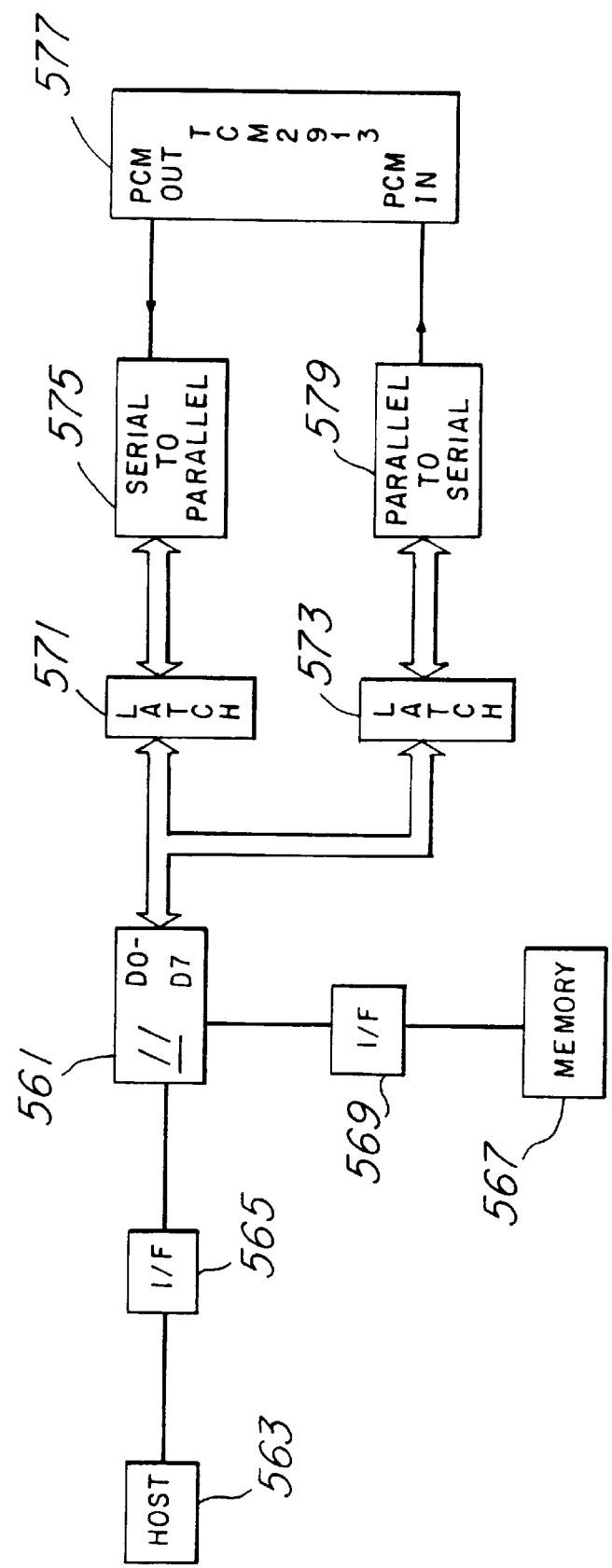
FIG. 13 is an electrical block diagram of an improved system including a host computer and a digital signal processor connected for PCM (pulse code modulation) communications.

In FIG. 13, computing apparatus 561 incorporating device 11 cooperates with a host computer 563 via an interface 565. High capacity outboard memory 567 is interfaced to computer 561 by interface 569. The computer 561 advantageously supports two-way pulse code modulated (PCM) communication via peripheral latches 571 and 573. Latch 571 is coupled to a serial to parallel converter 575 for reception of PCM communications from external apparatus 577. Computer 561 communicates via latch 573 and a parallel to serial unit 579 to supply a serial PCM data stream to the external apparatus 577.

Figure 14:
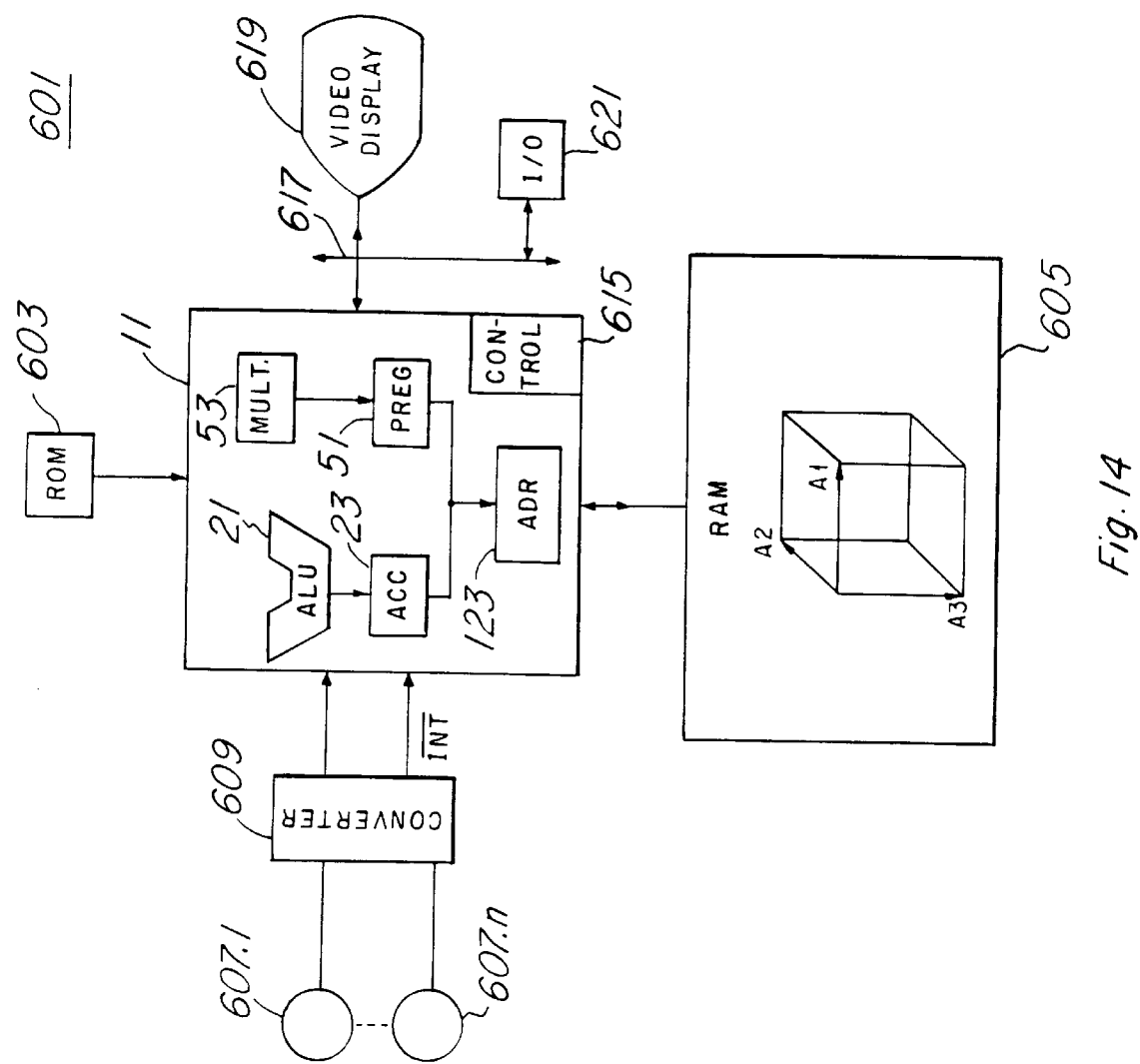
FIG. 14 is an electrical block diagram of an improved video imaging system with multidimensional array processing.

In FIG. 14, a video imaging system 601 includes device 11 supported by ROM 603 and RAM 605. Data gathering sensors 607.1 through 607.n feed inputs to a converter 609 which then supplies voluminous digital data to device 11. FIG. 14 highlights ALU 21 accumulator 23, multiplier array 53, product register 51 and has an addressing unit including ARAU 123. A control element 615 generally represents decoder PLA 221 and pipeline controller 225 of FIG. 1A. On-chip I/O peripherals (not shown) communicate with a bus 617 supplying extraordinarily high quality output to a video display unit 619. Supervisory input and output I/O 621 is also provided to device 11.

Owing to the advanced addressing capabilities in device 11, control 615 is operable on command for transferring the product from product register 51 directly to the addressing circuit 123 and bypassing any memory locations during the transfer. Because of the memory mapping, any pair of the computational core-registers of FIGS. 1A and 1B are advantageously accessed to accomplish memory-bypass transfers therebetween via data bus 111D, regardless of arrow directions to registers on those Figures. Because the multiplication capabilities of device 11 are utilized in the addressing function, the circuitry establishes an array in the electronic memory 605 wherein the array has entries accessible in the memory with a dimensionality of at least three. The video display 619 displays the output resulting from multi-dimensional array processing by device 11. It is to be understood, of course, that the memory 605 is not in and of itself necessarily multi-dimensional, but that the addressing is rapidly performed by device 11 so that information is accessible on demand as if it were directly accessible by variables respectively representing multiple array dimensions. For example, a three dimensional cubic array having address dimensions A1, A2 and A3 can suitably be addressed according to the equation $N^2 \times A3 + N \times A2 + A1$. In a two dimensional array, simple repeated addition according to an index count from register 199 of FIG. 1A is sufficient for addressing purposes. However, to accommodate the third and higher dimensions, the process is considerably expedited by introducing the product capabilities of the multiplier 53.

Figure 15:
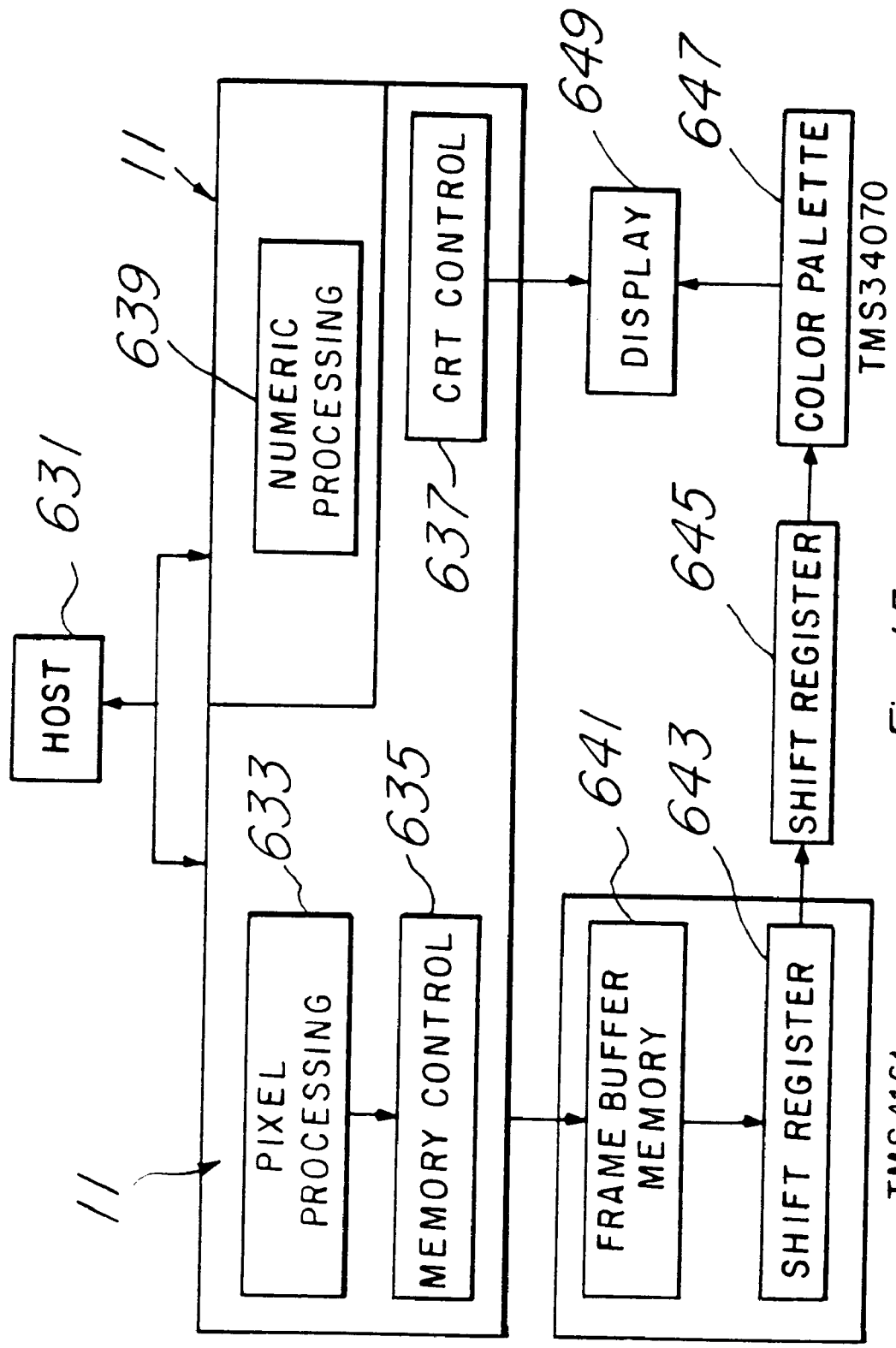
FIG. 15 is an electrical block diagram equally representative of hardware blocks or process blocks for improved graphics, image and video processing.
Figure 16:
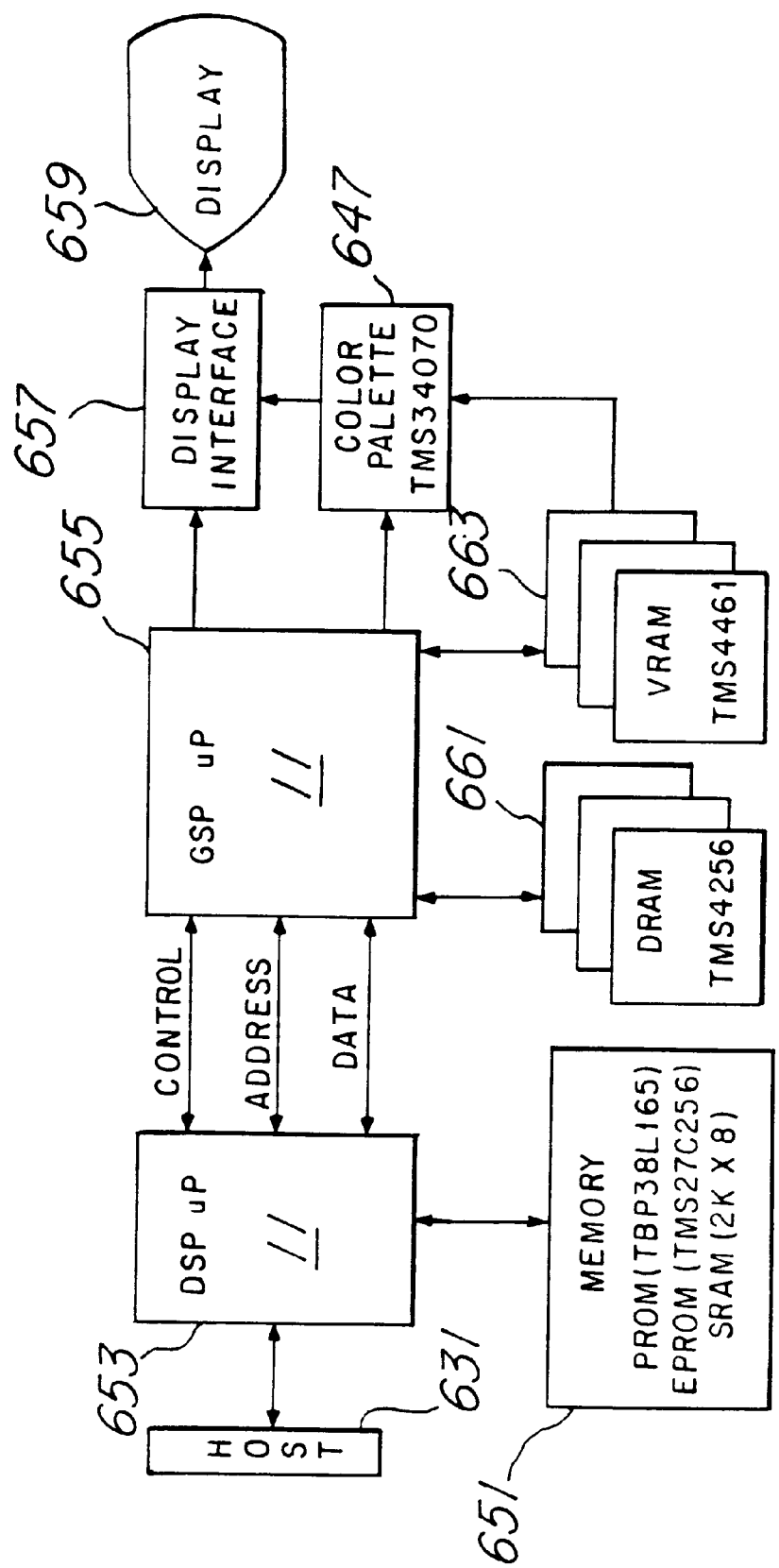
FIG. 16 is an electrical block diagram of a system for improved graphics, image and video processing.

FIGS. 15 and 16 respectively show function-oriented and hardware block-oriented diagrams of video processing systems according to the invention. Applications for these inventive systems provide new workstations, computer interfaces, television products and high definition television (HDTV) products.

In FIG. 15, a host computer 631 provides data input to numeric processing by device 11. Video pixel processing operations 633 are followed by memory control operations 635. CRT control functions 637 for the video display are coordinated with the numeric processing 639, pixel processing 633 and memory control 635. The output from memory control 635 operations supplies frame buffer memory 641 and then a shift register 643. Frame buffer memory and shift register 641 and 643 are suitably implemented by a Texas Instruments device TMS 4161. A further shift register 645 supplies video information from shift register 643 to a color palette 647. Color palette 647 drives a display 649 which is controlled by CRT control 637. The color palette 647 is suitably a TMS 34070.

In FIG. 16, the host 631 supplies signals to a first device 11 operating as a DSP microprocessor 653. DSP 653 is supported by memory 651 including PROM, EPROM and SRAM static memory. Control, address and data information are supplied by two-way communication paths between DSP 653 and a second device 11 operating as a GSP (graphics signal processor) 655. GSP 655 drives both color palette 647 and display interface 657. Interface 657 is further driven by color palette 647. Display CRT 659 is driven by display interface 657. It is to be understood that the devices 11 and the system of FIG. 16 in general is operated at an appropriate clock rate suitable to the functions required. Device 11 is fabricated in micron level and sub-micron embodiments to support processing speeds needed for particular applications. It is contemplated that the demands of high definition television apparatus for increased processing power be met not only by use of higher clock rates but also by the structural improvements of the circuitry disclosed herein.

Figure 17:
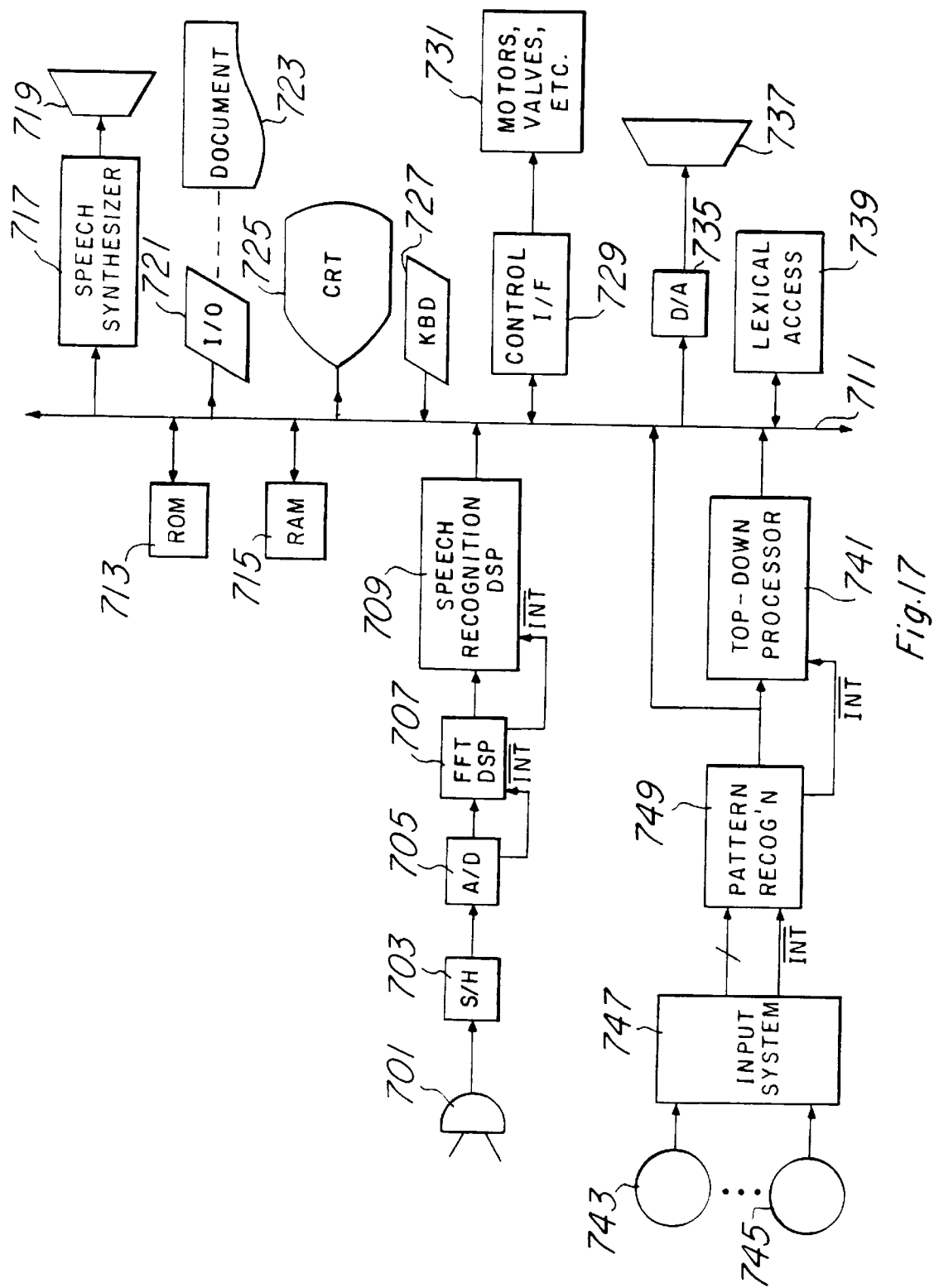
FIG. 17 is an electrical block diagram of an improved automatic speech recognition system.

In FIG. 17, an automatic speech recognition system according to the invention has a microphone 701, the output of which is sampled by a sample-and-hold (S/H) circuit 703 and then digitally converted by A/D circuit 705. An interrupt-driven fast Fourier transform processor 707 utilizes device 11 and converts the sampled time domain input from microphone 701 into a digital output representative of a frequency spectrum of the sound. This processor 707 is very efficient partly due to the zero-overhead interrupt context switching feature, conditional instructions and auxiliary address registers mapped into memory address space as discussed earlier.

Processor 707 provides each spectrum to a speech recognition DSP 709 incorporating a further device 11. Recognition DSP 709 executes any appropriately now known or later developed speech recognition algorithm. For example, in a template matching algorithm, numerous computations involving multiplications, additions and maximum or minimum determinations are executed. The device 11 is ideally suited to rapid execution of such algorithms by virtue of its series maximum/minimum function architecture. Recognition DSP 709 supplies an output to a system bus 711. ROM 713 and RAM 715 support the system efficiently because of the software wait states on page boundaries provided by recognition DSP 709. Output from a speech synthesizer 717 that is responsive to speech recognition DSP 709 is supplied to a loudspeaker or other appropriate transducer 719.

System I/O 721 downloads to document production devices 723 such as printers, tapes, hard disks and the like. A video cathode ray tube (CRT) display 725 is fed from bus 711 as described in connection with FIGS. 15 and 16. A keyboard 727 provides occasional human supervisory input to bus 711. In industrial and other process control applications of speech recognition, a control interface 729 with a further device 11 is connected to bus 711 and in turn supplies outputs for motors, valves and other servomechanical elements 731 in accordance with bit manipulation and the principles and description of FIGS. 2, 3, 4, 5, 6 and 7 hereinabove.

In speech recognition-based digital filter hearing aids, transformed speech from recognition DSP 709 is converted from digital to analog form by a D/A converter 735 and output through a loudspeaker 737. The same chain of blocks 701, 703, 705, 707, 709, 735, 737 is also applicable in telecommunications for speech recognition-based equalization, filtering and bandwidth compression.

In advanced speech processing systems, a lexical access processor 739 performs symbolic manipulations on phonetic element representations derived from the output of speech recognition DSP 709 and formulates syllables, words and sentences according to any suitable lexical access algorithm.

A top-down processor 741 performs a top-down processing algorithm based on the principle that a resolution of ambiguities in speech transcends the information contained in the acoustic input in some cases. Accordingly, non-acoustic sensors, such as an optical sensor 743 and a pressure sensor 745 are fed to an input system 747 which then interrupt-drives pattern recognition processor 749. Processor 749 directly feeds system bus 711 and also accesses top-down processor 741 for enhanced speech recognition, pattern recognition, and artificial intelligence applications.

Device 11 substantially enhances the capabilities of processing at every level of the speech recognition apparatus of FIG. 17, e.g., blocks 707, 709, 717, 721, 725, 729, 739, 741, 747 and 749.

Figure 18:
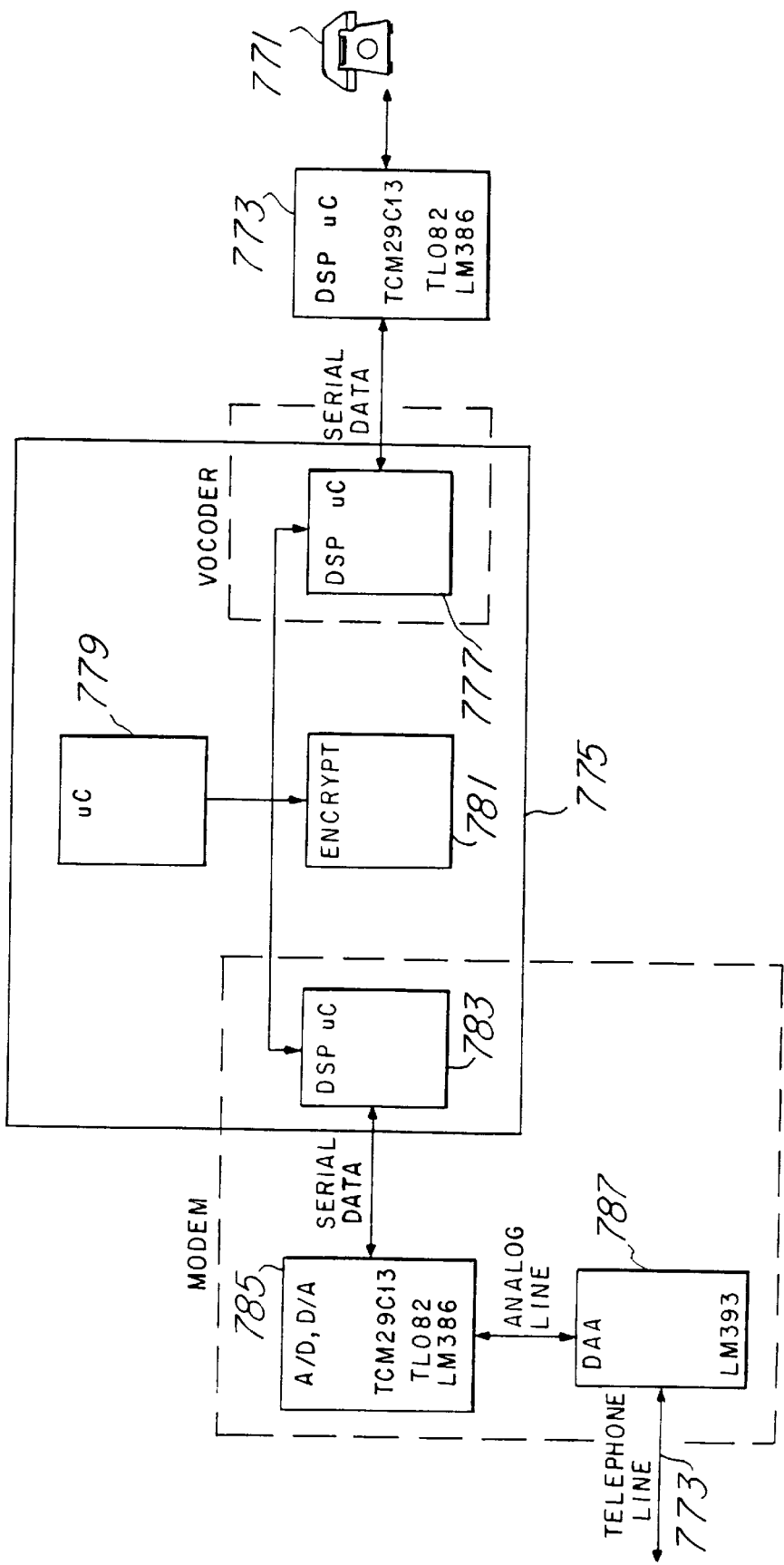
FIG. 18 is an electrical block diagram of an improved vocoder-modem system with encryption.

FIG. 18 shows a vocoder-modem system with encryption for secure communications. A telephone 771 communicates in secure mode over a telephone line 773. A DSP microcomputer 773 is connected to telephone 771 for providing serial data to a block 775. Block 775 performs digitizing vocoder functions in a section 777, and encryption processing in block 781. Modem algorithm processing in blocks 779 and 783 is described hereinabove in connection with FIGS. 10 and 12. Block 783 supplies and receives serial data to and from A/D, D/A unit 785. Unit 785 provides analog communication to DAA 787. The substantially enhanced processing features of device 11 of FIGS. 1A and 1B make possible a reduction in the number of chips required in block 775 so a cost reduction is made possible in apparatus according to FIG. 18. In some embodiments, more advanced encryption procedures are readily executed by the remarkable processing power of device 11. Accordingly, in FIG. 18, device 11 is used either to enhance the functionality of each of the functional blocks or to provide comparable functionality with fewer chips and thus less overall product cost.

Three Texas Instruments DSPs are described in the TMS 320C1x User's Guide and TMS 320C2x User's Guide and Third Generation TMS 320 User's Guide, all of which are incorporated herein by reference. Also, coassigned U.S. Pat. Nos. 4,577,282 and 4,713,748 are incorporated herein by reference.

FIG. 19 illustrates the operations of the parallel logic unit 41 of FIG. 1B. The parallel logic unit (PLU) allows the CPU to execute logical operations directly on values stored in memory without affecting any of the registers such as the accumulator in the computation unit 15. The logical operations include setting, clearing or toggling any number of bits in a single instruction. In the preferred embodiment, the PLU accomplishes a read-modify-write instruction in two instruction cycles. Specifically, PLU 41 accesses a location in RAM 25 either on-chip or off-chip, performs a bit manipulation operation on it, and then returns the result to the location in RAM from which the data was obtained. In all of these operations, the accumulator is not affected. The product register is not affected. The accumulator buffer and product register register buffers ACCB and BPR are not affected. Accordingly, time consuming operations which would substantially slow down the computation unit 15 are avoided by the provision of this important parallel logic unit PLU 41. Structurally, the PLU is straight-through logic from its inputs to its outputs which is controlled by decoder PLA 221, enabling and disabling particular gates inside the logic of the PLU 41 in order to accomplish the instructions which are shown below.

| | |
|---|---|
| APL,K | and the DBMR or a constant with data memory value |
| CPL,K | Compare DBMR or constant with data memory value |
| OPL,K | or DBMR or a constant with data memory value |
| SPLK,K | store long immediate to data memory location |
| XPL,K | XOR DBMR or a constant with data memory value |

Bit manipulation includes operations of: 1) set a bit; 2) clear a bit; 3) toggle a bit; and 4) test a bit and branch accordingly. The PLU also supports these bit manipulation operations without affecting the contents of any of the CPU registers or status bits. The PLU also executes logic operations on data memory locations with long immediate values.

In FIG. 19, Part A shows a memory location having an arbitrary number of bits X. In Part B, the SPLK instruction allows any number of bits in a memory word to be written into any memory location. In Part C, the OPL instruction allows any number of bits in a memory word to be set to one without affecting the other bits in the word. In Part D, the APL instruction allows any number of bits in a memory word to be cleared or set to zero, without affecting the other bits in the word. In Part E, the XPL instruction allows any number of bits in a memory word to be toggled without affecting the other bits in the word. In Part F, the CPL instruction compares a given word (e.g., 16 bits) against the contents of an addressed memory location without modifying the addressed memory location. The compare function can also be regarded as a non-destructive exclusive OR (XOR) for a compare on a particular memory location. If the comparison indicates that the given word is equal to the addressed memory word, then a TC bit is set to one. The TC bit is bit 11 of the ST1 register in the registers 85 of FIG. 1B. A test of an individual bit is performed by the BIT and BITT instructions.

Structurally, the presence of PLU instructions means that decoder PLA 221 of FIG. 1A and the logic of PLU 41 include specific circuitry. When the various PLU instructions are loaded into the instruction register (IR), they are decoded by decoder PLA 221 into signals to enable and disable gates in the logic of PLU 41 so that the operations which the instructions direct are actually executed.

To support the dynamic placement of bit patterns, the instructions execute basic bit operations on a memory word with reference to the register value in the dynamic bit manipulation register DBMR 223 instead of using a long immediate value. The DBMR is memory mapped, meaning structurally that there is decoding circuitry 121 (FIG. 1B) which allows addressing of the DBMR 223 from data address bus 111A. A suffix K is appended to the instruction (e.g. APLK) to indicate that the instruction operates on a long immediate instead of DBMR. Absence of the suffix (e.g. APL) indicates that the instruction operates on the DBMR. Selection of the DBMR is accomplished by MUX 225 of FIG. 1B which has its select input controlled from decoder PLA 221 with pipeline timing controlled by pipeline controller 225.

A long immediate is a value coming from the program data bus as part of an instruction. "Immediate" signifies that the value is coming in from the program data bus. "Long immediate" means that a full word-wide value is being supplied.

A long immediate often is obtained from read-only memory (ROM) and thus is not alterable. However, when it is desired to have the logical operation be alterable in an instruction sequence, the dynamic bit manipulation bit register is provided for that purpose.

PLU 41 allows parallel bit manipulation on any location in data memory space. This permits very high efficiency bit manipulation which accommodates the intensive bit manipulation requirements of the control field. Bit manipulation of the invention is readily applicable to automotive control such as engine control, suspension control, anti-skid braking, and process control, among other applications. Bit manipulations can switch on and off at relay by setting a bit on or off, turn on an engine, speed up an engine, close solenoids and intensify a signal by stepping a gain stage to a motor in servo control. Complicated arithmetic operations which are needed for advanced microcontrol applications execute on device 11 without competition by bit manipulation operations.

Further applications of bit manipulation include scrambling in modems. If certain bit patterns fail to supply frequency or phase changes often enough in the modem, it is difficult or impossible to maintain a carrier in phase clock loops and modem receivers. The bit patterns are scrambled to force the bits to change frequently enough. In this way, the baud clock and carrier phase lock loop in the modem are configured so that there is adequate but not excessive energy in each of the digital filters. Scrambling involves XORing operations to a serial bit stream. The PLU 41 does this operation extremely efficiently. Since the other CPU registers of device 11 are not involved in the PLU operations, these registers need not be saved when the PLU is going to execute its instructions. In the case of the scrambling operation, the bits that are XORed into data patterns are a function of other bits so it takes more than one operation to actually execute the XORs that are required in any given baud period. With the parallel logic unit, these operations can be performed concurrently with computatioal operations without having to use the register resources.

As thus described, the PLU together with instruction decoder 221 act as an example of a logic circuit, connected to the program bus for receiving instructions and connected to the data bus, for executing logic operations in accordance with at least some of the instructions. The logic operations affect at least one of the data memory locations independently of the electronic computation unit without affecting the accumulator. In some of the instructions, the logic operations include an operation of setting, clearing or toggling particular bits to one in a data word at a selected data memory location without affecting other bits in the data word at the selected data memory location.

With the DBMR 223, a further logic circuit improvement is provided so that PLU 41 has a first input connected for receiving data from the data bus, an output for sending data to the data bus and a second input selectively operable to receive a word either from the data bus or program bus. The multiplexer 225 acts as a selectively operable element. For example, the contents of any addressable register or memory location can be stored to the DBMR. When MUX 275 selects the DBMR, then the PLU sends to data bus 111D the contents of a word from data bus 111D modified by a logical operation based on the DBMR such as setting, clearing or toggling. When MUX 225 selects program data bus 111D, a long immediate constant is selected, on which to base the logical operation.

Figure 20:
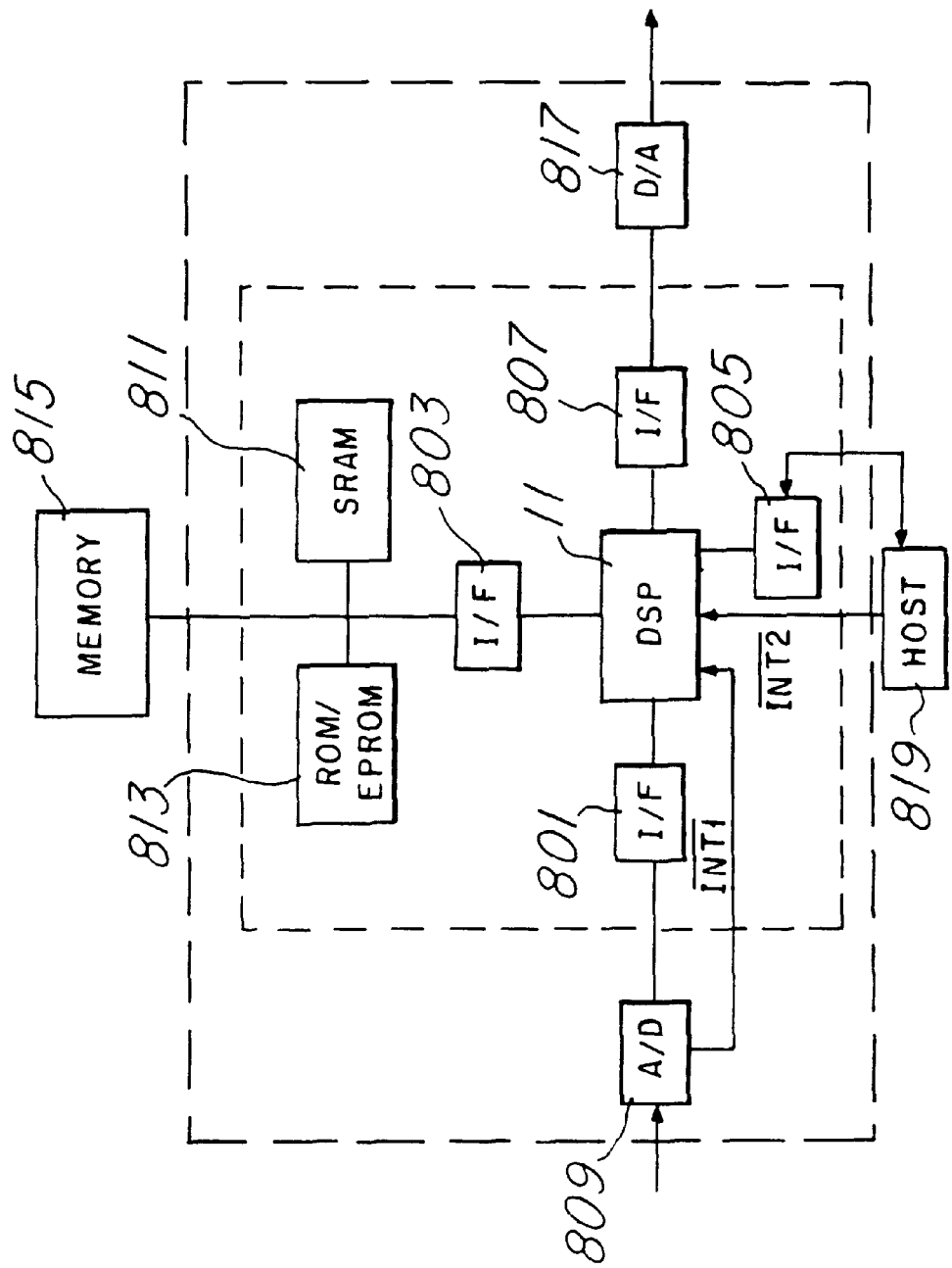
FIG. 20 is an electrical block diagram of an improved system for high-sample rate digital signal processing.

Turning now to the subject of interrupt management and context switching, FIG. 20 illustrates a system including DSP device 11 having four interfaces 801, 803, 805 and 807. An analog signal from a sensor or transducer is converted by A/D converter 809 into digital form and supplied to DSP 11 through interface 801. When each conversion is complete an interrupt signal INT1- is supplied from analog to digital converter 809 to DSP 11. DSP 11 is supported by internal SRAM 811, by ROM and EPROM 813 and by external memory 815 through interface 803. The output of DSP 11 is supplied to a digital-to-analog converter 817 for output and control purposes via interface 807. An optional host computer 819 is connected to an interrupt input INT2- of DSP 11 and communicates data via interface 805. Other interrupt-based systems herein are shown in FIGS. 4, 6, 11, 14 and 17.

Operations of device 11 on interrupt or other context change are now discussed. Referring to FIGS. 1A and 1B, it is noted that several of the registers are drawn with a background rectangle. These registers are TREG2 195, TREG1 81, TREG0 49, BPR 185, PREG 51, ACC 23, ACCB 31, INDX 143, ARCR 159, ST0, ST1, and PMST. These registers have registers herein called counterpart registers associated with them. Any time an interrupt or other context change occurs, then all of the aforementioned registers are automatically pushed onto a one-deep stack. When there is a return from interrupt or a return from the context change, the same registers are automatically restored by popping the one-deep stack.

Advantageously, the interrupt service routines are handled with zero time overhead on the context save or context switching. The registers saved in this way are termed "strategic registers". These are the registers that would be used in an interrupt service routine and in preference to using any different register in their place.

If a context save to memory were executed register-by-register to protect the numerous strategic registers, many instruction cycles would be consumed. Furthermore, the relative frequency at which these context save operations occurs depends on the application. In some applications with 100 KHz sampling rates in FIG. 20, the frequency of interrupts is very high and thus the cycles of interrupt context save overhead could, without the zero-overhead improvement be substantial. By providing the zero-overhead context switching feature of the preferred embodiment, the interrupt service routine cycle count can be reduced to less than half while obtaining the same functionality. It is advantageous to execute on the order of 100,000 samples per second in multiple channel applications of a DSP or to process a single channel with a very high sampling frequency such as 50 KHz or more. The remarks just made are also applicable to subroutine calls, function calls and other context switches.

When an interrupt occurs, status registers are automatically pushed onto the one-deep stack. In support of this feature, there is an additional instruction, return from interrupt (RETI), that automatically pops the stacks to restore the main routine status. The preferred embodiment also has an additional return instruction (RETE) that automatically sets a global interrupt enable bit, thus enabling interrupts while popping the status stack. An instruction designated as delayed return with enable (RETED) protects the three instructions following the return from themselves being interrupted.

The preferred embodiment has an interrupt flag register (IFR) mapped into the memory space. The user can read the IFR by software polling to determine active interrupts and can clear interrupts by writing to the IFR.

Some applications are next noted in which the zero-overhead context switching feature is believed to be particularly advantageous. Improved disk drives are thus made to be faster and accommodate higher information density with greater acceleration and deceleration and faster read alignment adjustment. The processor can service more feedback points in robotics. In modems, a lower bit error rate due to software polling of interrupts is made possible. Vocoders in their encoding are made to have higher accuracy and less bit error. Missile guidance systems have more accurate control and require fewer processors. Digital cellular phones are similarly improved.

The zero-overhead context save feature saves all strategic CPU registers when an interrupt is taken and restores them upon return from the service routine without taking any machine cycle overhead. This frees the interrupt service routine to use all of the CPU resources without affecting the interrupted code.

Figure 21:
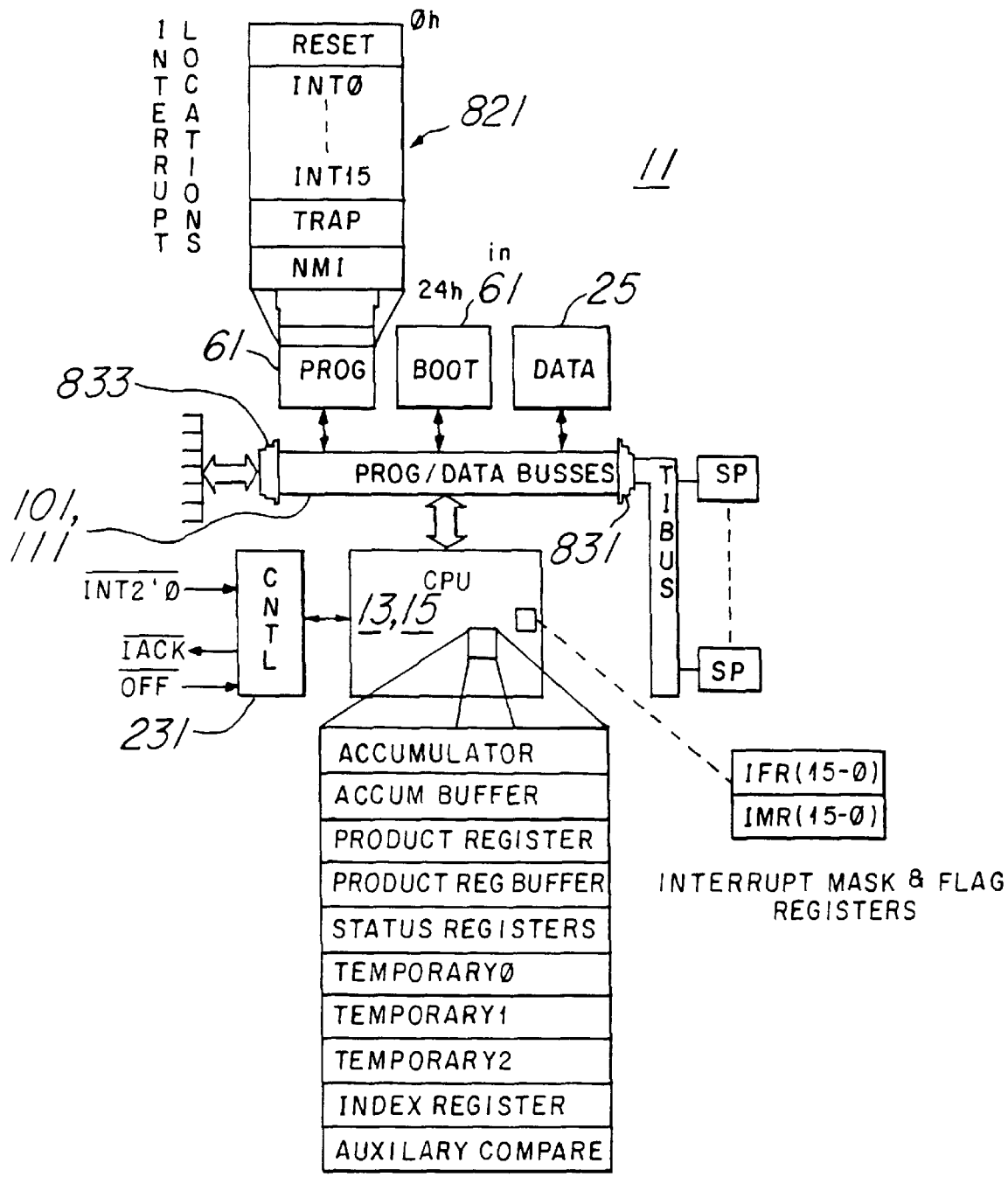
FIG. 21 is an electrical block diagram of architecture for an improved data processing device including the of FIGS. 1A and 1B.

FIG. 21 shows a block diagram of device 11 in which the subject matter of FIGS. 1A and 1B is shown as the CPU block 13, 15 in FIG. 21. A set of registers are shown broken out of the CPU block and these are the strategic registers which have a one-deep stack as described hereinabove.

FIG. 21 is useful in discussing the overall system architecture of the semiconductor chip. A set of interrupt trap and vector locations 821 reside in program memory space. When an interrupt routine in program memory 61 of FIGS. 1A and 21 is to be executed, the interrupt control logic 231 of FIG. 21 causes the program counter 93 of FIG. 1A to be loaded with appropriate vector in the interrupt locations 821 to branch to the appropriate interrupt service routine. Two core registers IFR and IMR are an interrupt flag register and interrupt mask register respectively. The interrupt flag register gives an indication of which specific interrupts are active. The interrupt mask register is a set of bits by which interrupts to the CPU can be disabled by masking them. For example, if there is an active interrupt among the interrupts INT2-, INT1-, and INT0-, then there will be a corresponding bit in the IFR that is set for a "1". The flag is cleared by taking an interrupt trap by which it will automatically be cleared. Otherwise, the interrupt is cleared by ORing a one into the respective interrupt flag register that clears the interrupt. All active interrupt flags can be cleared at once also.

The program and data buses 101 and 111 are diagrammatically combined in FIG. 21 and terminate in peripheral ports 831 and 833. Peripheral port 833 provides a parallel interface. Port 831 provides an interface to the TI bus and serial ports for device 11.

Figure 22:
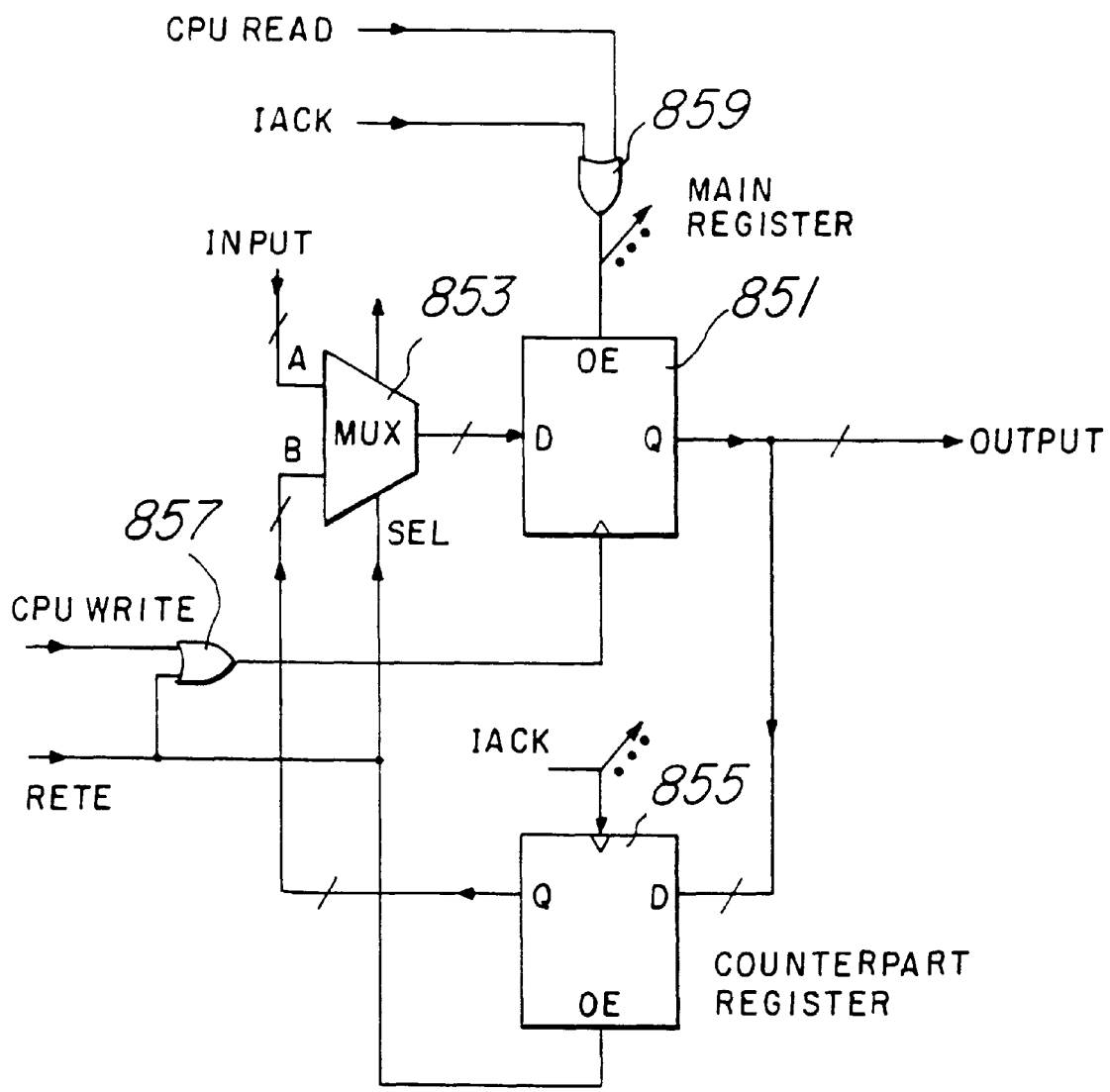
FIG. 22 a schematic diagram of a circuit for zero-overhead interrupt context switching.
Figure 23:
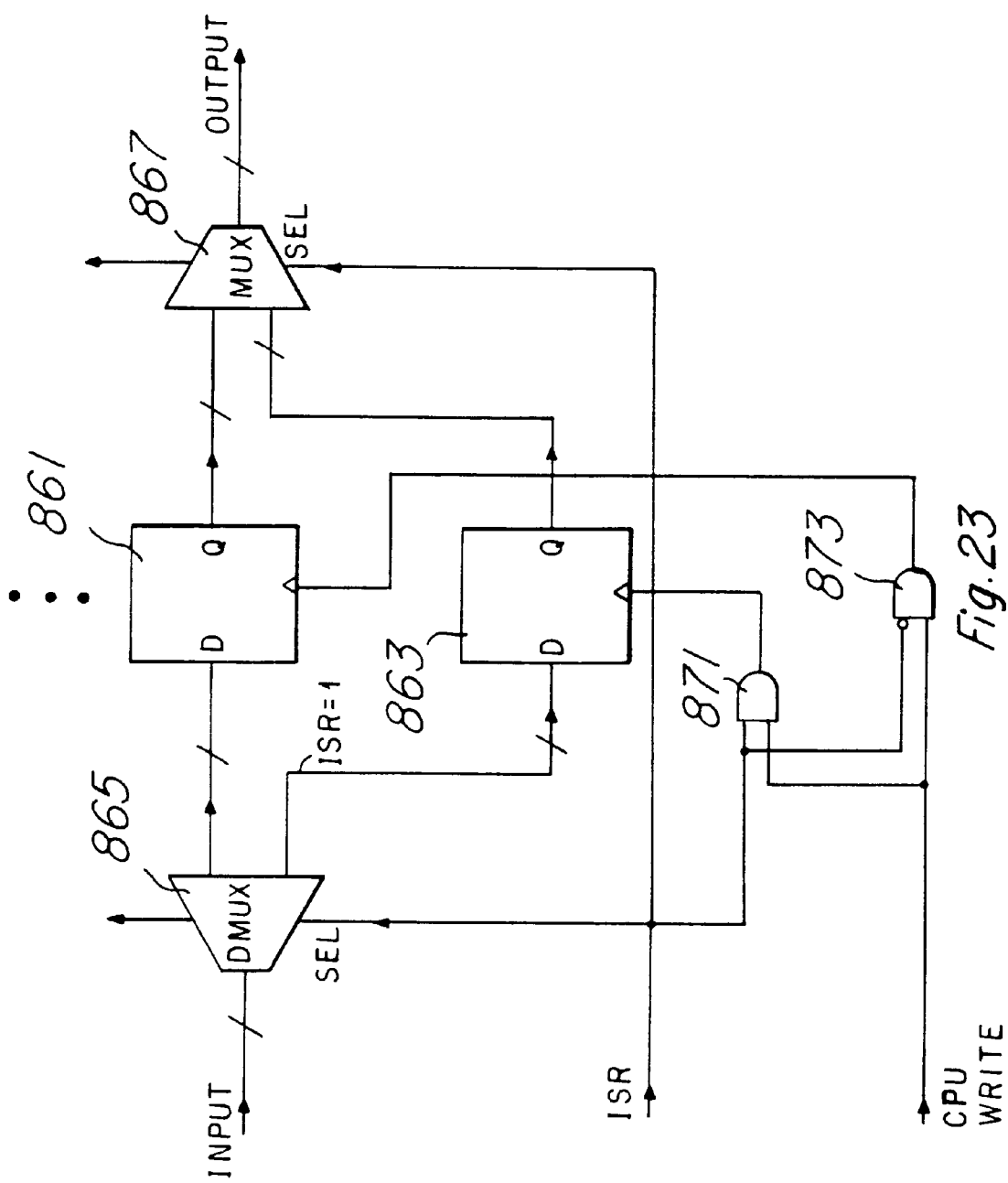
FIG. 23 is a schematic diagram of an alternative circuit for zero-overhead interrupt context switching.
Figure 24:
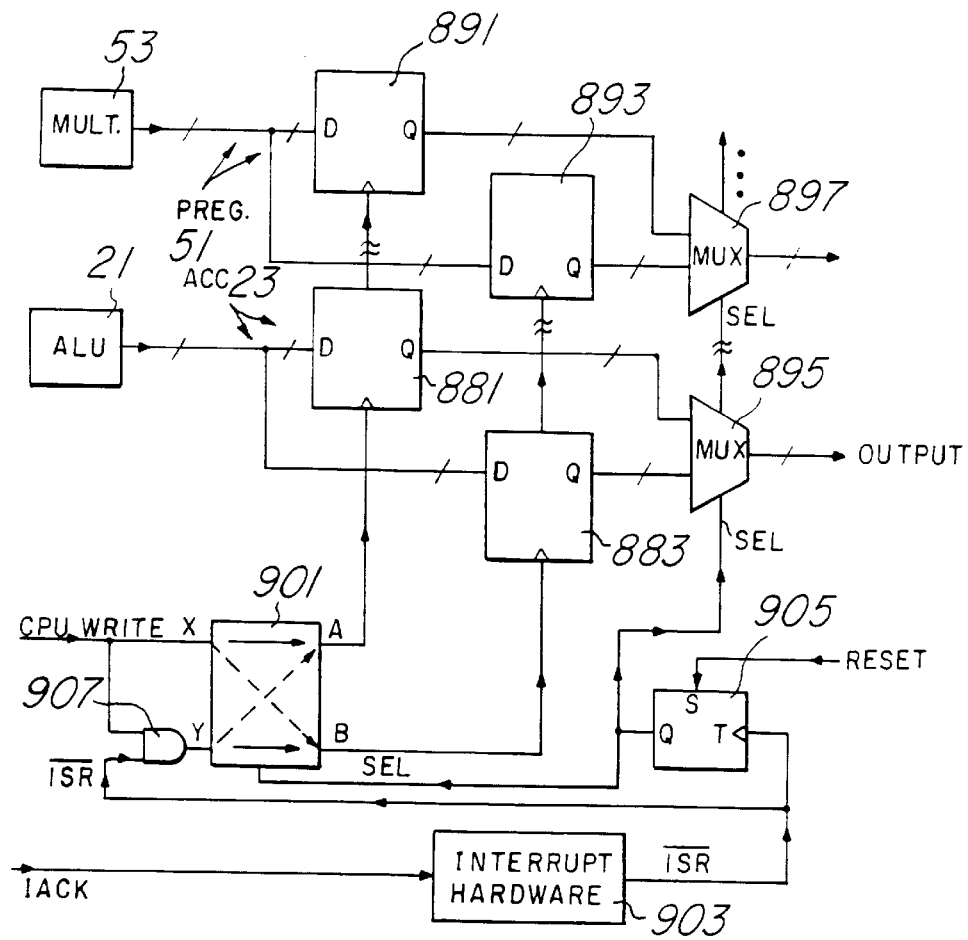
FIG. 24 is a schematic diagram of another alternative circuit for zero-overhead interrupt context switching.

FIGS. 22, 23 and 24 illustrate three alternative circuits for accomplishing zero-overhead interrupt context switching. It should be understood all the strategic registers are context-switched in parallel simultaneously, and therefore the representation of all the registers by single flip flops is a diagrammatic technique.

In FIGS. 22 and 23, the upper register and lower register represent the foreground and background rectangles of each of the strategic registers of FIGS. 1A and 1B. FIG. 24 shows the parallelism explicitly.

In FIG. 22, a main register 851 has its data D input selectively supplied by a MUX 853. MUX 853 selectively connects the D input of register 851 to either parallel data lines A or parallel data lines B. Lines B are connected to the Q output of a counterpart register 855. Main register 851 has a set of Q output lines that are respectively connected to corresponding D inputs of the counterpart register 855.

In an interpretive example, the arrow marked input for line A represents the results of computations by ALU 21, and accumulator 23 includes registers 851 and 855. The output of main register 851 of FIG. 22 interpreted as accumulator 23 is supplied, for example, to post scaler 181 of FIG. 1A. It should be understood, however, that the register 851 is replicated as many times as required to correspond to each of the strategic registers for which double rectangles are indicated in FIGS. 1A and 1B.

In FIG. 22, each of the registers 851 and 855 has an output enable (OE) terminal. An OR gate 857 supplies a clock input of main register 851. OR gate 857 has inputs for CPU WRITE and RETE. RETE also feeds a select input of MUX 853 and also the OE output enable terminal of counterpart register 855. Main register 851 has its OE terminal connected to the output of an OR gate 859, the inputs of which are connected to interrupt acknowledge IACK and CPU READ. IACK also clocks counterpart register 855 and all other counterpart registers as indicated by ellipsis.

In operation, in the absence of a return from interrupt (RETE low), MUX 853 selects input line A for main register 851. Upon occurrence of CPU WRITE, main register 851 clocks the input from the CPU core into its D input. The CPU accesses the contents of register 851 when a CPU READ occurs at OR gate 859 and activates OE.

When an interrupt occurs and is acknowledged (IACK) by device 11, the output Q of register 851 is enabled and the counterpart register 855 is clocked, thereby storing the Q output of main register 851 into register 855. As the interrupt service routine is executed, input lines A continue to be clocked by CPU WRITE into main register 851. When the interrupt is completed, RETE goes low, switching MUX 853 to select lines B and activating line OE of counterpart register 855. RETE also clocks register 851 through OR gate 857 to complete the transfer and restore the main routine information to main register 851. Then upon completion of the return from interrupt RETE goes low reconnecting main register 851 to input lines A via MUX 853. In this way, the context switching is completed with zero overhead.

FIG. 22 thus illustrates first and second registers connected to an electronic processor. The registers participate in one processing context (e.g. interrupt or subroutine) while retaining information from another processing context until a return thereto. MUX 853 and the gates 857 and 859 provide an example of a context switching circuit connected to the first and second registers operative to selectively control input and output operations of the registers to and from the electronic processor, depending on the processing context. The electronic processor such as the CPU 13, 15 core of FIGS. 1A and 1B is responsive to a context signal such as interrupt INT- and operable in the alternative processing context identified by the context signal.

FIG. 23 illustrates a bank switching approach to zero overhead context switching. A main register 861 and a counterpart register 863 have their D inputs connected to a demultiplexer DMUX 865. The Q outputs of registers 861 and 863 are connected to respective inputs of a MUX 867. Input from the CPU core is connected to the DMUX 865. Output back to the CPU core is provided from MUX 867. Both select lines from MUXes 865 and 867 are connected to a line which goes active when an interrupt service routine ISR is in progress.

In this way, in a main routine, only register 861 is operative. During the interrupt service routine, register 863 is operated while register 861 holds contents to which operations are to return. A pair of AND gates 871 and 873 also act to activate and deactivate registers 861 and 863. A CPU WRITE qualifies an input of each AND gate 871 and 873. The outputs of AND gates 871 and 873 are connected to the clock inputs of registers 863 and 861 respectively. In a main routine with ISR low, register 873 is qualified and CPU WRITE clocks register 861. AND gate 871 is disabled in the main routine. When ISR is high during interrupt, CPU WRITE clocks register 863 via qualified AND gate 871, and AND gate 873 is disabled.

In FIG. 24, two registers 881 and 883 both have D inputs connected to receive information simultaneously from the processor (e.g. ALU 21). The registers are explicitly replicated in the diagram to illustrate the parallelism of this context switching construction so that, for example, ALU 21 feeds both D inputs of the registers 881 and 883, wherein registers 881 and 883 illustratively act as accumulator ACC 23. Correspondingly, multiplier 53, for example, feeds the P register 51 including registers 891 and 893. (Register 893 is not to be confused with BPR 185 of FIG. 1A).

A MUX 895 has its inputs connected respectively to the Q outputs of registers 881 and 883. A MUX 897 has its inputs connected respectively to the Q outputs of registers 891 and 893. The clock inputs of registers 881 and 891 are connected in parallel to an A output of an electronic reversing switch 901. The clock inputs of register 883 and 893 are connected in parallel to a B output of reversing switch 901. Interrupt hardware 903 responds to interrupt acknowledge IACK to produce a low active ISR- output when the interrupt service routine is in progress. Interrupt hardware 903 drives the toggle T input of a flip flop 905. A Q output of flip flop 905 is connected both to a select input of switch 901 and to the select input of both MUXes 895 and 897 as well as MUXes for all of the strategic regisers.

A CPU WRITE line is connected to an X input of switch 901 and to an input of an AND gate 907. The low active ISR- output of interrupt hardware 903 is connected to a second input of AND gate 907 the output of which is connected to a Y input of switch 901.

In operation, a reset high initializes the set input of flip flop 905 pulling the Q output high and causing MUX 895 to select register 881. Also, switch 901 is thereby caused to connect X to A and Y to B. In a main routine, ISR- is inactive high qualifying AND gate 907. Accordingly, activity on the CPU WRITE line clocks all registers 881, 883, 891 and 893 in a main routine. This means that information from ALU 21 is clocked into both registers 881 and 883 at once and that information from multiplier 53 is clocked into both registers 891 and 893 at once, for example.

Then, upon a context change of which the interrupt service routine is an example, ISR- goes low and disables AND gate 907. Subsequent CPU WRITE activity continues to clock registers 881 and 891 for purposes of the interrupt routine, but fails to clock registers 883 and 893, thus storing the contents of the main routine in these two latter registers by inaction. Therefore, a context switch occurs with no time overhead whatever. Upon a return to the original context, such as the main routine, ISR- once again goes high enabling AND gate 907. The low to high transition toggles flip flop 905 causing MUXes 895 and 897 to change state and automatically select registers 883 and 893. This again accomplishes an automatic zero-overhead context switch. Since flip flop 905 is toggled, switch 901 changes state to connect X to B and Y to A. Then activity on CPU write clocks both flip flops at once and registers 883 and 893 are active registers. A further interrupt (ISR- low) disables registers 881 and 891 while registers 883 and 893 remain active. Thus, in FIG. 24 there is no main register or counterpart register, but instead the pairs of registers share these functions alternately.

In this way, FIG. 24 provides a switching circuit connecting the arithmetic logic circuit to both of two registers until an occurrence of the interrupt signal. The switching circuit temporarily disables one of the registers from storing further information from the arithmetic logic unit in response to the interrupt signal. Put another way, this context switching circuit like that of FIGS. 22 and 23 is operable to selectively clock first and second registers. Unlike the circuits of FIGS. 22 and 23, the circuit of FIG. 24 has first and second registers, both having inputs connected to receive information simultaneously from the processor. The processor has a program counter as already discussed and is connected to these registers for executing a first routine and a second routine involving a program counter discontinuity.

In FIGS. 22–24, a stack is, in effect, associated with a set of registers and the processor is operative upon a task change to the second routine for pushing the contents of the plurality of registers onto the stack. Similarly, upon return from interrupt, the processor pops the stack to allow substantially immediate resumption of the first routine. The second routine can be an interrupt service routine, a software trap, a subroutine, a procedure, a function or any other context changing routine.

Figure 25:
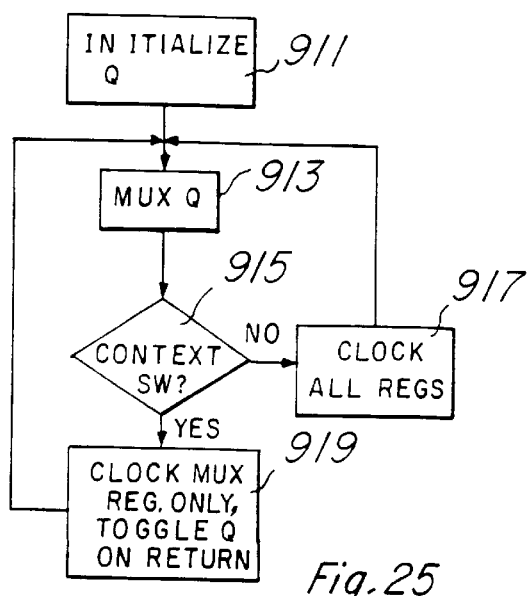
FIG. 25 is a flow diagram of a method of operating the circuit of FIG. 24.

In FIG. 25, a method of operating the circuit of FIG. 24 initializes the Q output of flip flop 905 in a step 911. Operations proceed in a step 913 to operate the output MUXes 895 and 897 based on the state of the Q output of flip flop 905. Then a decision step 915 determines whether the context is to be switched in response to the ISR- signal, for example. If not, operations in a step 917 clock all registers 881, 883, 891 and 893 and loop back to step 913 whence operations continue indefinitely until in step 915 a context switch does occur. In such case, a branch goes from step 915 to a step 919 to clock only the registers selected by the MUXes (e.g. 895 and 897). When return occurs, Q is toggled at flip flop 905 whence operations loop back to step 913 and continue indefinitely as described.

Figure 26:
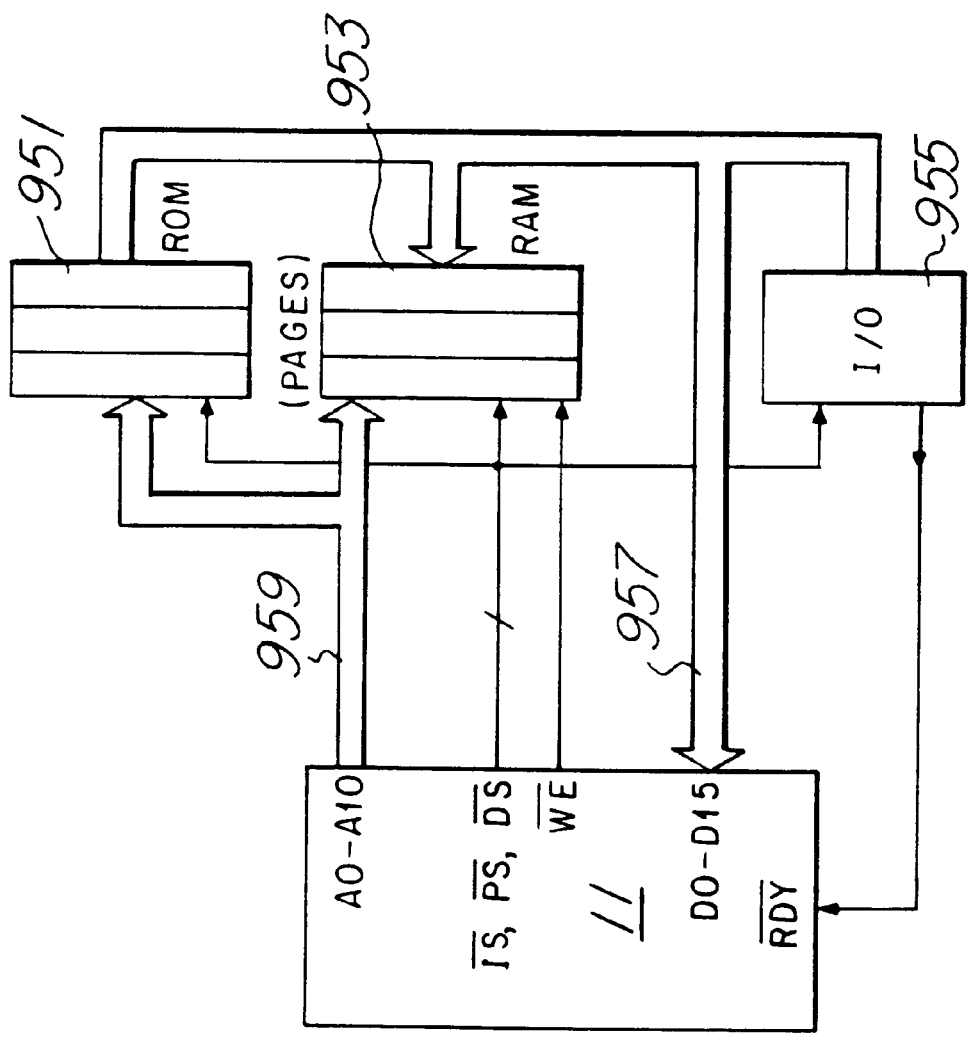
FIG. 26 is a block diagram of an improved system including memory and I/O peripheral devices interconnected without glue logic to a data processing device of FIGS. 1A and 1B having software wait states on address boundaries.

In FIG. 26, device 11 is connected to an external ROM 951 and external RAM 953, as well as an I/O peripheral 955 which communicates to device 11 at a ready RDY- input. Each of the peripheral devices 951, 953 and 955 are connected by a peripheral data bus 957 to the data pins of device 11. The memories 951 and 953 are both connected to a peripheral address bus 959 from device 11. Enables are provided by lines designated IS-, PS- and DS- from device 11. A WRITE enable line WE- is connected from device 11 to RAM 953 to support write operations.

As a practical matter, the processor in device 11 can run much faster than the peripherals and especially many low-cost memories that are presently available. Device 11 may be faster than any memories presently available on the market so when external memory is provided, wait states need to be inserted to give the memories and other peripherals time to respond to the processor. Software wait states can be added so that the device 11 automatically adds a software programmable number of wait states automatically. However, the different peripherals need fewer or larger numbers of wait states and to provide the same number of wait states for all peripherals is inefficient of processor time.

Figure 27:
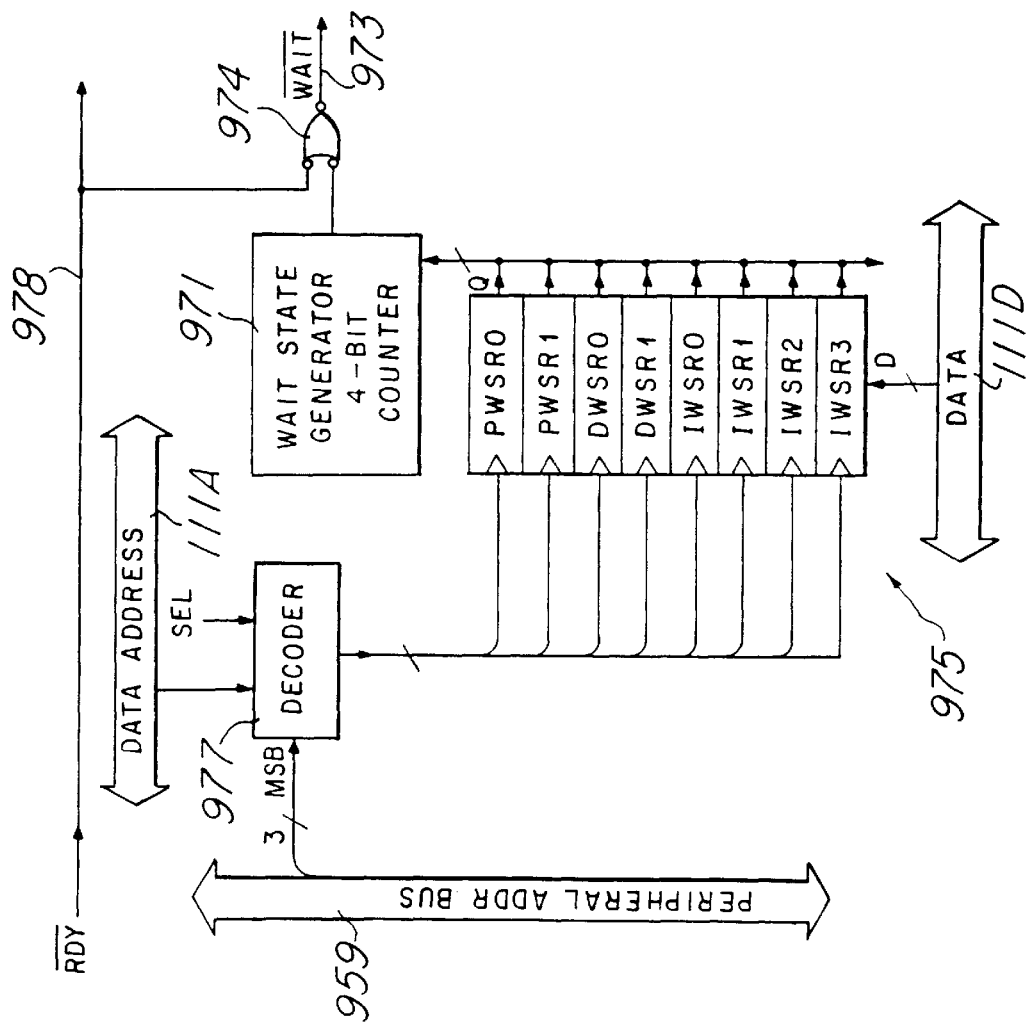
FIG. 27 is a partially block, partially schematic diagram of a circuit for providing software wait states on address boundaries.

This problem is solved in the preferred embodiment of FIGS. 26 and 27 by providing software controlled wait state defined on memory page address ranges or boundaries and adaptively optimized for available memories and peripheral interfaces. This important configuration eliminates any need for high speed external glue logic to decode addresses and generate hardware wait states.

In contrast with the glue logic and hardware wait state approach, the programmable page boundary oriented solution described herein requires no external glue logic which would otherwise need to operate very fast and thus require fastest, highest power and most expensive logic to implement the glue function. Elimination of glue logic also saves printed circuit board real estate. Furthermore, the processor can then be operated faster than any available glue logic.

The preferred embodiment thus combines with a concept of software wait states, the mapping of the software wait states on memory pages. The memory pages are defined as the most common memory block size used in the particular processor applications, for example. The number of wait states used for a specific block of memory is defined in a programmable register and can be redefined. The wait state generator generates the appropriate number of wait states as defined in the programmable register any time an address is generated in the respective address range or page or blocks. The mapping to specific bank sizes or page sizes eliminates any need for external address decoded glue logic for accelerating external cycles. External peripheral interfaces are decoded on individual address locations and the software wait state generator not only controls the number of wait states required for each individual peripheral, but is also compatible with ready line control for extending the number of wait states beyond the programmed amount.

A programmable wait state circuit of FIG. 27 causes external accesses to operate illustratively with 0 to 15 wait states extendable by the condition of a ready line RDY-. Wait states are additional machine cycles added to a memory access to give additional access time for slower external memories or peripherals. If at the completion of the programmed number of wait states the ready line is low, additional wait states are added as controlled by the ready line. The wait state circuit of FIG. 27 includes a 4-bit down register block 971 connected to a WAIT- input of the processor in device 11 of FIG. 21 by an OR gate 974. Gate 974 has low-active inputs as well as output. The ready line RDY- is connected to an input of OR- gate 974. A set of registers 975 has illustratively sixteen locations of four bits each. Each of the four bit nibbles defines a number of wait states from 0 to 15 on Q output lines to wait state generator 971. When device 11 asserts an address to one of the peripherals 951, 953 or 955 on a peripheral address bus 959, an on-chip decoder 977 decodes the most significant bits MSB representing the page of memory which is being addressed. For example, in the system of FIG. 26 there are 16 pages of memory. Decoder 977 selects one of the 16 four bit nibbles in the registers 975 and outputs the selected nibble to wait state generator 971. Generator 971 correspondingly counts down to zero and thereby produces the wait states defined by the nibble. The registers 975 are loaded via data bus 111D initially in setting up the system based on the characteristics of the peripherals. Thus in the preliminary phase, the data address bus 111A asserts an address to decoder 977 and a select line SEL is activated. Decoder 977 responds to the address on bus 111A to select one of the registers 975 into which is written the programmed number of wait states via data bus 111D. Thus, the number of wait states defined for a specific address segment or page is defined by the wait state control registers PWSR0, PWSR1, DWSR0, DWSR1, IWSR0, IWSR1, IWSR2 and IWSR3. Decoder 977 is itself suitably further made programmable by data buses 111A and 111D by providing one or more registers to define programmable widths of address ranges to which the decoder 977 is to be responsive.

More specifically, with reference to the software wait state generator, the program space is illustratively broken into 8K word segments. For each 8K word segment is programmed a corresponding four bit value in one of the PWSR registers to define 0 to 15 wait states. The data space is also mapped on 8K word boundaries to the two DWSR registers.

The wait state control registers 975 are mapped in the address space. On-chip memory and memory mapped registers in the CPU core 13, 15 are not affected by the software wait state generators. On-chip memory accesses operate at full speed. Each wait state adds a single machine cycle.

The PWSR registers are provided for program memory wait states. The DWSR registers are provided for data memory wait states. The IWSR registers are provided for I/O peripheral wait states.

Since the wait states are software programmable, the processor can adapt to the peripherals with which it is used. Thus, the wait state values in registers 975 can be set to the maximum upon startup and then the amount of time that is required to receive a ready signal via line 978 is processed by software in order to speed up the processor to the maximum that the peripherals can support. Some of the I/O may be analog-to-digital converters. Memories typically come in blocks of 8K. Each of the peripherals has its own speed and the preferred embodiment thus adaptively provides its own desirable set of wait states. Larger size memories can be accommodated by simply putting the same wait state value in more than one nibble of the registers 975. For example, device 11 can interact with one block of memory which can be a low speed EPROM that is 8K wide which is used together with a high speed block of RAM that is also 8K. As soon as the CPU addresses the EPROM, it provides a greater number of wait states. As soon as the CPU addresses the high speed RAM, it uses a lesser amount of wait states. In this way, no decode logic or ready logic off-chip is needed to either slow down or speed up the device appropriately for different memories. In this way, the preferred embodiment affords a complete control when used with a user's configuration of a off-chip memory or other peripheral chips.

Upon system reset, in some embodiments it is advisable to set the registers with a maximum value of 15 wait states so that the device 11 runs relatively slowly initially and then have software speed it up to the appropriate level rather than having device 11 run very fast initially which means that it will be unable to communicate effectively with the peripherals in the initial phase of its operations.

In this way, device 11 is readily usable with peripheral devices having differing communication response periods. CPU core 13, 15 acts as a digital processor adapted for selecting different ones of the peripheral devices by asserting addresses of each selected peripheral device. Registers 975 are an example of addressable programmable registers for holding wait state values representative of distinct numbers of wait states corresponding to different address ranges. Decoder 977 and wait state generator 973 act as circuitry responsive to an asserted address to the peripheral devices asserted by the digital processor for generating the number of wait states represented by the value held in one of the addressable programmable registers corresponding to one of the address ranges in which the asserted address occurs. In this way, the differing communication response periods of the peripheral devices are accommodated.

Decoder 977 responds to the CPU core for individually selecting and loading the wait state generator with respective values representing the number of wait states to be generated. In other embodiments, individual programmable counters for the pages are employed.

Figure 28:
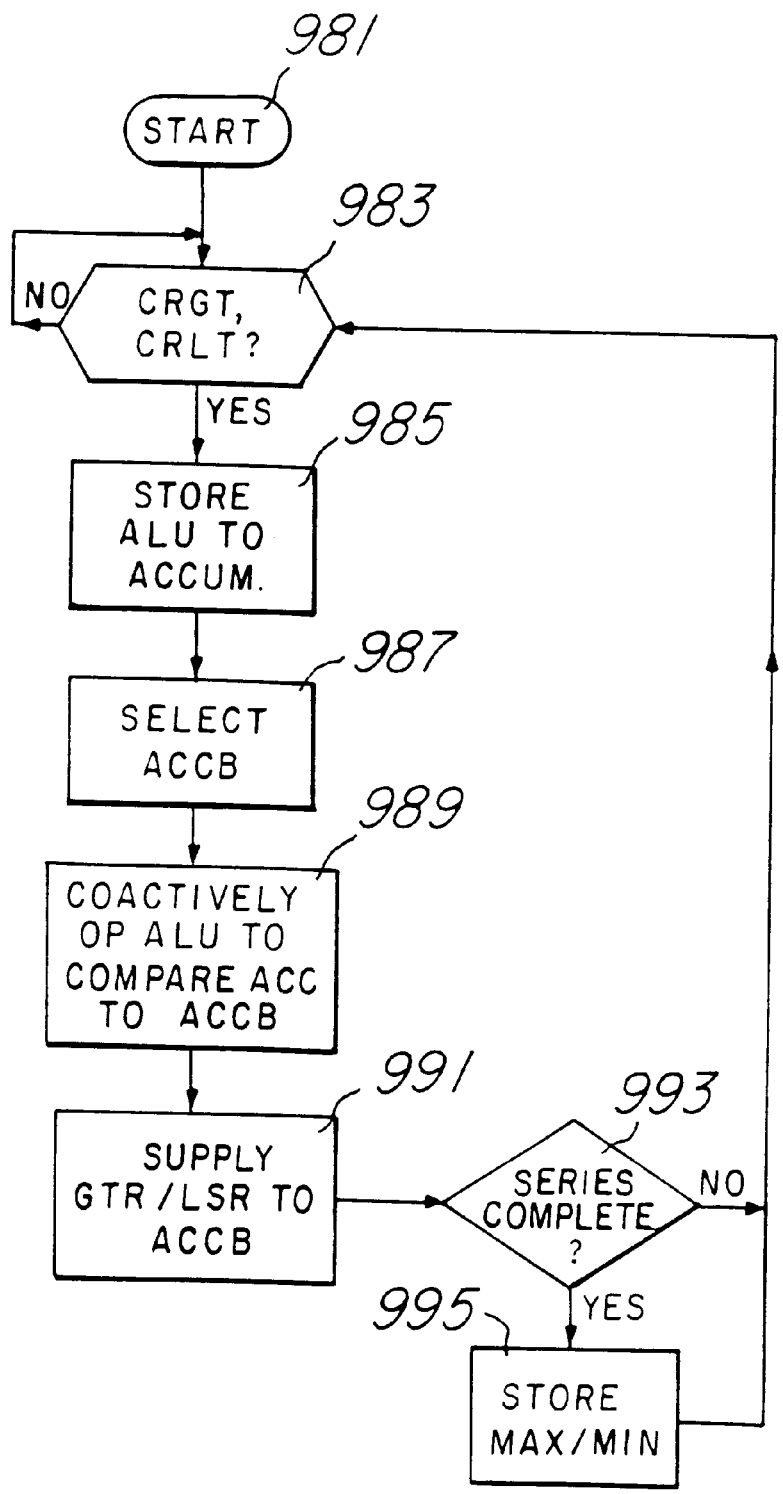
FIG. 28 is a process flow diagram illustrating instructions for automatically computing a maximum or a minimum in the data processing device of FIGS. 1A and 1B.

FIG. 28 is a process diagram for describing the operation of two instructions CRGT and CRLT. These two instructions involve a high speed greater-than and less-than computation which readily computes maximums and minimums when used repeatedly. Operations commence with a start 981 and proceed to determine whether the CRGT or CRLT instruction is present. When this is the case, operations go on to a step 985 to store the ALU 21 to accumulator 23 in FIG. 1A. Then in a step 987, the ALU selects the contents of ACCB 31 via MUX 77 of FIG. 1A. In a step 989, the ALU is coactively operated to compare the contents of accumulator 23 to ACCB 31, by subtraction to obtain the sign of the arithmetic difference, for instance. In step 991, the greater or lesser value depending on the instruction CRGT or CRLT respectively is supplied to ACCB 31 by either storing ACC 23 to ACCB 31 or omitting to do so, depending on the state of the comparison. For example, if ACC 23 has a greater value then ACCB 31 and the instruction is CRGT, then the ACC is stored to ACCB, otherwise not. If ACC 23 has a lesser value then ACCB and the instruction is CRLT, then the ACC is stored to ACCB. In some embodiments, when ACCB already holds the desired value, a transfer writes ACCB into ACC. Subsequently, a test 993 determines whether a series of values is complete. If not, then operations loop back to step 983. If the series is complete in step 993, operations branch to a step 995 to store the maximum or minimum value of the series which has been thus computed.

The capacity to speedily compute the maximum of a series of numbers is particularly beneficial in an automatic gain control system in which a multiplier or gain factor is based on a maximum value in order to raise or lower the gain of an input signal so that it can be more effectively processed. Such automatic gain control is used in radio receivers, audio amplifiers, modems and also in control systems utilizing algorithms such as the PID algorithm. PID is a proportional integral and differential feedback control system. Still another application is in pattern recognition. For example, in a voice or recognition system, solid hits of recognition by comparison of pre-stored voice patterns to incoming data are determined by looking at a maximum in a template comparison process. Also, in image processing, edge detection by a processor analyzes intensities in brightness and in color. When intensities rise and then suddenly fall, a maximum is detected which indicates an edge for purposes of image processing.

In this way, an arithmetic logic unit, an instruction decoder, an accumulator and an additional register are combined. The additional register is connected to the arithmetic logic unit so that the arithmetic logic unit supplies a first arithmetic value to the accumulator and then supplies to the register in response to a command from the instruction decoder the lesser or greater in value of the contents of the additional register and the contents of the accumulator. Repeated execution of the command upon each of a series of arithmetic values supplied over time to the accumulator supplies the register with a minimum or maximum value in the series of arithmetic values.

It is critically important in many real time systems to find a maximum or minimum with as little machine cycle overhead as possible. The problem is compounded when temporary results of the algorithm are stored in accumulators that have more bits than the word width of a data memory location where the current minimum or maximum might be stored. It is also compounded by highly pipelined processors when condition testing requires a branch. Both cases use extra machine cycles. Additional machine cycles may be consumed in setting up the addresses on data transfer operations.

In the preferred embodiment, however, the circuit has ACCB 31 be a parallel register of the same bit width as the accumulator ACC 23. When the minimum or maximum function is executed, the processor compares the latest values in the accumulator with the value in the parallel register ACCB and if less than the minimum or greater than the maximum, depending on the instruction, it writes the accumulator value into the parallel register or vice versa. This all executes with a single instruction word in a single machine cycle, thus saving both code space and program execution time. It also requires no memory addressing operations and it does not affect other registers in the ALU.

Figure 29:
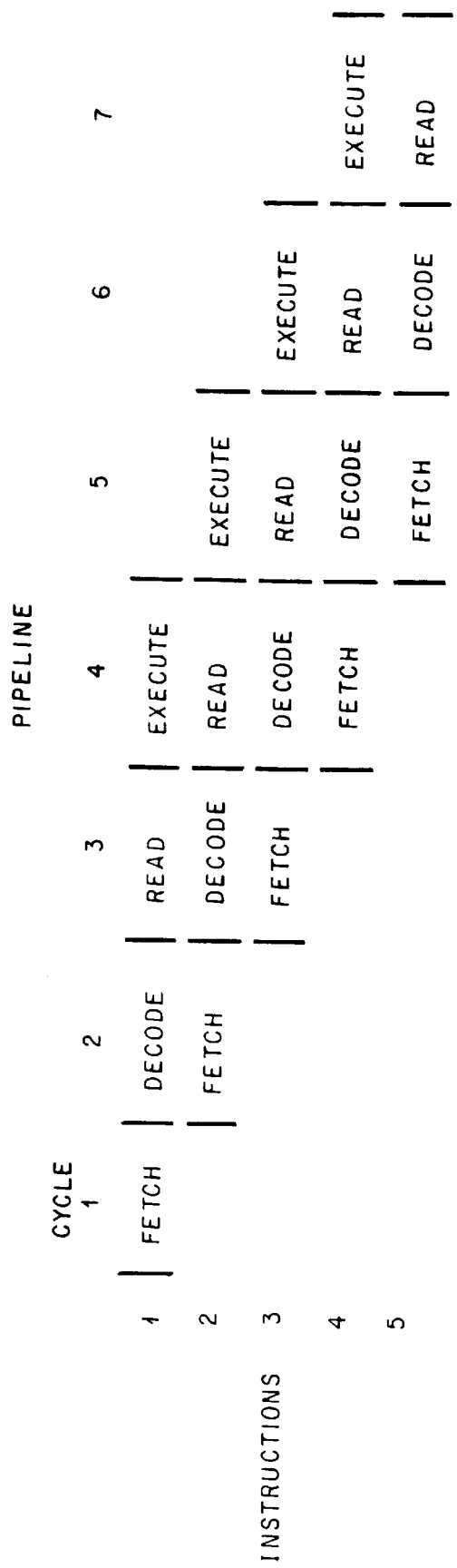
FIG. 29 is a partially graphical, partially tabular diagram of instructions versus instruction cycles for illustrating pipeline organization of the data processing device of FIGS. 1A and 1B.

FIG. 29 illustrates a pipeline organization of operational steps of the processor core 13, 15 of device 11. The steps include fetch, decode, read and execute, which for subsequent instructions are staggered relative to a first instruction. Thus, when the pipeline is full, one instruction is being executed simultaneously with a second instruction being read, a third instruction being decoded and a fourth instruction in the initial phase of fetch. This prefetch, decode, operand-fetch, execute pipeline is invisible to the user. In the operation of the pipeline, the prefetch, decode, operand-fetch, and execute operations are independent, which allows instructions to overlap. Thus during any given cycle, four different instructions can be active, each at a different stage of completion. Each pipeline break (e.g., branch, call or return) requires a 2 to 3 cycle pipeline loading sequence as indicated by cycles 1, 2, and 3 of FIG. 29. To improve the code efficiency when a program requires a high number of branches or other discontinuities in the program addressing, the instruction set includes certain additional instructions.

For example, a delayed branch when executed completes the execution of the next two instructions. Therefore, the pipeline is not flushed. This allows an algorithm to execute a branch in two cycles instead of four and the code lends itself to delayed branches. A status condition for a branch is determined by instructions previous to a delayed branch. Instructions placed after the branch do not affect the status of the branch. This technique also applies to subroutine calls and returns. The delayed branch instructions also support the modification of auxiliary registers.

Pipeline operation is protected against interrupt such that all non-recoverable operations are completed before interrupt is taken.

To further improve the performance of the pipeline, the processor handles two kinds of conditional instructions. Conditional subroutine calls and returns help in error and special condition handling. If a condition is true, the call or return is executed. The format for conditional call and return pneumonic are Cxxxx where xxxx is the condition code; CGEZD: call greater than or equal delay; Rxxxx where xxxx is the condition code; and RIOZ: return on BIO PIN LOW.

Conditional instructions advantageously improve coding of high sampling frequency algorithms, for example. They allow conditional execution of the next one or the next two following instructions with a very low cycle overhead. The test conditions are the same as for branch instructions. The first instruction following a conditional instruction does not modify auxiliary registers and does not reload the program counter 93. These restrictions do not apply for the second conditional instruction. The format for the conditional instruction mnemonic is CExxxx where xxxx is the condition code, and CEGEZ: execute next instruction(s) if greater than equal. If the test is true, the next instruction(s) are executed. If the condition is false, each conditioned instruction is replaced by a NOP.

The following code shows an example of conditioning instruction use: SUBB Y0; CEGEZ 2; SUBB X0; SACL *+. If the test condition is true the two instructions SUBB and SACL are executed. If not, they are replaced by a NOP.

Figure 30:
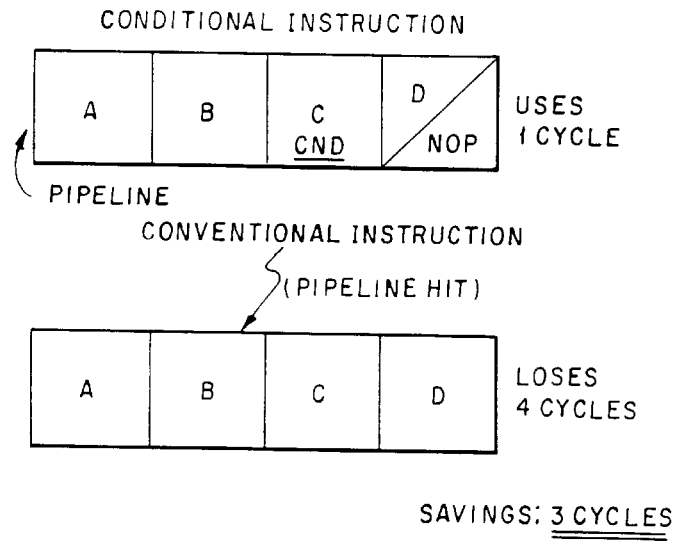
FIG. 30 is a further diagram of a pipeline of FIG. 29 comparing advantageous operation of a conditional instruction to the operation of a conventional instruction.

When the pipeline is full and continually being fed with instructions, it is as shown in columns 4 and 5 of FIG. 29, filled with four instructions continually. In FIG. 30, the fully loaded column is shown laid over horizontal with instructions A, B, C and D therein. When a conditional instruction Ccnd is in the pipeline and the condition is not met, only one cycle is lost. However, as shown in the lower part of FIG. 30, a conventional instruction causes a branch and requires reloading of the pipeline as in cycle 1 and thus require four cycles to reload the pipeline. This is called a pipeline hit. Consequently, as FIG. 30 illustrates, the conditional instruction affords a savings of three cycles of processor time.

Arithmetic operations benefit by introducing conditional instructions. For example, if a positive number X is multiplied by a negative number Y, the desired answer is a negative number Z. To obtain this result, the operations conventionally might include determining the absolute value of -Y to recover Y and then multiplying by X to determine Z and then negating Z to obtain -Z. Determining whether or not the number is negative involves a sign condition which can cause a pipeline hit. A second example is in execution of double precision addition or subtraction. If a double precision number (W,X) is to be added to a double precision number (Y,Z) the first step would be to add W+Y and then X+Z. However, if the condition is true that there is a carry resulting from the addition X+Z, then the sum W+Y should be modified to be W+Y+C (carry). The computation unit 15 thus acts as a circuit having status conditions wherein a particular set of the status conditions can occur in operation of the circuit. Some status conditions, for example, are Z) accumulator equal to 0, L) accumulator less than 0, V) overflow and C) carry.

Figure 31:
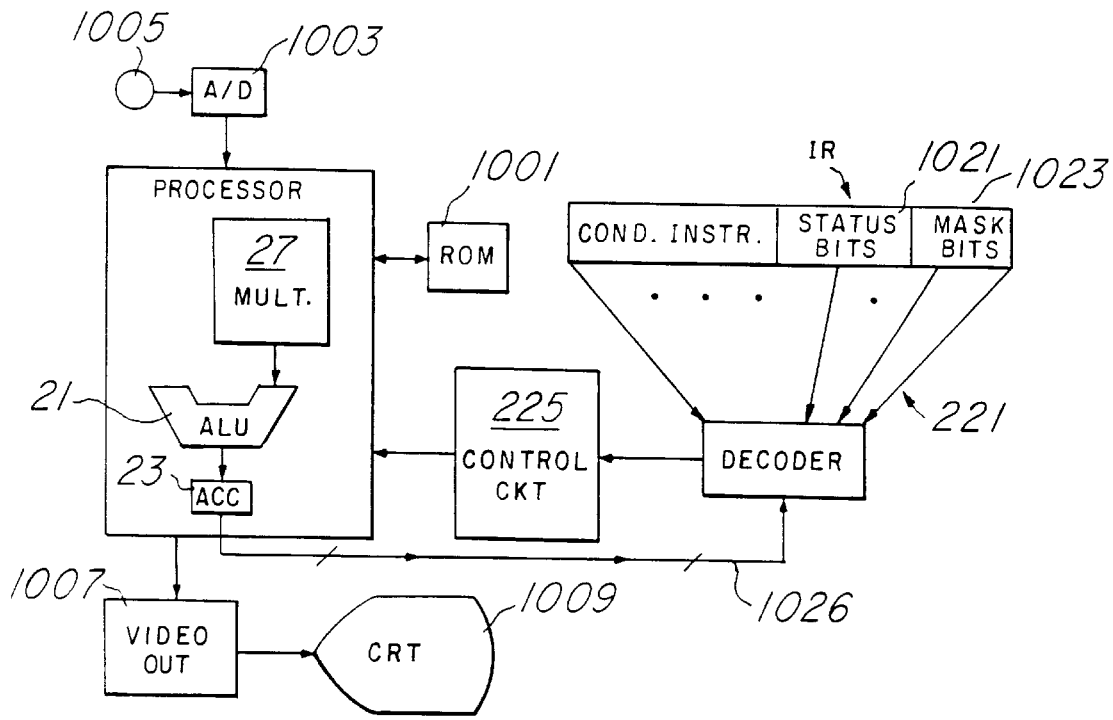
FIG. 31 is an electrical block diagram of an improved video system with a digital signal processor performing multiple-precision arithmetic using conditional instructions having the advantageous operation illustrated in FIG. 30.

The instruction register IR of FIGS. 1A and 31 is operative to hold a conditional instruction directing control circuit 225 to execute a further operation provided that the particular status condition is present. Line 1026 carries signals indicative of the actual status of accumulator 23 back to decoder 221 or control 225. The decoder decodes the instruction register and control circuit 225 is connected to the processor to cause it to execute a further operation when a particular status condition is present and otherwise to cause the circuit to omit the further operation. In this way, a branch is avoided and no pipeline hit occurs.

Figure 32:
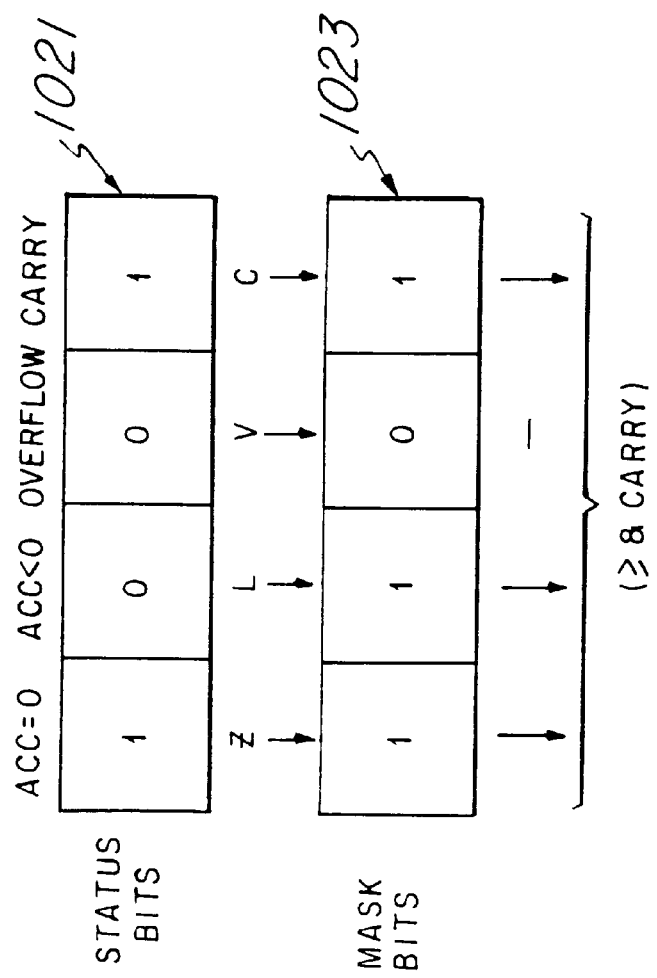
FIG. 32 is a block diagram of status bits and mask bits of a conditional instruction such as a conditional branch instruction.

The instruction register also includes sets of bits 1021 and 1023 interpreted as status and mask bits of FIG. 32 when a conditional instruction is present in the I.R. In other words, decoder 221 is enabled by the presence of a conditional instruction to decode the predetermined bit locations 1021 as status bits and the predetermined bit locations 1023 as mask bits. Decoder 221 decodes the predetermined mask location corresponding to the status conditions to selectively respond to the certain ones of the predetermined status conditions when the conditional instruction is present in the instruction register. In this way, the processor is able to perform high sample rate algorithms in a system that has an analog-to-digital converter A/D 1003 converting the output of a sensor 1005 for the processor. The processor executes high precision arithmetic and supplies the results to a video output circuit 1007 that drives a CRT 1009.

In FIG. 32, the mask bits 1023 predetermine the accumulator status to which the conditional instruction is responsive. The status bits 1021 predetermine the way in which the condition is interpreted. Note that status bits 1021 are not sensed bits from line 1026. For example, mask bits 1023 are "1101", meaning that accumulator overflow status is ignored and all other statuses are selected. Status bits 1021 are "1001", meaning that the actual accumulator condition is compared to ACC=0 AND NOT (ACC<0) and CARRY. In other words, the zero (0) in the ACC<0 bit L of FIG. 32 sensitizes the circuitry to the logical complement NOT ACC<0 (or ACC greater than zero). If this threefold condition is met, the conditional instruction is operative in this example.

Figure 33:
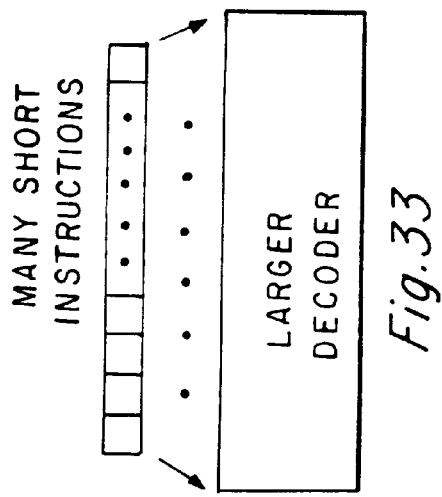
FIG. 33 is a block diagram of an instruction register and an instruction decoder lacking provision for status and mask bits.

In a further advantage of the use of these remarkable conditional instructions, FIG. 33 shows that implementing many short instructions without the status or mask bits 1021 and 1023 results in a larger decoder being required to decode the numerous different instructions. However, in FIG. 34 with one longer conditional instruction (illustrated as a conditional branch instruction), the use of status and mask bits results in a smaller decoder 1025 than would otherwise be required. This hardware gives the status and mask option to the assembler which has the capability of doing large numbers of options and generates the correct bit pattern that would have to be done in decoder PLA on a conventional processor. In this way, the decode period is shortened and there are fewer transistors in the decode systems. Decode of the branch instruction is sped up, fewer transistors are required for the implementation and there is greater flexibility.

In the conditional branch instruction feature, a branch is sometimes required. However, pipeline hits are minimized by conjoining various status conditions as in FIG. 32. For example, in extended precision arithmetic, in doing an add, it may be necessary to look at the carry bit if there is a positive value, but there is no need to do an operation based on there being a negative value. Therefore, the conditional branch instruction senses the simultaneous presence of both carry and positive conditions as shown in FIG. 32.

Figure 34:
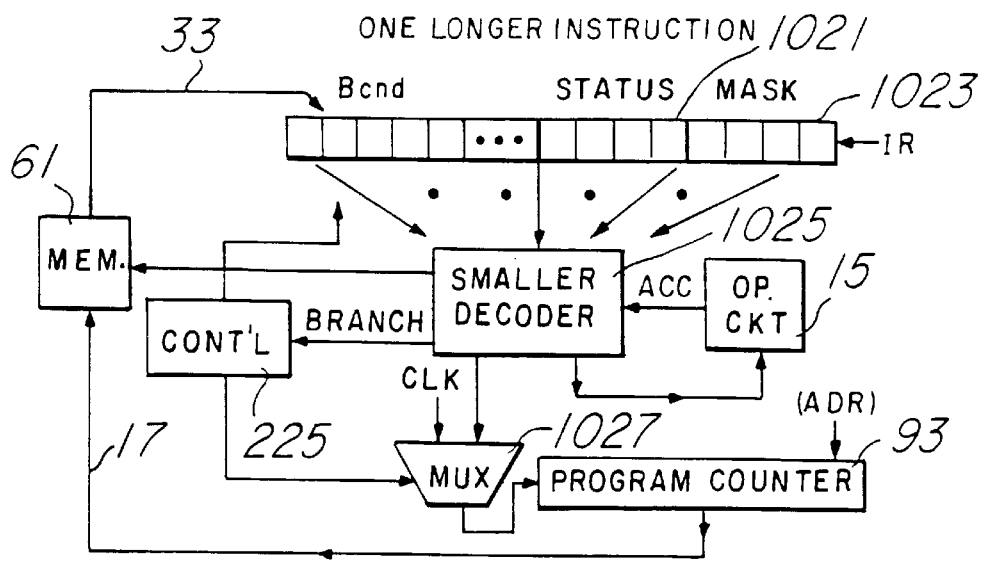
FIG. 34 is a block diagram detailing part of the improved data processing device of FIG. 1A having an instruction register and decoder with provision for conditional instructions with status and mask bits.

In FIG. 34, an operation circuit such as computation unit 15 of FIGS. 1A and 34 acts as a circuit that has status conditions wherein a particular set of status conditions can occur in operation of the circuit. Instruction register IR holds a conditional branch instruction that is conditional on a particular set of the status conditions. The decoder 1025 is connected to instruction register IR and operation circuit 15. Then the program counter 93 is coupled to decoder 1025 via a MUX 1027 so that a branch address ADR is entered into the program counter 93 in response to the branch instruction when the particular set of the status conditions of the circuit 15 are present. Otherwise, MUX 1027 selects clock pulses which merely increment the program counter. In many cases, not all of the status conditions will be actually occurring in circuit 15 and no branch occurs, thus avoiding a pipeline hit. The program counter 93 contents are used to address the program memory 61 which then enters a subsequent instruction into the instruction register IR.

The conditional instructions are advantageously utilized in any application where there is insufficient resolution in the word length of the processor in the system and it is desired to use double or higher multiple precision. For example, audio operations often require more than 16 bits. In a control algorithm, some part of the control algorithm may require more than 16 bits of accuracy.

Figure 35:
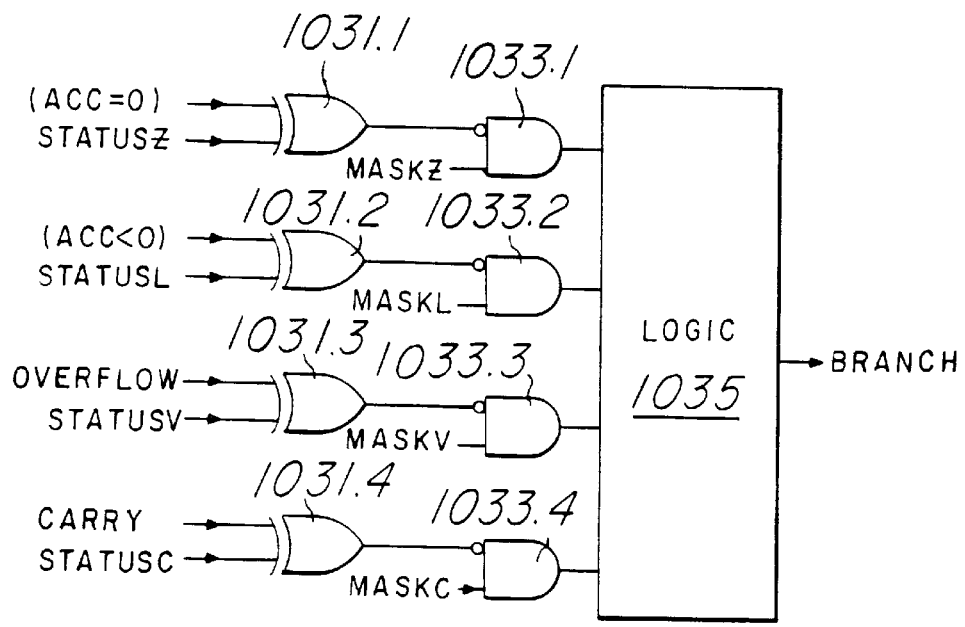
FIG. 35 is a partially schematic, partially block diagram of circuitry for implementing the status and mask bits of FIGS. 32 and 34.

FIG. 35 shows a specific example of logic for implementing the status and mask bits 1021 and 1023 of FIGS. 31, 32 and 34. In FIG. 35, the actual status of operation circuit 15 ((ACC=0), (ACC<0), overflow, (CARRY)) is compared in exclusive OR gates 1031.1, 1031.2, 1031.3 and 1031.4 with the status bits Z, L, V and C of the status register 1021. If the status is actually occurring, then the respective XOR gate supplies as active low to its corresponding AND gate 1033.1, 1033.2, 1033.3 or 1033.4. An additional input of each of the AND gates 1033 is qualified or disabled by with a corresponding high active mask bit Z, L, V or C. In this way, only the appropriate conditions are selectively applied to a logic circuit 1035 which selects for the appropriate conjunctions of conditions to which the conditional set is sensitive. If the conjunction of conditions is present, then a branch output of logic 1035 is activated to the control circuit 225 of FIG. 34.

Figure 36:
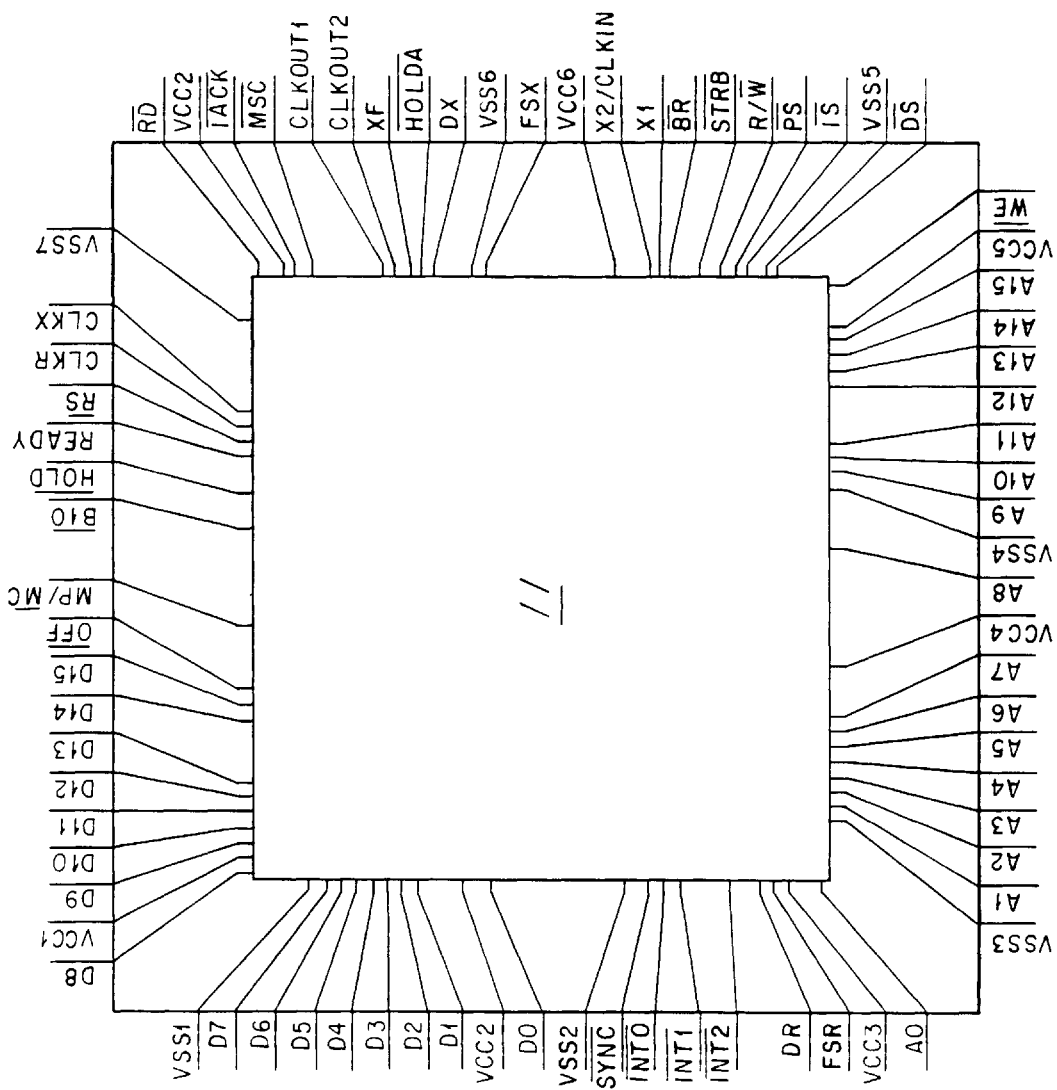
FIG. 36 is a pictorial of an improved pin-out or bond-out configuration for a chip carrier for the data processing device of FIGS. 1A and 1B illustrating improvements applicable to configurations for electronic parts generally.

FIG. 36 shows a pin-out or bond-out option for device 11. In FIG. 36, device 11 is terminated in an 84 pin CERQUAD package. The pin fuctions are described in a SIGNAL DESCRIPTIONS appendix hereinbelow. Advantageously, the arrangement of terminals and design of this pin-out concept prevents damage to device 11 even when the chip is mistakenly misoriented in a socketing process.

Figure 37:
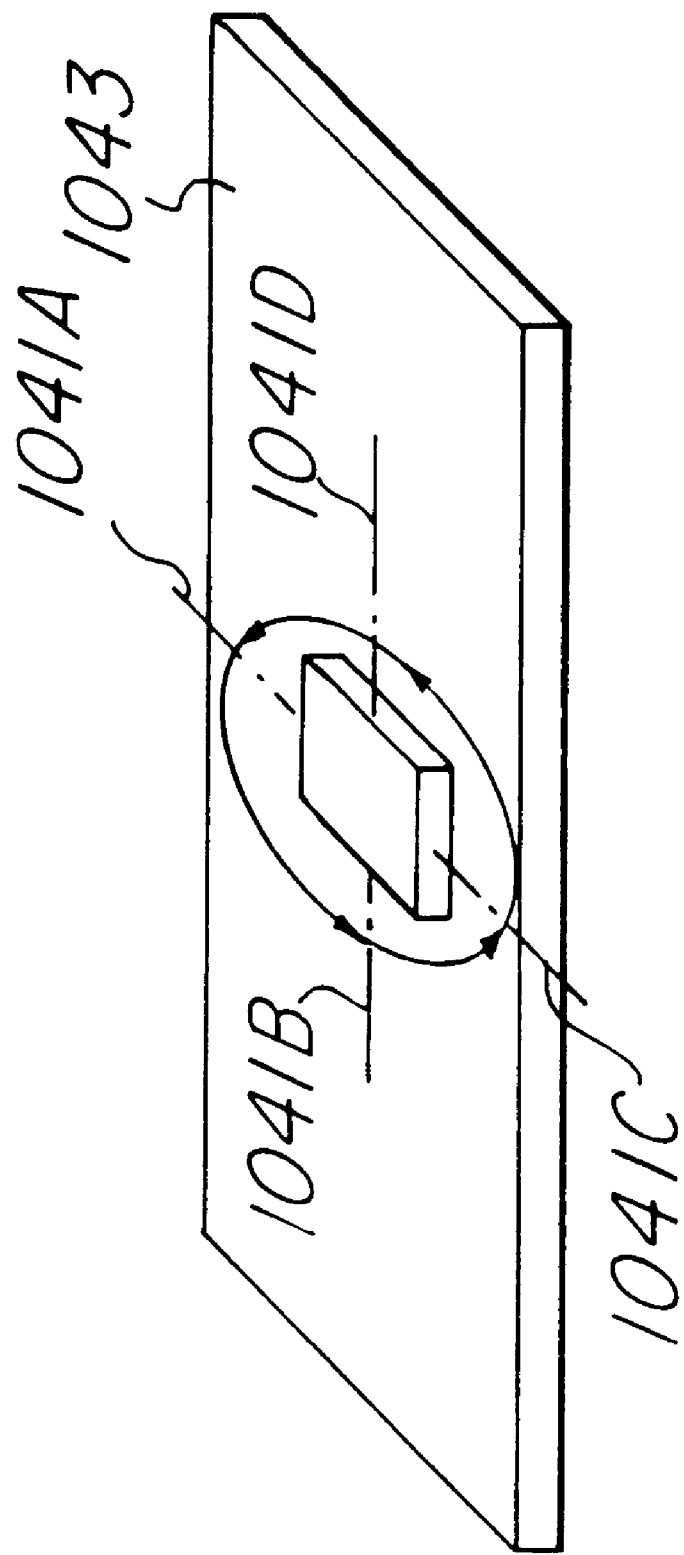
FIG. 37 is a pictorial view of four orientations of the chip carrier of FIG. 36 on a printed circuit in manufacture.

As shown in FIG. 37, the chip package can be oriented in any one of four directions 1041A, 1041B, 1041C and 1041D. Device 11 is an example of an electronic circuit having a location for application of power supply voltage at seven terminals $V_{cc1-7}$. There are also seven ground pins $V_{ss1-7}$. The numerous leads are used to apply power to different areas of device 11 to isolate inputs and internal logic from output drivers which are more likely to produce noise. Especially on very high speed processors, substantial currents can be drawn which causes voltages on the printed circuit ground plane. The buses that switch hard and fast are thus isolated from buses that are not switching. Address and data are isolated from control lines so that when they switch hard and fast wherein all the addresses switch at the same time, it will not affect the other bus because the ground is isolated. Likewise, other output pins that are not memory oriented or have to be stable at the times that addressing is occurring are also not affected because of the isolation. Therefore, the isolation of the ground and power plane is optimized so that hard switching devices do not cause noise on pins that are not switching at that time and need to be stable in voltage.

The exemplary embodiment of FIG. 36 is an 84 pin J-leaded device wherein the terminals comprise contact surfaces adapted for surface mounting. The terminals are physically symmetric with quadrilateral symmetry.

In FIGS. 36 and 37, the symmetrical placement of the power and ground pins is such that any of the four orientations of the device causes the power and ground pins to plug into other power and ground pins respectively. In a further advantageous feature, a disabling terminal designated as the OFF- pin is provided so that any placement of the device 11 other than the correct orientation automatically aligns this low active OFF- pin to a ground connection on printed circuit board 1043. When the OFF- pin is driven low, then all outputs of device 11 are tristated so that none of the outputs can be driving against anything else in the system. In this way, device 11 responds to application of the ground voltage to the disabling terminal for non-destructively disabling the electronic circuitry of the device 11.

Put another way, the chip carrier of FIG. 36 is an example of a keyless device package for holding the electronic circuit and includes terminals secured to the device package for the supply voltage output locations and disable terminal wherein every turning reorientation of the entire electronic device which translates the terminals to each other translates a terminal for supply voltage to another terminal for supply voltage. Likewise, terminals for ground are either translated to other terminals for ground or to the terminal for disablement. In some embodiments, it may be desirable to make the disable terminal high active and in those embodiments, the disabled terminal is translated to a supply voltage terminal for this disabling purpose.

The range of applications of this pin-out concept is extremely broad. The device 11 can be any electronic device such as a digital signal processor, a graphic signal processor, a microprocessor, a memory circuit, an analog linear circuit, an oscillator, a resistor pack, or any other electrical circuit. The device package suitably is provided as a surface mount package or a package with pins according to the single-in-line design or dual in-line design. The protective terminal arrangement improvement applies to cable interconnects, a printed circuit board connecting to a back plane or any electrical component interconnection with symmetrical connection.

Figure 38:
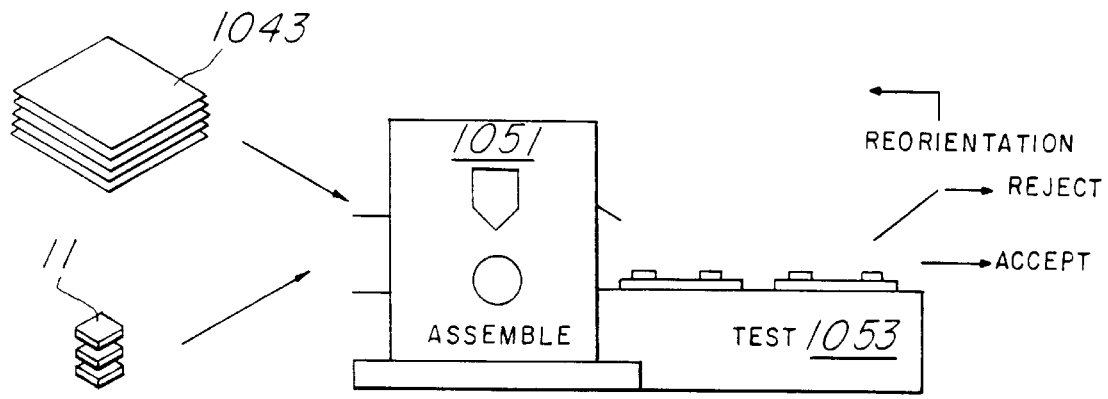
FIG. 38 is a pictorial of an automatic chip socketing machine and test area for rejecting and accepting printed circuits of FIG. 37 in manufacture.

In FIG. 38, an automatic chip socketing machine 1051 is provided with PC boards 1043 and devices 11 for manufacturing assembly of final systems. If the devices 11 are mistakenly misoriented in the loading of socketing machine 1051, there is no damage to the chip upon reaching test apparatus 1053 even though the chip orientation is completely incorrect in its placement on the board 1043.

It would be undesirable for misorientation of the device to allow voltages to be applied in test area 1053 which execute a strain on the output drivers of the device as well as possibly straining some of the circuits of other chips on the printed circuit board 1043. Such strain might result in shorter lifetimes and a not insignificant reliability issue for the system. Advantageously, as indicated in the process diagram of FIG. 39, this reliability issue is obviated according to the pin-out of the preferred embodiment of FIG. 36.

In this processing method, operations commence with a START 1061 and proceed to a step 1063 to load the circuit boards 1043 into machine 1051. Then, in a step 1065, keyless devices 11 are loaded into machine 1051. Next, in a step 1067, machine 1051 is operated and the devices are socketed in a step 1069. Subsequently, in test area 1053, the board assemblies are energized in step 1071 of FIG. 39. Test equipment determines whether the assemblies are disabled in their operation. This step is process step 1073. If not, then a step 1075 passes on the circuit assemblies which have been electrically ascertained to be free of disablement to further manufacturing or packaging steps since these circuit assemblies have proper orientation of the keyless electronic devices.

Figure 39:
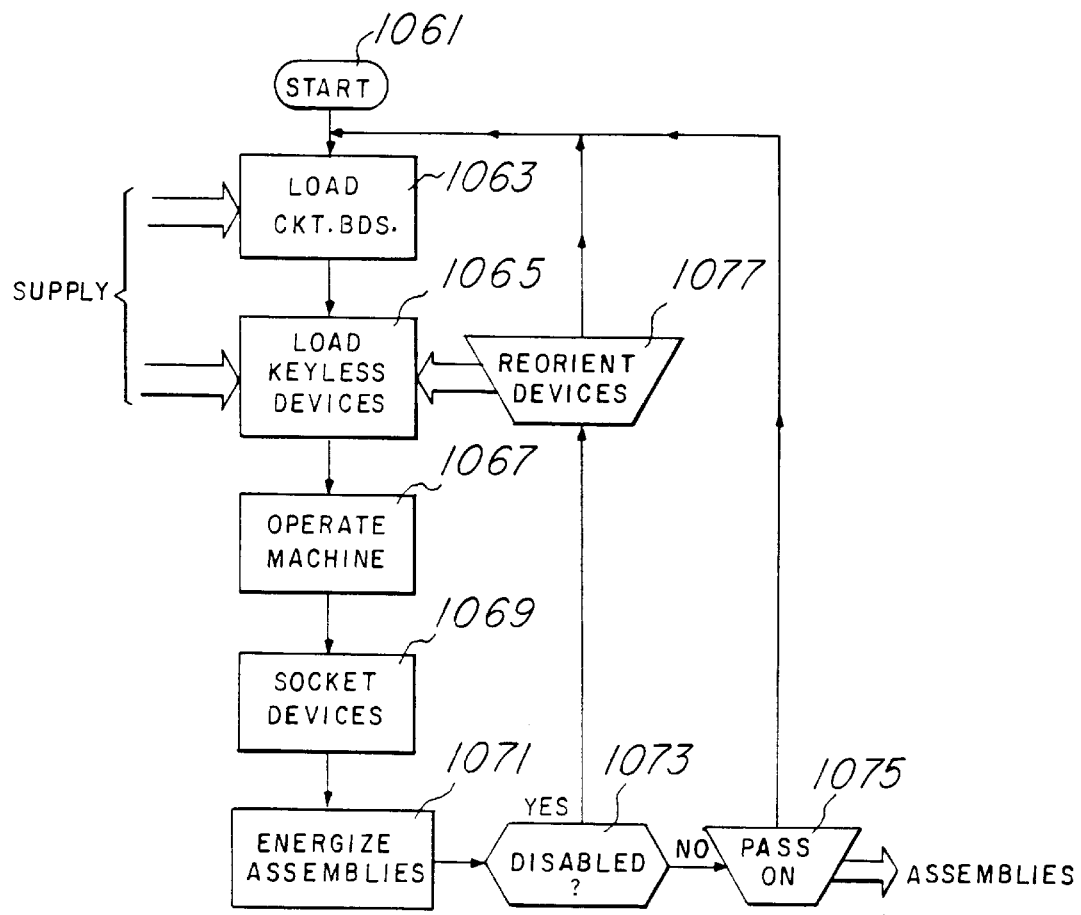
FIG. 39 is a processing method of manufacture utilizing the system of FIG. 38.

If any of the circuit boards 1043 has misoriented devices, then test equipment 1053 determines which circuit assemblies are disabled in step 1073 of FIG. 39 and operations proceed to a step 1077 to reorient the devices 11 on the printed circuit boards 1043 and to reload the keyless devices starting with step 1065. Operations then pass from both steps 1075 and 1077 to step 1063 for re-execution of the process.

Figure 40:
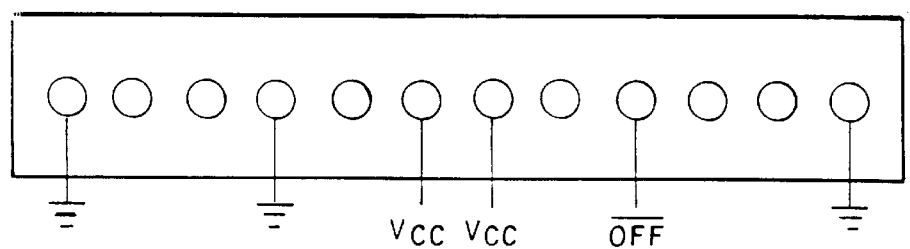
FIG. 40 is a version of the improved pin-out configuration in a single in-line type of chip.

In FIG. 40, another preferred embodiment of the pin-out feature is implemented in a single in-line chip wherein multiple power terminals VCC and ground are provided. In this way, if the chip is reversed, the power pins and ground pins are still lined up. An OFF- pin translates to a ground pin on the symmetrically opposite side of this single in-line package.

Figure 41:
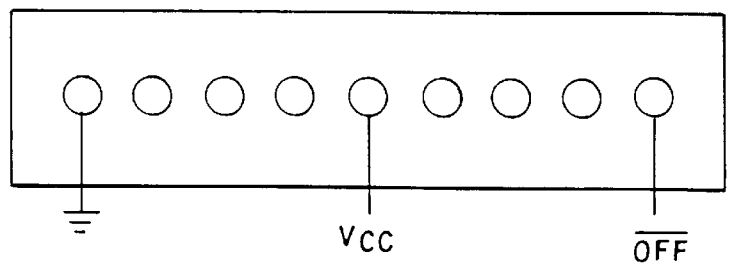
FIG. 41 is another version of the improved pin-out configuration.

In FIG. 41, the single in-line concept has an odd number of pins with the power pin VCC supplied to the center of symmetry. A ground pin is at a symmetrically opposite end of the chip from the disabling terminal OFF-. Then, when the chip is tested after assembly and the system is not working, the manufacturer can reorient the chip and not have to be concerned about possibly having damaged the chip or the printed circuit assembly into which it has been introduced.

Figure 42:
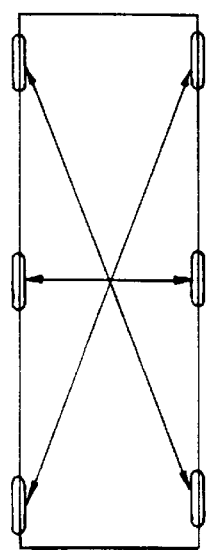
FIG. 42 is a pictorial of a dual in-line construction wherein the improved pin-out configuration is applicable and showing translation arrows.

FIG. 42 shows a sketch of terminals on a dual in-line package. Crossed arrows illustrate the translation concept of the reorientation. It is to be understood of course that reorientation does not connect terminals to terminals. Reorientation instead connects terminals on the chip, which have one purpose, to corresponding contacts on the board that have the purpose for which a symmetrically opposing pin on the chip is intended. In this way, the concept of translation of terminals to terminals is effective to analyze the advantages of the preferred embodiments of this pin-out improvement.

Figure 43:
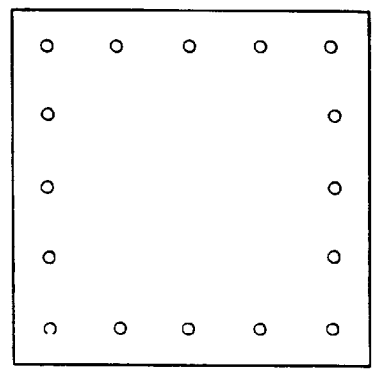
FIG. 43 is a pictorial of some pins of a pin grid array construction wherein the improved pin-out configuration is applicable.

As indicated in the sketch of FIG. 43, the further embodiments of the pin-out improvement are applicable to pin grid array (PGA) terminal and package configurations.

In still other embodiments wherein the terminals have four possible orientations, the terminals suitably include at least one power terminal, an odd number of ground terminals, and at least one disable terminal or a whole number multiple.

In still other embodiments, the terminals include ground and disable terminals and have a number of possible orientations wherein the sum of the number of ground terminals and the number of disable terminals is equal to or is a whole number multiple of the number of possible orientations.

Structurally on chip, the preferred embodiment as thus far described has the disabling circuitry to force all the pins to float. In still other embodiments, all output pins translate to other output pins. All VCC pins translate to other VCC pins and all ground pins translate to other ground pins. Any pin can translate to a no-connect pin.

Where all-hardware embodiments have been shown herein, it should be understood that other embodiments of the invention can employ software or microcoded firmware. The process diagrams herein are also representative of flow diagrams for software-based embodiments. Thus, the invention is practical across a spectrum of software, firmware and hardware.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

| INSTRUCTION | MNEU | OPCODE | | IMMEDIATE | | | |
|---|---|---|---|---|---|---|---|
| LOAD AR FROM ADDRESSED DATA | LAR | 0000 0 A R X | I A A A   A A A A | | | | |
| ADD TO AR SHORT IMMEDIATE | ADRK | 0000 1000 | I I I I   I I I I | | | | |
| SUBTRACT FROM AR SHORT IMMEDIATE | SBRK | 0000 1001 | I I I I   I I I I | | | | |
| MODIFY AUXILIARY REGISTER | MAR | 0000 1010 | I A A A   A A A A | | | | |
| EXCLUSIVE OR DBMR TO DATA VALUE | XPL | 0000 1011 | I A A A   A A A A | | | | |
| OR DBMR TO DATA VALUE | OPL | 0000 1100 | I A A A   A A A A | | | | |
| AND DBMR WITH DATA VALUE | APL | 0000 1101 | I A A A   A A A A | | | | |
| COMPARE DBMR TO DATA VALUE | CPL | 0000 1111 | I A A A   A A A A | | | | |
| TEST BIT SPECIFIED IMMEDIATE | BIT | 0001 B I T X | I A A A   A A A A | | | | |
| LOAD ACCUMULATOR WITH SHIFT | LAC | 0010 S H F T | I A A A   A A A A | | | | |
| ADD TO ACCUMULATOR WITH SHIFT | ADD | 0011 S H F T | I A A A   A A A A | | | | |
| SUBTRACT FROM ACCUMULATOR WITH SHIFT | SUB | 0100 S H F T | I A A A   A A A A | | | | |
| ZERO ACC, LOAD HIGH ACC WITH ROUNDING | ZALR | 0101 0000 | I A A A   A A A A | | | | |
| ZERO ACC, LOAD HIGH ACCUMULATOR | ZALH | 0101 0001 | I A A A   A A A A | | | | |
| ZERO ACC, LOAD LOW ACC WITH SIGN SUPPRESSED | ZALS | 0101 0010 | I A A A   A A A A | | | | |
| LOAD ACC WITH SHIFT SPECIFIED BY TREG1 | LACT | 0101 0011 | I A A A   A A A A | | | | |
| MULTIPLY DATA VALUE TIMES TREG0 | MPY | 0101 0100 | I A A A   A A A A | | | | |
| MULTIPLY UNSIGNED DATA VALUE TIMES TREG0 | MPYU | 0101 0101 | I A A A   A A A A | | | | |
| TEST BIT IN DATA VALUE AS SPECIFIED BY TREG2 | BITT | 0101 0110 | I A A A   A A A A | | | | |
| NORMALIZE ACCUMULATOR | NORM | 0101 0111 | I A A A   A A A A | | | | |
| LOAD STATUS | LST | 0101 1000 | I A A A   A A A A | | | | |
| LOAD STATUS REGISTER 1 | LST1 | 0101 1001 | I A A A   A A A A | | | | |
| MULT/ACC WITH SOURCE ADDRESS IN DBMR | MADS | 0101 1010 | I A A A   A A A A | | | | |
| MULT/ACC WITH SOURCE ADRS IN DBMR AND DMOV | MADD | 0101 1011 | I A A A   A A A A | | | | |
| BLOCK MOVE DATA TO DATA WITH SOURCE IN DBMR | BDSD | 0101 1100 | I A A A   A A A A | | | | |
| BLOCK MOVE DATA TO DATA WITH DEST IN DBMR | BDDD | 0101 1101 | I A A A   A A A A | | | | |
| BLOCK MOVE DATA TO PROG WITH SOURCE IN DBMR | BPSD | 0101 1110 | I A A A   A A A A | | | | |
| BLOCK MOVE DATA TO DATA DEST LONG IMMEDIATE | BKDK | 0101 1111 | I A A A   A A A A | A A A A | A A A A | A A A A | A A A A |
| ADD TO ACCUMULATOR WITH CARRY | ADDC | 0110 0000 | I A A A   A A A A | | | | |
| ADD TO HIGH ACCUMULATOR | ADDH | 0110 0001 | I A A A   A A A A | | | | |
| ADD TO LOW ACCUMULATOR WITH SIGN SUPPRESSED | ADDS | 0110 0010 | I A A A   A A A A | | | | |
| ADD TO ACC WITH SHIFT SPECIFIED BY TREG1 | ADDT | 0110 0011 | I A A A   A A A A | | | | |
| MULTIPLY TREG0 BY DATA, ADD PREVIOUS PRODUCT | MPYA | 0110 0100 | I A A A   A A A A | | | | |
| DATA TO TREG0, SQUARE IT, ADD PREG TO ACC | SQRA | 0110 0101 | I A A A   A A A A | | | | |
| LOAD TREG0 AND ACCUMULATE PREVIOUS PRODUCT | LTA | 0110 0110 | I A A A   A A A A | | | | |
| LOAD TREG0 WITH DATA SHIFT, ADD PREG TO ACC | LTD | 0110 0111 | I A A A   A A A A | | | | |
| LOAD TREG0 | LT | 0110 1000 | I A A A   A A A A | | | | |
| LOAD TREG0 AND LOAD ACC WITH PREG | LTP | 0110 1001 | I A A A   A A A A | | | | |
| EXCLUSIVE OR ACCUMULATOR WITH DATA VALUE | XOR | 0110 1010 | I A A A   A A A A | | | | |
| OR ACCUMULATOR WITH DATA VALUE | OR | 0110 1011 | I A A A   A A A A | | | | |
| AND ACCUMULATOR WITH DATA VALUE | AND | 0110 1100 | I A A A   A A A A | | | | |
| TABLE WRITE | TBLW | 0110 1101 | I A A A   A A A A | | | | |
| RESERVED | | | | | | | |
| RESERVED | | | | | | | |
| SUBTRACT FROM ACCUMULATOR WITH BORROW | SUBB | 0111 0000 | I A A A   A A A A | | | | |

-continued

| | | | | | | | | |
|---|---|---|---|---|---|---|---|---|
| SUBTRACT FROM HIGH ACCUMULATOR | SUBH | 0 1 1 1 | 0 0 0 1 | I A A A | A A A A | | | |
| SUBTRACT FROM ACC WITH SIGN SUPPRESSED | SUBS | 0 1 1 1 | 0 0 1 0 | I A A A | A A A A | | | |
| SUBTRACT FROM ACC, SHIFT SPECIFIED BY TREG1 | SUBT | 0 1 1 1 | 0 0 1 1 | I A A A | A A A A | | | |
| MULTIPLY TREG0 BY DATA, ACC - PREG | MPYS | 0 1 1 1 | 0 1 0 0 | I A A A | A A A A | | | |
| DATA TO TREG0, SQUARE IT, ACC - PREG | SQRS | 0 1 1 1 | 0 1 0 1 | I A A A | A A A A | | | |
| LOAD TREG0 AND SUBTRACT PREVIOUS PRODUCT | LTS | 0 1 1 1 | 0 1 1 0 | I A A A | A A A A | | | |
| CONDITIONAL SUBTRACT | SUBC | 0 1 1 1 | 0 1 1 1 | I A A A | A A A A | | | |
| REPEAT INSTRUCTION AS SPECIFIED BY DATA | RPT | 0 1 1 1 | 1 0 0 0 | I A A A | A A A A | | | |
| LOAD DATA PAGE POINTER WITH ADDRESSED DATA | LDP | 0 1 1 1 | 1 0 0 1 | I A A A | A A A A | | | |
| PUSH DATA MEMORY VALUE ONTO PC STACK | PSHD | 0 1 1 1 | 1 0 1 0 | I A A A | A A A A | | | |
| DATA MOVE IN DATA MEMORY | DMOV | 0 1 1 1 | 1 0 1 1 | I A A A | A A A A | | | |
| LOAD HIGH PRODUCT REGISTER | LPH | 0 1 1 1 | 1 1 0 0 | I A A A | A A A A | | | |
| RESERVED | | | | | | | | |
| RESERVED | | | | | | | | |
| RESERVED | | | | | | | | |
| STORE LOW ACCUMULATOR WITH SHIFT | SACL | 1 0 0 0 | 0 S H F | I A A A | A A A A | | | |
| STORE HIGH ACCUMULATOR WITH SHIFT | SACH | 1 0 0 0 | 1 S H F | I A A A | A A A A | | | |
| STORE AR TO ADDRESSED DATA | SAR | 1 0 0 1 | 0 A R X | I A A A | A A A A | | | |
| STORE STATUS | SST | 1 0 0 1 | 1 0 0 0 | I A A A | A A A A | | | |
| STORE STATUS REGISTER 1 | SST1 | 1 0 0 1 | 1 0 0 1 | I A A A | A A A A | | | |
| TABLE READ | TBLR | 1 0 0 1 | 1 0 1 0 | I A A A | A A A A | | | |
| STORE LOW PRODUCT REGISTER | SPL | 1 0 0 1 | 1 0 1 1 | I A A A | A A A A | | | |
| STORE HIGH PRODUCT REGISTER | SPH | 1 0 0 1 | 1 1 0 0 | I A A A | A A A A | | | |
| POP STACK TO DATA MEMORY | POPD | 1 0 0 1 | 1 1 0 1 | I A A A | A A A A | | | |
| BLOCK MOVE PROG TO DATA WITH SOURCE IN DBMR | BPDS | 1 0 0 1 | 1 1 1 0 | I A A A | A A A A | | | |
| BLOCK MOVE FROM PROGRAM TO DATA MEMORY | BLKP | 1 0 0 1 | 1 1 1 1 | I A A A | A A A A | A A A A | A A A A | A A A A A A A A |
| MULTIPLY/ACCUMULATE | MAC | 1 0 1 0 | 0 0 0 0 | I A A A | A A A A | A A A A | A A A A | A A A A A A A A |
| MULTIPLY/ACCUMULATE WITH DATA SHIFT | MACD | 1 0 1 0 | 0 0 0 1 | I A A A | A A A A | A A A A | A A A A | A A A A A A A A |
| BRANCH UNCONDITIONAL WITH AR UPDATE | B | 1 0 1 0 | 0 0 1 0 | I A A A | A A A A | A A A A | A A A A | A A A A A A A A |
| CALL UNCONDITIONAL WITH AR UPDATE | CALL | 1 0 1 0 | 0 0 1 1 | I A A A | A A A A | A A A A | A A A A | A A A A A A A A |
| BRANCH AR = 0 WITH AR UPDATE | BANZ | 1 0 1 0 | 0 1 0 0 | I A A A | A A A A | A A A A | A A A A | A A A A A A A A |
| BRANCH UNCONDITIONAL WITH AR UPDATE DELAYED | BD | 1 0 1 0 | 0 1 0 1 | I A A A | A A A A | A A A A | A A A A | A A A A A A A A |
| CALL UNCONDITIONAL WITH AR UPDATE DELAYED | CALD | 1 0 1 0 | 0 1 1 0 | I A A A | A A A A | A A A A | A A A A | A A A A A A A A |
| BRANCH AR = 0 WITH AR UPDATE DELAYED | BAZD | 1 0 1 0 | 0 1 1 1 | I A A A | A A A A | A A A A | A A A A | A A A A A A A A |
| LOAD MEMORY MAPPED REGISTER | LMMR | 1 0 1 0 | 1 0 0 0 | I A A A | A A A A | A A A A | A A A A | A A A A A A A A |
| STORE MEMORY MAPPED REGISTER | SMMR | 1 0 1 0 | 1 0 0 1 | I A A A | A A A A | A A A A | A A A A | A A A A A A A A |
| BLOCK MOVE FROM DATA TO DATA MEMORY | BLKD | 1 0 1 0 | 1 0 1 0 | I A A A | A A A A | A A A A | A A A A | A A A A A A A A |
| STORE LONG IMMEDIATE TO DATA | SPLK | 1 0 1 0 | 1 0 1 1 | I A A A | A A A A | I I I I | I I I I | I I I I I I I I |
| EXCLUSIVE OR LONG IMMEDIATE WITH DATA VALUE | XPLK | 1 0 1 0 | 1 1 0 0 | I A A A | A A A A | I I I I | I I I I | I I I I I I I I |
| OR LONG IMMEDIATE WITH DATA VALUE | OPLK | 1 0 1 0 | 1 1 0 1 | I A A A | A A A A | I I I I | I I I I | I I I I I I I I |
| AND LONG IMMEDIATE WITH DATA VALUE | APLK | 1 0 1 0 | 1 1 1 0 | I A A A | A A A A | I I I I | I I I I | I I I I I I I I |
| COMPARE DATA WITH LONG IMMEDIATE SET TC IF = | CPLK | 1 0 1 0 | 1 1 1 1 | I A A A | A A A A | I I I I | I I I I | I I I I I I I I |
| LOAD AR SHORT IMMEDIATE | LARK | 1 0 1 1 | 0 A R X | I I I I | I I I I | | | |
| ADD TO LOW ACC SHORT IMMEDIATE | ADDK | 1 0 1 1 | 1 0 0 0 | I I I I | I I I I | | | |
| LOAD ACC SHORT IMMEDIATE | LACK | 1 0 1 1 | 1 0 0 1 | I I I I | I I I I | | | |
| SUBTRACT FROM ACC SHORT IMMEDIATE | SUBK | 1 0 1 1 | 1 0 1 0 | I I I I | I I I I | | | |
| REPEAT INST SPECIFIED BY SHORT IMMEDIATE | RPTK | 1 0 1 1 | 1 0 1 1 | I I I I | I I I I | | | |
| LOAD DATA PAGE IMMEDIATE SHORT IMMEDIATES | LDPK | 1 0 1 1 | 1 1 0 1 | I I I I | I I I I | | | |
| ABSOLUTE VALUE OF ACCUMULATOR | ABS | 1 0 1 1 | 1 1 1 0 | 0 0 0 0 | 0 0 0 0 | | | |
| COMPLEMENT ACCUMULATOR | CMPL | 1 0 1 1 | 1 1 1 0 | 0 0 0 0 | 0 0 0 1 | | | |
| NEGATE ACCUMULATOR | NEG | 1 0 1 1 | 1 1 1 0 | 0 0 0 0 | 0 0 1 0 | | | |
| LOAD ACCUMULATOR WITH PRODUCT | PAC | 1 0 1 1 | 1 1 1 0 | 0 0 0 0 | 0 0 1 1 | | | |
| ADD PRODUCT TO ACCUMULATOR | APAC | 1 0 1 1 | 1 1 1 0 | 0 0 0 0 | 0 1 0 0 | | | |
| SUBTRACT PRODUCT FROM | SPAC | 1 0 1 1 | 1 1 1 0 | 0 0 0 0 | 0 1 0 1 | | | |

-continued

| | | | | | |
|---|---|---|---|---|---|
| ACCUMULATOR | | | | | |
| ADD BPR TO ACCUMULATOR | ABPR | 1 0 1 1 | 1 1 1 0 | 0 0 0 0 | 0 1 1 0 |
| LOAD ACCUMULATOR WITH BPR | LBPR | 1 0 1 1 | 1 1 1 0 | 0 0 0 0 | 0 1 1 1 |
| SUBTRACT BPR FROM ACCUMULATOR | SBPR | 1 0 1 1 | 1 1 1 0 | 0 0 0 0 | 1 0 0 0 |
| SHIFT ACCUMULATOR 1 BIT LEFT | SFL | 1 0 1 1 | 1 1 1 0 | 0 0 0 0 | 1 0 0 1 |
| SHIFT ACCUMULATOR 1 BIT RIGHT | SFR | 1 0 1 1 | 1 1 1 0 | 0 0 0 0 | 1 0 1 0 |
| ROTATE ACCUMULATOR 1 BIT LEFT | ROL | 1 0 1 1 | 1 1 1 0 | 0 0 0 0 | 1 1 0 0 |
| ROTATE ACCUMULATOR 1 BIT RIGHT | ROR | 1 0 1 1 | 1 1 1 0 | 0 0 0 0 | 1 1 0 1 |
| ADD ACCB TO ACCUMULATOR | ADDR | 1 0 1 1 | 1 1 1 0 | 0 0 0 1 | 0 0 0 0 |
| ADD ACCB TO ACCUMULATOR WITH CARRY | ADCR | 1 0 1 1 | 1 1 1 0 | 0 0 0 1 | 0 0 0 1 |
| AND ACCB WITH ACCUMULATOR | ANDR | 1 0 1 1 | 1 1 1 0 | 0 0 0 1 | 0 0 1 0 |
| OR ACCB WITH ACCUMULATOR | ORR | 1 0 1 1 | 1 1 1 0 | 0 0 0 1 | 0 0 1 1 |
| ROTATE ACCB AND ACCUMULATOR LEFT | ROLR | 1 0 1 1 | 1 1 1 0 | 0 0 0 1 | 0 1 0 0 |
| ROTATE ACCB AND ACCUMULATOR RIGHT | RORR | 1 0 1 1 | 1 1 1 0 | 0 0 0 1 | 0 1 0 1 |
| SHIFT ACCB AND ACCUMULATOR LEFT | SFLR | 1 0 1 1 | 1 1 1 0 | 0 0 0 1 | 0 1 1 0 |
| SHIFT ACCB AND ACCUMULATOR RIGHT | SFRR | 1 0 1 1 | 1 1 1 0 | 0 0 0 1 | 0 1 1 1 |
| SUBTRACT ACCB FROM ACCUMULATOR | SUBR | 1 0 1 1 | 1 1 1 0 | 0 0 0 1 | 1 0 0 0 |
| SUBTRACT ACCB FROM ACCUMULATOR WITH CARRY | SBBR | 1 0 1 1 | 1 1 1 0 | 0 0 0 1 | 1 0 0 1 |
| EXCLUSIVE OR ACCB WITH ACCUMULATOR | XORR | 1 0 1 1 | 1 1 1 0 | 0 0 0 1 | 1 0 1 0 |
| STORE ACC IN ACCB IF ACC > ACCR | CRGT | 1 0 1 1 | 1 1 1 0 | 0 0 0 1 | 1 0 1 1 |
| STORE ACC IN ACCB IF ACC < ACCR | CRLT | 1 0 1 1 | 1 1 1 0 | 0 0 0 1 | 1 1 0 0 |
| EXCHANGE ACCR WITH ACCUMULATOR | EXAR | 1 0 1 1 | 1 1 1 0 | 0 0 0 1 | 1 1 0 1 |
| STORE ACCUMULATOR IN ACCB | SACR | 1 0 1 1 | 1 1 1 0 | 0 0 0 1 | 1 1 1 0 |
| LOAD ACCUMULATOR WITH ACCB | LACR | 1 0 1 1 | 1 1 1 0 | 0 0 0 1 | 1 1 1 1 |
| BRANCH ADDRESSED BY ACC | BACC | 1 0 1 1 | 1 1 1 0 | 0 0 1 0 | 0 0 0 0 |
| BRANCH ADDRESSED BY ACC DELAYED | BACD | 1 0 1 1 | 1 1 1 0 | 0 0 1 0 | 0 0 0 1 |
| IDLE | IDLE | 1 0 1 1 | 1 1 1 0 | 0 0 1 0 | 0 0 1 0 |
| PUSH LOW ACCUMULATOR TO PC STACK | PUSH | 1 0 1 1 | 1 1 1 0 | 0 0 1 1 | 0 0 0 0 |
| POP PC STACK TO LOW ACCUMULATOR | POP | 1 0 1 1 | 1 1 1 0 | 0 0 1 1 | 0 0 0 1 |
| CALL SUBROUTINE ADDRESSED BY ACC | CALA | 1 0 1 1 | 1 1 1 0 | 0 0 1 1 | 0 0 1 0 |
| CALL SUBROUTINE ADDRESSED BY ACC DELAYED | CLAD | 1 0 1 1 | 1 1 1 0 | 0 0 1 1 | 0 0 1 1 |
| TRAP TO LOW VECTOR | TRAP | 1 0 1 1 | 1 1 1 0 | 0 0 1 1 | 0 1 0 0 |
| TRAP TO LOW VECTOR DELAYED | TRPD | 1 0 1 1 | 1 1 1 0 | 0 0 1 1 | 0 1 0 1 |
| EMULATOR TRAP TO LOW VECTOR DELAYED | ETRP | 1 0 1 1 | 1 1 1 0 | 0 0 1 1 | 0 1 1 1 |
| RETURN FROM INTERRUPT | RETI | 1 0 1 1 | 1 1 1 0 | 0 0 1 1 | 1 0 0 0 |
| RETURN FROM INTERRUPT DELAYED | RTID | 1 0 1 1 | 1 1 1 0 | 0 0 1 1 | 1 0 0 1 |
| RETURN FROM INTERRUPT WITH ENABLE | RETE | 1 0 1 1 | 1 1 1 0 | 0 0 1 1 | 1 0 1 0 |
| RETURN FROM INTERRUPT WITH ENABLE DELAYED | RTED | 1 0 1 1 | 1 1 1 0 | 0 0 1 1 | 1 0 1 1 |
| GLOBAL INTERRUPT ENABLE | EINT | 1 0 1 1 | 1 1 1 0 | 0 1 0 0 | 0 0 0 0 |
| GLOBAL INTERRUPT DISABLE | DINT | 1 0 1 1 | 1 1 1 0 | 0 1 0 0 | 0 0 0 1 |
| RESET OVERFLOW MODE | ROVM | 1 0 1 1 | 1 1 1 0 | 0 1 0 0 | 0 0 1 0 |
| SET OVERFLOW MODE | SOVM | 1 0 1 1 | 1 1 1 0 | 0 1 0 0 | 0 0 1 1 |
| CONFIGURE BLOCK AS DATA MEMORY | CNFD | 1 0 1 1 | 1 1 1 0 | 0 1 0 0 | 0 1 0 0 |
| CONFIGURE BLOCK AS PROGRAM MEMORY | CNFP | 1 0 1 1 | 1 1 1 0 | 0 1 0 0 | 0 1 0 1 |
| RESET SIGN EXTENSION MODE | RSXM | 1 0 1 1 | 1 1 1 0 | 0 1 0 0 | 0 1 1 0 |
| SET SIGN EXTENSION MODE | SSXM | 1 0 1 1 | 1 1 1 0 | 0 1 0 0 | 0 1 1 1 |
| SET XF PIN LOW | RXF | 1 0 1 1 | 1 1 1 0 | 0 1 0 0 | 0 1 0 0 |
| SET XF PIN HIGH | SXF | 1 0 1 1 | 1 1 1 0 | 0 1 0 0 | 1 1 0 1 |
| RESET CARRY | RC | 1 0 1 1 | 1 1 1 0 | 0 1 0 0 | 1 1 1 0 |
| SET CARRY | SC | 1 0 1 1 | 1 1 1 0 | 0 1 0 0 | 1 1 1 1 |
| RESET TC BIT | RTC | 1 0 1 1 | 1 1 1 0 | 0 1 0 0 | 1 1 1 0 |
| SET TC BIT | STC | 1 0 1 1 | 1 1 1 0 | 0 1 0 0 | 1 1 1 1 |
| RESET HOLD MODE | RHM | 1 0 1 1 | 1 1 1 0 | 0 1 0 0 | 1 0 0 0 |
| SET HOLD MODE | SHM | 1 0 1 1 | 1 1 1 0 | 0 1 0 0 | 1 0 0 1 |
| STORE PRODUCT IN BPR | SPB | 1 0 1 1 | 1 1 1 0 | 0 1 0 0 | 1 1 0 0 |
| LOAD PRODUCT FROM BPR | LPB | 1 0 1 1 | 1 1 1 0 | 0 1 0 0 | 1 1 0 1 |
| LONG IMMEDIATES | | | | | | | | | |
| MULTIPLY LONG IMMEDIATE BY TREG0 | MRKL | 1 0 1 1 | 1 1 1 0 | 1 0 0 0 | 0 0 0 0 | I I I I | I I I I | I I I I | I I I I |
| AND WITH ACC LONG IMMEDIATE | ANDK | 1 0 1 1 | 1 1 1 0 | 1 0 0 0 | 0 0 0 1 | I I I I | I I I I | I I I I | I I I I |
| OR WITH ACC LONG IMMEDIATE | ORK | 1 0 1 1 | 1 1 1 0 | 1 0 0 0 | 0 0 1 0 | I I I I | I I I I | I I I I | I I I I |
| XOR WITH ACCUMULATOR LONG IMMEDIATE | XORK | 1 0 1 1 | 1 1 1 0 | 1 0 0 0 | 0 0 1 1 | I I I I | I I I I | I I I I | I I I I |
| REPEAT NEXT INST SPECIFIED BY LONG IMMEDIATE | RPTR | 1 0 1 1 | 1 1 1 0 | 1 0 0 0 | 0 1 0 0 | I I I I | I I I I | I I I I | I I I I |
| CLEAR ACC/PREG AND REPEAT NEXT INST LONG IMMD | RPTZ | 1 0 1 1 | 1 1 1 0 | 1 0 0 0 | 0 1 0 1 | I I I I | I I I I | I I I I | I I I I |
| BLOCK REPEAT | RPTB | 1 0 1 1 | 1 1 1 0 | 1 0 0 0 | 0 1 1 0 | I I I I | I I I I | I I I I | I I I I |
| SET PREG SHIFT COUNT | SPM | 1 0 1 1 | 1 1 1 1 | 0 0 P M | 0 0 0 0 |

-continued

| | | | | | | | | | | |
|---|---|---|---|---|---|---|---|---|---|---|
| LOAD ARP IMMEDIATE | LARP | 1 0 1 1 | 1 1 1 1 | 0 A R P | 0 0 1 0 | | | | | |
| COMPARE AR WITH CMPR | CMPR | 1 0 1 1 | 1 1 1 1 | 0 A R X | 0 1 0 0 | | | | | |
| LOAD AR LONG IMMEDIATE | LRLK | 1 0 1 1 | 1 1 1 1 | 0 A R X | 0 1 0 1 | I I I I | I I I I | I I I I | I I I I |
| BARREL SHIFT ACC RIGHT | BSAR | 1 0 1 1 | 1 1 1 1 | S H I F | 1 0 0 0 | | | | | |
| LOAD ACC LONG IMMEDIATE WITH SHIFT | LALK | 1 0 1 1 | 1 1 1 1 | S H F T | 1 0 0 1 | I I I I | I I I I | I I I I | I I I I |
| ADD TO ACC LONG IMMEDIATE WITH SHIFT | ADLK | 1 0 1 1 | 1 1 1 1 | S H F T | 1 0 1 0 | I I I I | I I I I | I I I I | I I I I |
| SUBTRACT FROM ACC LONG IMMEDIATE WITH SHIFT | SBLK | 1 0 1 1 | 1 1 1 1 | S H F T | 1 0 1 1 | I I I I | I I I I | I I I I | I I I I |
| AND WITH ACC LONG IMMEDIATE WITH SHIFT | ANDS | 1 0 1 1 | 1 1 1 1 | S H F T | 1 1 0 0 | I I I I | I I I I | I I I I | I I I I |
| OR WITH ACC LONG IMMEDIATE WITH SHIFT | ORS | 1 0 1 1 | 1 1 1 1 | S H F T | 1 1 0 1 | I I I I | I I I I | I I I I | I I I I |
| XOR WITH ACC LONG IMMEDIATE WITH SHIFT | XORS | 1 0 1 1 | 1 1 1 1 | S H F T | 1 1 1 0 | I I I I | I I I I | I I I I | I I I I |
| MULTIPLY TREG0 BY 13-BIT IMMEDIATE | MPYK | 1 1 0 1 | I I I I | I I I I | I I I I | | | | | |
| BRANCH CONDITIONAL | Bcnd | 1 1 1 0 | 0 0 T P | Z L V C | Z L V C | A A A A | A A A A | A A A A | A A A A |
| EXECUTE NEXT TWO INST ON CONDITION | XC | 1 1 1 0 | 0 1 T P | Z L V C | Z L V C | A A A A | A A A A | A A A A | A A A A |
| CALL CONDITIONAL | CC | 1 1 1 0 | 1 0 T P | Z L V C | Z L V C | A A A A | A A A A | A A A A | A A A A |
| RETURN CONDITIONAL | RETC | 1 1 1 0 | 1 1 T P | Z L V C | Z L V C | A A A A | A A A A | A A A A | A A A A |
| BRANCH CONDITIONAL DELAYED | BcnD | 1 1 1 1 | 0 0 T P | Z L V C | Z L V C | A A A A | A A A A | A A A A | A A A A |
| EXECUTE NEXT TWO INST CONDITIONAL DELAYED | ECD | 1 1 1 1 | 0 1 T P | Z L V C | Z L V C | A A A A | A A A A | A A A A | A A A A |
| CALL CONDITIONAL DELAYED | CCD | 1 1 1 1 | 1 0 T P | Z L V C | Z L V C | A A A A | A A A A | A A A A | A A A A |
| RETURN CONDITIONAL DELAYED | RTCD | 1 1 1 1 | 1 1 T P | Z L V C | Z L V C | A A A A | A A A A | A A A A | A A A A |

Signal Descriptions

| SIGNAL | PIN | I/O/Z | DESCRIPTION |
|---|---|---|---|
| | | | Memory and I/O Interfacing |
| A15 (MSB) A14 A13 A12 A11 A10 A9 A8 A7 A6 A5 A4 A3 A2 A1 A0 (LSB) | | O/Z | Parallel address bus A15 (MSB) through A0 (LSB). Multiplexed to address external data/program memory or I/O. Placed in high-impedance state in hold mode. This signal also goes into high-impedance when OFF- is active low. |
| D15 (MSB) D14 D13 D12 D11 D10 D9 D8 D7 D6 D5 D4 D3 D2 D1 D0 (LSB) | | I/O/Z | Parallel data bus D15 (MSB) through D0 (LSB). Multiplexed to transfer data between the core CPU and external data/program memory or I/O devices. Placed in high-impedance state when not outputting or when RS- or HOLD- is asserted. This signal also goes into high-impedance when OFF- is active low. |
| DS- PS- IS- | | O/Z | Data, program, and I/O space select signals. Always high unless low level asserted for communicating to a particular external space. Placed in high-impedance state in hold mode. These signals also go into high-impedance when OFF- is active low. |
| BR- | | O/Z | Bus request signal. Asserted when accessing external global data memory space. READY is asserted to the device when the bus is available and the global data memory is available for the bus transaction. This signal can also be used to extend the data memory address space by up to 32K words. This signal also goes into high-impedance when OFF- is active low. |
| READY | | I | Data ready input. Indicates that an external device is prepared for the bus transaction to be completed. If the device is not ready (READY is low), the processor waits one cycle and checks |

-continued

| | | |
|---|---|---|
| | | READY again. READY also indicates a bus grant to an external device after a BR- (bus request) signal. |
| R/W- | O/Z | Read/write signal. Indicates transfer direction when communicating to an external device. Normally in read mode (high). unless low level asserted for performing a write operation. Placed in high-impedance state in hold mode. This signal also goes into high-impedance when OFF- is active low. |
| STRB- | O/Z | Strobe signal. Always high unless asserted low to indicate an external bus cycle. Placed in high-impedance state in the hold mode. This signal also goes into high-impedance when OFF- is active low. |
| HOLD- | I | Hold input. This signal is asserted to request control of the address, data, and control lines. When acknowledged by the processor, these lines go to a high-impedance state. |
| HOLDA- | O/Z | Hold acknowledge signal. Indicates to the external circuitry that the processor is in a hold state and its address, data, and memory control lines are in a high impedance state so that they are available to the external circuitry for access of local memory. This signal also goes into high-impedance when OFF- is active low. |
| MP/MC- | I | Microprocessor/microcomputer mode select pin. If active low at reset (microcomputer mode), the pin causes the internal program memory to be mapped into program memory space. In the microprocessor mode, all program memory is mapped externally. This pin is only sampled during reset and the mode set at reset can be overridden via software control bits. |
| MSC- | O/Z | Microstate complete signal. This signal indicates the beginning of a new external memory access. The timing of the signal is such that it can be connected back to the READY signal to insert a wait state. This signal also goes into high-impedance when OFF- is active low. |
| | Interrupt and Miscellaneous Signals | |
| BIO- | I | Branch control input. Polled by BIOZ instruction. If low, the device executes a branch. This signal must be active during the BIOZ instruction fetch. |
| IACK- | O/Z | Interrupt acknowledge signal. Indicates receipt of an interrupt and that the program is branching to the interrupt-vector location indicated by A15–A0. This signal also goes into high-impedance when OFF- is active low. |
| INT2-<br>INT1-<br>INT0- | I | External user interrupt inputs. Prioritized and maskable by the interrupt mask register and interrupt mode bit. Can be polled and reset via the interrupt flag register. |
| RS- | I | Reset input. Causes the device to terminate execution and forces the program counter to zero. When brought to a high level, execution begins at location zero of program memory. RS- affects various registers and status bits. |
| XF | O/Z | External flag output (latched software-programmable signal). Used for signalling other processors in multiprocessor configurations or as a general purpose output pin. This signal also goes into high-impedance when OFF- is active low. This pin is set high at reset. |
| | Supply/Oscillator Signals | |
| CLKOUT1 | O/Z | Master clock output signal (CLKIN frequency/4). This signal cycles at half the machine cycle rate and therefore it operates at the instruction cycle rate when operating with one wait state. This signal also goes into high-impedance when OFF- is active low. |
| CLKOUT2 | O/Z | Secondary clock output signal. This signal operates at the same cycle rate as CLKOUT1 but 90 degrees out of phase. This signal also goes into high-impedance when OFF- is active low. |
| X2/CLKIN | I | Input pin to internal oscillator from the crystal. If the internal oscillator is not being used, a clock may be input to the device on this pin. |
| X1 | O/Z | Output pin from the internal oscillator for the crystal. If the internal oscillator is not used, this pin should be left unconnected. This signal also goes into high-impedance when OFF- is active low. |
| SYNC- | I | Synchronization input. Allows clock synchronization of two or more devices. SYNC- is an active-low signal and must be asserted on the rising edge of CLKIN. |
| $V_{cc1}$<br>$V_{cc2}$<br>$V_{cc3}$<br>$V_{cc4}$<br>$V_{cc5}$<br>$V_{cc6}$<br>$V_{cc7}$ | | Seven 5-V supply pins, ties together externally. |
| $V_{ss1}$ | | Seven ground pins, tied together externally. |

$V_{ss2}$
$V_{ss3}$
$V_{ss4}$
$V_{ss5}$
$V_{ss6}$
$V_{ss7}$

| | | Serial Port Signals |
|---|---|---|
| CLKR | I | Receive clock input. External clock signal for clocking data from the DR (data receive) pin into the RSR (serial port receive shift register). Must be present during serial port transfers. |
| CLKX | I/O | Transmit clock input. External clock signal for clocking data from the XSR (serial port transmit shift register) to the DX (data transmit) pin. Must be present during serial port transfers. This signal can be used as an output operating at one half CLKOUT. This is done by setting the CO bit in the serial port control register. |
| DR | I | Serial data receive input. Serial data is received in the RSR (serial port receive shift register) via the DR pin. |
| DX | O/Z | Serial port transmit output. Serial data transmitted from the XSR (serial port transmit shift register) via the DX pin. Placed in high-impedance state when not transmitting. This signal also goes into high-impedance when OFF- is active low. |
| FSR | I | Frame synchronization pulse for receive input. The falling edge of the FSR pulse initiates the data-receive process, beginning the clocking of the RSR. |
| FSX | I/O | Frame synchronization pulse for transmit input/output. The falling edge of the FSX pulse initiates the data-transmit process, beginning the clocking of the XSR. Following reset, the default operating condition of FSX is an input. This pin may be selected by software to be an output when the TXM bit in the status register is set to 1. This signal also goes into high-impedance when OFF- is active low. |
| OFF- | I | Disable all outputs. The OFF signal, when active low, puts all output drivers in to high-impedance. |

BRANCH, CALL and RETURN INSTRUCTIONS

Notes

1. Delayed instructions reduce overhead by not necessitating flushing of the pipeline as non-delayed branches do.
   For example, the two (single-word) instructions following a delayed branch are executed before the branch is taken.
2. All meaningful combinations of the 8 conditions listed below are supported for conditional instructions:

| Condition | representation in source |
|---|---|
| 1) ACC = 0 | (EQ) |
| 2) ACC <> 0 | (NEQ) |
| 3) ACC < 0 | (LT) |
| 4) ACC > 0 | (GT) |
| 5) OV = 0 | (NOV) |
| 6) OV = 1 | (OV) |
| 7) C = 0 | (C) |
| 8) C = 1 | (NC) |

For example, execution of the following source statement results in a branch is the accumulator contents are less than or equal to zero and the carry bit is set:
    BconD LEQ,C
Note that the conditions associated with BIOZ, BBZ, BBNZ, BANC, and BAZD are not combinations of the conditions listed above.

BIT MANIPULATION INSTRUCTIONS

| | |
|---|---|
| XPL | EXCLUSIVE OR DBMR with data value |
| OPL | OR DBMR with data value |
| APL | AND DBMR with data value |
| CPL | if (data value = DBMR) then TO:=1 |
| XPLK | EXCLUSIVE OR long immediate constant with data value |
| OPLK | OR long immediate constant with data value |
| APLK | AND long immediate constant with data value |
| CPLK | if (long immediate constant = data value) then TC:=1 |
| SPLK | store long immediate constant in data memory |
| BIT | TC:=bit[4-bit immediate constant] of data value |
| BITT | TC:=bit[<TREG2>] of data value |

Notes

1) Note that the result of a logic operation performed by the PLU is written directly back into data memory, thus not disrupting the contents of the accumulator.

INSTRUCTIONS INVOLVING ACCB, BPR

Loads/stores

| | |
|---|---|
| SACR | store ACC in ACCB unconditionally |
| CRGT | if (ACC > ACCB) then store ACC in ACCB else ACCB → ACC |

-continued

| | |
|---|---|
| CRLT | if (ACC < ACCB) then store ACC in ACCB else ACCB → ACC |
| EXAR | exchange ACC with ACCB |
| LACR | load ACC from ACCB |
| SPB | copy product register to BPR |
| LPB | copy BPR to product register |
| LBPR | load accumulator with BPR contents |

Additions/subtractions

| | |
|---|---|
| ADDR | add ACCB to ACC |
| ADCR | add ACCB to ACC with carry |
| SUBR | subtract ACCB from ACC |
| SBBR | subtract ACCB from ACC with borrow |
| ABPR | add BPR to accumulator contents |
| SBPR | subtract BPR from accumulator contents |

Logic operations

| | |
|---|---|
| ANDR | and ACCB with ACC |
| ORR | OR ACCB with ACC |
| XORR | exclusive-or ACCB with ACC |

What is claimed is:

1. A method for pipelined data processing within a data processing device or system including at least one conditional instruction, comprising:

decoding a conditional instruction within an instruction pipeline;

conditioning the execution of a predetermined set of conditioned instructions following said conditional instruction within said instruction pipeline in response to a condition specified in said conditional instruction;

determining which status conditions of a set of predetermined status conditions have been selected by said conditional instruction with mask bits representative of said predetermined status conditions;

making a multiple status test in a single cycle by enabling testing of selected status conditions selected by said mask bits and ignoring status conditions not selected by said mask bits;

comparing an actual value each of said selected status conditions to a predetermined value contained in corresponding said status bits of the conditional instruction; and determining which values are required by said conditional instruction for said selected set of predetermined status conditions with status bits representative of said predetermined values; and executing said set of conditioned instructions in response to said conditional instruction without flushing said instruction pipeline.

2. The method of claim 1, wherein said conditioning step further comprises, allowing normal execution of said conditioned instructions based on a logical combination of said mask bits and said status bits.

3. The method of claim 1, wherein said executing step further comprises executing said set of conditioned instructions in a normal manner if said condition specified in said conditional instruction is present, or by changing said conditioned instructions to a no-operation (NOP) instruction if said condition specified in said conditional instruction is not present.

4. A method for pipelined data processing within a data processing device or system including at least one conditional instruction, comprising:

decoding a conditional instruction within an instruction pipeline;

conditioning the execution of a predetermined set of conditioned instructions following said conditional instruction within said instruction pipeline in response to a condition specified in said conditional instruction;

determining which status conditions of a set of predetermined status conditions have been selected by said conditional instruction with mask bits representative of said predetermined status conditions;

wherein said conditional instruction includes a pair of bits corresponding to each of said status conditions of said set of predetermined status conditions;

wherein said determining said condition step further comprises using a first of said pair of bits for determining whether to consider a status condition;

wherein said conditioning step further comprises using a second of said pair of bits as a level to test said actual value of said status condition against; and executing said set of conditioned instructions in response to said conditional instruction without flushing said instruction pipeline.

5. A method for pipelined data processing within a data processing device or system including at least one conditional instruction, comprising:

a) decoding a conditional instruction within an instruction pipeline; wherein said conditional instruction includes a plurality of pairs of bits corresponding to a set of predetermined status conditions such that each said pair of bits comprises a mask bit and a status bit;

b) conditioning the execution of a predetermined set of conditioned instructions following said conditional instruction within said instruction pipeline in response to a condition specified in said conditional instruction;

(c) determining which status conditions of said set of predetermined status conditions have been selected by said conditional instruction to form said condition by using a first of said pair of bits as said mask bit representative of said predetermined status conditions for determining whether to consider said status condition; wherein said determining step further comprises making a multiple status test in a single cycle by enabling testing of selected status conditions selected by said mask bits and ignoring status conditions not selected by said mask bits;

(d) using a second of said pair of bits as a level to test said actual value of said status condition against by comparing an actual value of each of said selected status conditions to a predetermined value contained in corresponding said status bits of the conditional instruction; and (e) executing said set of conditioned instructions without flushing said instruction pipeline by executing said set of conditioned instructions in a normal manner if said condition specified in said conditional instruction is present, or by changing said conditioned instructions to a no-operation (NOP) instruction if said condition specified in said conditional instruction is not present.

6. The method of claim 5, wherein said conditioning step further comprises allowing normal execution of said conditioned instructions based on a logical combination of said mask bits and said status bits.

7. A method for pipelined data processing within a data processing device or system including at least one conditional instruction, comprising:

fetching a conditional instruction from a first address in a memory which is associated with said data processing device;

fetching a conditioned instruction from a second address in said memory while said conditional instruction is being processed within an instruction pipeline of said data processing device;

fetching a third instruction from a third address in said memory while said conditional instruction and said conditioned instruction are being processed within said instruction pipeline; wherein said first address, said second address and said third address are sequential addresses within said memory;

executing said conditional instruction by determining if a condition specified by said conditional instruction is true by enabling testing of selected status conditions selected by a set of mask bits included in said conditional instruction and ignoring status conditions not selected by said mask bits;

conditioning the execution of said conditioned instruction within said instruction pipeline in response to said condition, by executing said conditioned instruction in a normal manner if said condition is true and by ignoring any result of said conditioned instruction if said condition is false; and executing said third instruction in a normal manner without regard to the step of executing said conditional instruction, whereby sequential instruction processing proceeds and said conditioned instruction is conditionally executed without flushing said instruction pipeline.

8. The method of claim 7, wherein said conditional instruction includes a plurality of pairs of bits corresponding to a set of predetermined status conditions such that each said pair of bits comprises a mask bit and a status bit.

9. The method of claim 8 wherein the step of executing said conditional instruction further comprises determining which status conditions of said set of predetermined status conditions have been selected by said conditional instruction to form said condition by using a first of said pair of bits as said mask bit representative of said predetermined status conditions for determining whether to consider said status condition by enabling testing of selected status conditions selected by said mask bits and ignoring status conditions not selected by said mask bits.

10. The method of claim 9 wherein the step of executing said conditional instruction further comprises using a second of said pair of bits as a level to test said actual value of said status condition against by comparing an actual value of each of said selected status conditions to a predetermined value contained in corresponding said status bits of the conditional instruction.

* * * * *